United States Patent
Kitagawa et al.

(10) Patent No.: US 8,411,360 B2
(45) Date of Patent: *Apr. 2, 2013

(54) POLARIZING FILM FOR AN ORGANIC ELECTROLUMINESCENT (EL) DISPLAY, A METHOD OF MAKING THE SAME AND AN ORGANIC EL DISPLAY DEVICE HAVING THE POLARIZING FILM

(75) Inventors: Takeharu Kitagawa, Ibaraki (JP); Tomohiro Mori, Ibaraki (JP); Yuji Miyaki, Ibaraki (JP); Shusaku Goto, Ibaraki (JP); Minoru Miyatake, Ibaraki (JP); Takashi Kamijo, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/225,096

(22) Filed: Sep. 2, 2011

(65) Prior Publication Data
US 2012/0056211 A1 Mar. 8, 2012

(30) Foreign Application Priority Data

Sep. 3, 2010 (JP) .................. 2010-197413
Dec. 2, 2010 (JP) .................. 2010-269002
Mar. 25, 2011 (JP) .................. 2011-068513

(51) Int. Cl.
*G02B 5/30* (2006.01)
(52) U.S. Cl. ................. 359/487.06
(58) Field of Classification Search ........ None
See application file for complete search history.

(56) References Cited

U.S. PATENT DOCUMENTS

| 4,659,523 A | 4/1987 | Rogers et al. |
| 4,893,115 A * | 1/1990 | Blanchard ............ 345/174 |
| 4,895,769 A | 1/1990 | Land et al. |
| 6,025,958 A | 2/2000 | Yamaoka et al. |
| 7,413,766 B2 | 8/2008 | Satake et al. |

(Continued)

FOREIGN PATENT DOCUMENTS

| EP | 0357946 | 3/1990 |
| EP | 2405288 | 11/2012 |

(Continued)

OTHER PUBLICATIONS

English Machine Translation of JP 2003-279748 A, Sugino et al., Oct. 2003.*

(Continued)

*Primary Examiner* — Derek S Chapel
(74) *Attorney, Agent, or Firm* — Lowe Hauptman Ham & Berner, LLP

(57) ABSTRACT

Provided is a continuous web of polarizing film for an organic EL display device which has a thickness of 10 μm or less and exhibits high optical characteristics. The polarizing film for an organic EL display device is made of a polyvinyl alcohol type resin having a molecularly oriented dichroic material, and formed through stretching to have a thickness of 10 μm or less and exhibit optical characteristics satisfying the following conditions: $T \geqq 42.5$; and $P \geqq 99.5$, wherein T is a single layer transmittance, and P is a polarization rate. The polarizing film for an organic EL display device may be prepared by subjecting a laminate comprising a non-crystallizable ester type thermoplastic resin substrate and the polyvinyl alcohol type resin layer formed on the substrate, to 2-stage stretching consisting of preliminary in-air stretching and in-boric-acid-solution stretching.

68 Claims, 40 Drawing Sheets

U.S. PATENT DOCUMENTS

| | | |
|---|---|---|
| 7,759,442 B2 | 7/2010 | Okada et al. |
| 2005/0019530 A1 | 1/2005 | Merrill et al. |
| 2005/0073633 A1 | 4/2005 | Satake et al. |
| 2007/0128370 A1 | 6/2007 | Takada et al. |
| 2008/0143638 A1 | 6/2008 | Kim et al. |
| 2008/0274272 A1 | 11/2008 | Satake et al. |
| 2010/0304135 A1 | 12/2010 | Okada et al. |
| 2011/0315306 A1* | 12/2011 | Goto et al. ............ 156/229 |
| 2012/0055608 A1* | 3/2012 | Kitagawa et al. ........ 156/64 |
| 2012/0055621 A1* | 3/2012 | Goto et al. ............ 156/229 |
| 2012/0055622 A1* | 3/2012 | Kitagawa et al. ........ 156/229 |
| 2012/0055623 A1* | 3/2012 | Kitagawa et al. ........ 156/229 |
| 2012/0056340 A1* | 3/2012 | Kitagawa et al. ........ 264/1.34 |
| 2012/0057104 A1* | 3/2012 | Kitagawa et al. ........ 349/96 |
| 2012/0057107 A1* | 3/2012 | Kitagawa et al. ........ 349/96 |
| 2012/0057231 A1* | 3/2012 | Goto et al. ............ 359/487.01 |
| 2012/0057232 A1* | 3/2012 | Goto et al. ............ 359/487.02 |
| 2012/0058291 A1* | 3/2012 | Kitagawa et al. ........ 428/43 |
| 2012/0058321 A1* | 3/2012 | Goto et al. ............ 428/213 |

FOREIGN PATENT DOCUMENTS

| | | |
|---|---|---|
| JP | 5-027118 | 2/1993 |
| JP | 8-12296 | 2/1996 |
| JP | 11-149015 | 6/1999 |
| JP | 2001-343521 | 12/2001 |
| JP | 2002-258269 | 9/2002 |
| JP | 2003-043257 | 2/2003 |
| JP | 2003279748 A * | 10/2003 |
| JP | 2004020629 | 1/2004 |
| JP | 2004-078143 | 3/2004 |
| JP | 2004-338379 | 12/2004 |
| JP | 2005-248173 | 9/2005 |
| JP | 2007-171892 | 7/2007 |
| JP | 4279944 | 6/2009 |
| JP | 2009-186659 | 8/2009 |
| JP | 2009176198 | 8/2009 |
| JP | 2009244465 | 10/2009 |
| JP | 2011-002759 | 1/2011 |
| WO | 2008/075818 | 6/2008 |
| WO | 2011/125958 | 10/2011 |

OTHER PUBLICATIONS

Kenji Matsuhiro; "Xpol and its Application to 3D-TV"; EKISHO; vol. 14; No. 4, 2010; pp. 219-232 (17 pages total).

Korean Office Action for 10-2011-0089204 dated Jun. 27, 2012.

H.W. Siesler; Rheo-Optical Fourier-Transform Infared Spectroscopy; Advanced Polymeric Science; 1984; pp. 9-15.

Partial European Search Report for 11179961 dated Jan. 27, 2012.

European Search Report mailed Sep. 3, 2012 for 12178358.3.

European Office Action for 11 179 961.5 dated Oct. 24, 2012.

European Result of consultation for 11 179 961.5 dated Oct. 24, 2012.

* cited by examiner

FIG.5

| CONDITIONS | IODINE CONCENTRATION OF DYEING BATH (wt%) | | | | |
|---|---|---|---|---|---|
| | 0.10 | 0.15 | 0.20 | 0.25 | 0.30~ |
| EVALUATION RESULT | × | × | × | × | ○ |
| | DISSOLUTION OF PVA IN DYEING BATH | DISSOLUTION OF PVA IN DYEING BATH | DISSOLUTION OF PVA IN DYEING BATH | DISSOLUTION OF PVA IN DYEING BATH | NO DISSOLUTION OF PVA |

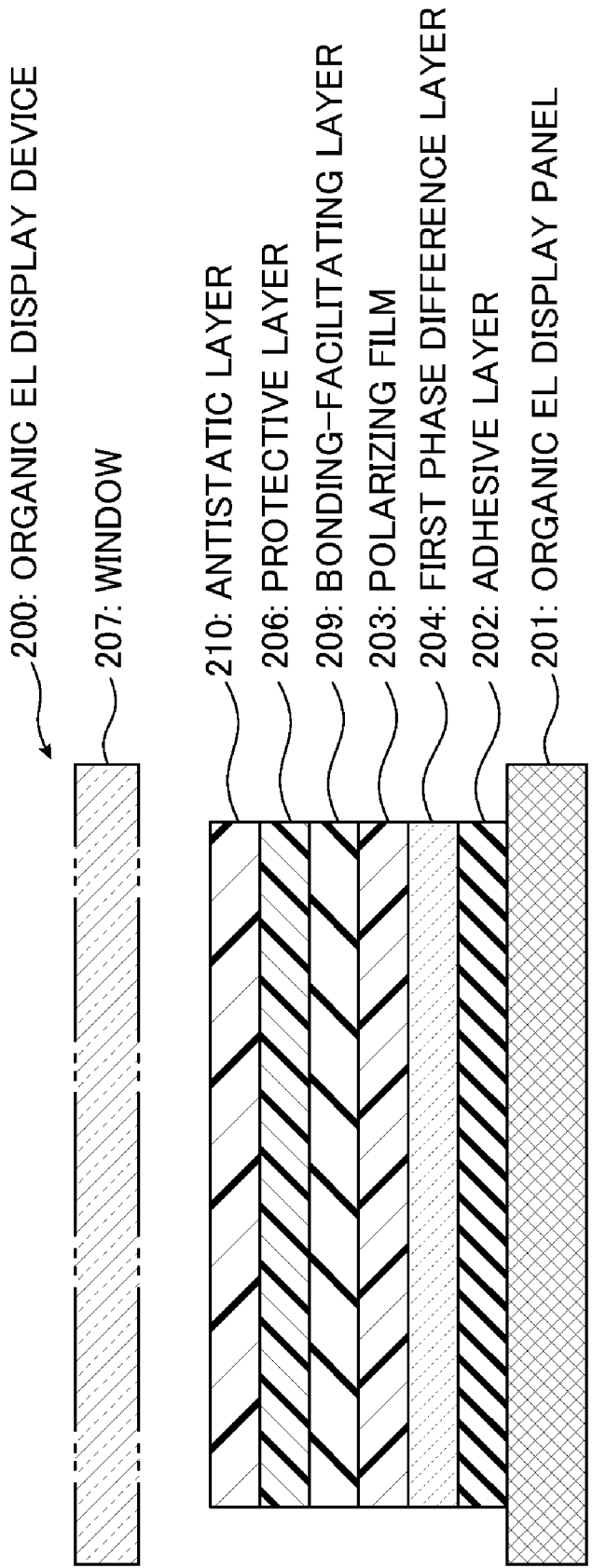

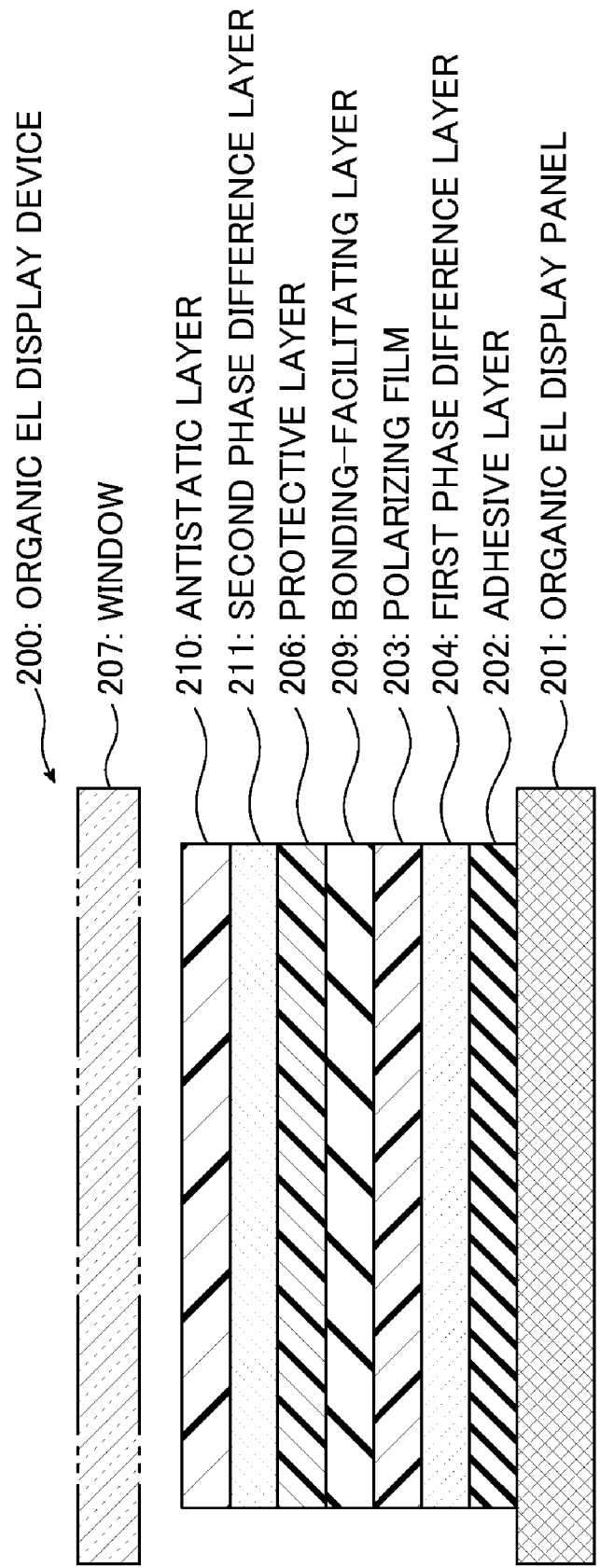

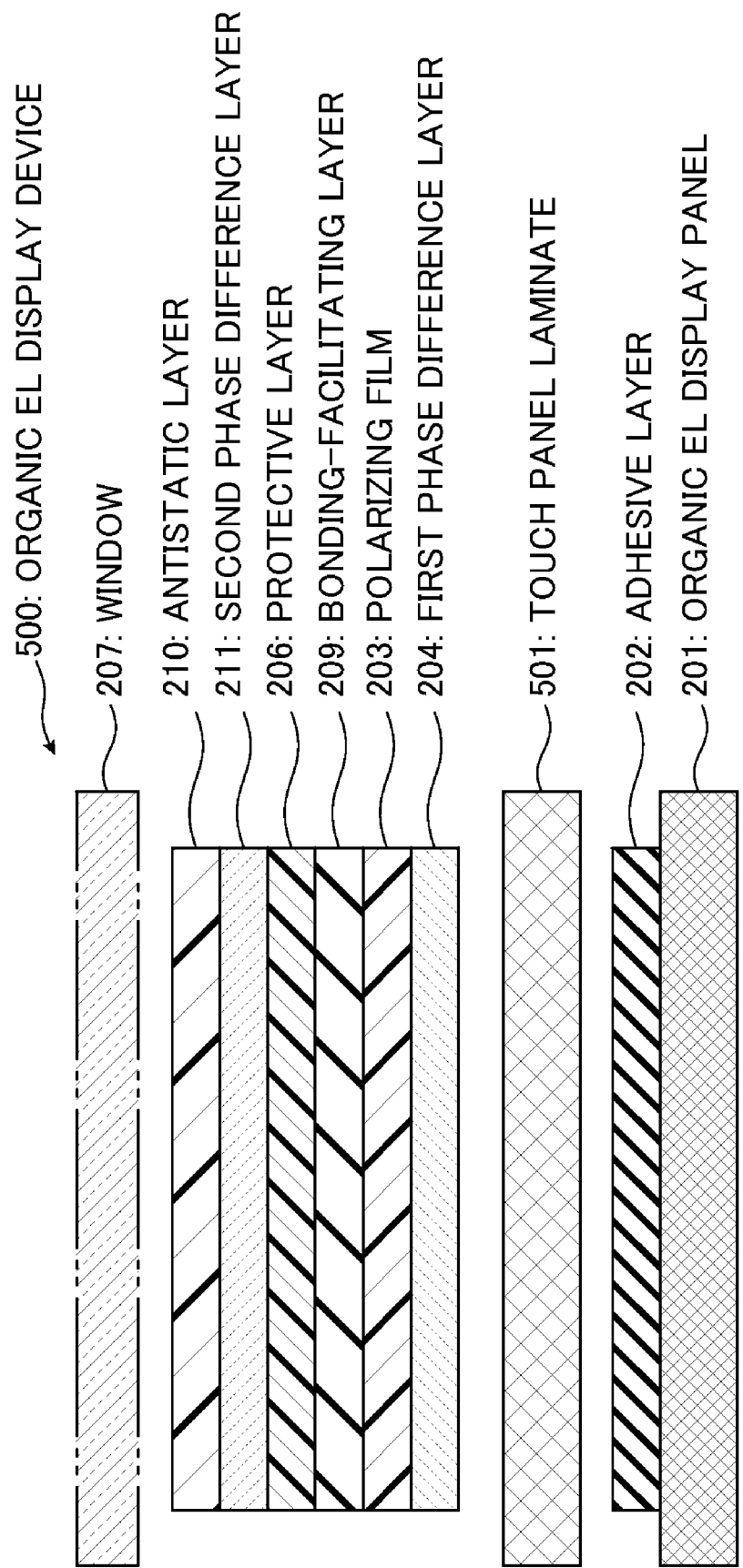

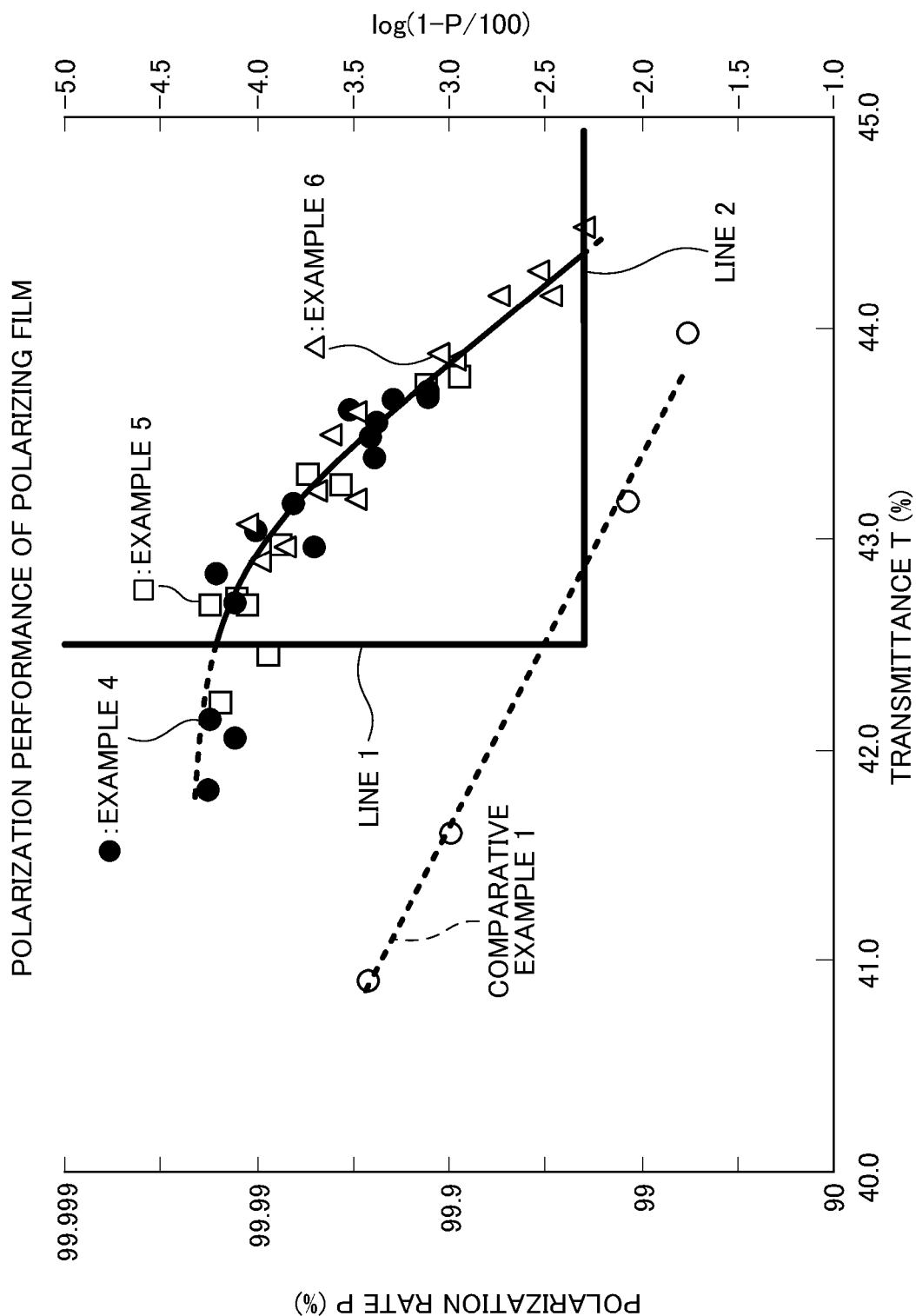

FIG.27

| Example No. | Purpose | Copolymerizing material with PET substrate | PVA thickness (μm) | Elevated temperature in-air stretching — Temperature (°C) | Ratio | Process | Remaining width rate (%) | PVA thickness (μm) | First insolubilization step | Iodine concentration in dyeing step (wt%) | Second insolubilization step | In-boric-acid solution stretching — Temperature (°C) | Ratio | Total stretching ratio | Polarizer thickness (μm) |
|---|---|---|---|---|---|---|---|---|---|---|---|---|---|---|---|
| 1 | Difference in insolubilization | Isophthalic acid | 7 | 130 | 1.8 | End-free | 65 | 5 | W/O | 0.3 | W/O | 65 | 3.3 | 5.94 | 3 |
| 2 | Difference in insolubilization | Isophthalic acid | 7 | 130 | 1.8 | End-free | 65 | 5 | W/O | 0.3 | With | 75 | 3.3 | 5.94 | 3 |
| 3 | Standard | Isophthalic acid | 7 | 130 | 1.8 | End-free | 65 | 5 | With | 0.12–0.25 | W/O | 65 | 3.3 | 5.94 | 3 |
| 4 | Difference in thickness | Isophthalic acid | 7 | 130 | 1.8 | End-free | 65 | 5 | With | 0.12–0.25 | With | 75 | 3.3 | 5.94 | 3 |
| 5 | Difference in substrate | Isophthalic acid | 12 | 130 | 1.8 | End-free | 65 | 9 | With | 0.12–0.25 | With | 75 | 3.3 | 5.94 | 5 |
| 6 | Difference in substrate | CHDM | 7 | 130 | 1.8 | End-free | 65 | 5 | With | 0.12–0.25 | With | 75 | 3.3 | 5.94 | 3 |
| 7 | Difference in stretching ratio for elevated temperature in-air stretching | Isophthalic acid | 7 | 130 | 1.2 | End-free | 85 | 6 | With | 0.12–0.25 | With | 75 | 4.9 | 5.88 | 3 |
| 8 | Difference in stretching ratio for elevated temperature in-air stretching | Isophthalic acid | 7 | 130 | 1.5 | End-free | 75 | 6 | With | 0.12–0.25 | With | 75 | 4.0 | 6.0 | 3 |
| 9 | Difference in stretching ratio for elevated temperature in-air stretching | Isophthalic acid | 7 | 130 | 2.5 | End-free | 55 | 4 | With | 0.12–0.25 | With | 75 | 2.4 | 6.0 | 3 |
| 10 | Difference in stretching temperature for elevated temperature in-air stretching | Isophthalic acid | 7 | 95 | 1.8 | End-free | 75 | 5 | With | 0.12–0.25 | With | 75 | 3.3 | 5.94 | 3 |

FIG.28

| | | | | | | | | | | | | | | |
|---|---|---|---|---|---|---|---|---|---|---|---|---|---|---|
| 11 | DIFFERENCE IN STRETCHING TEMPERATURE FOR ELEVATED TEMPERATURE IN-AIR STRETCHING | ISOPHTHALIC ACID | 7 | 110 | 1.8 | END-FREE | 70 | 5 | WITH | 0.12-0.25 | WITH | 75 | 3.3 | 5.94 | 3 |
| 12 | | ISOPHTHALIC ACID | 7 | 150 | 1.8 | END-FREE | 65 | 5 | WITH | 0.12-0.25 | WITH | 75 | 3.3 | 5.94 | 3 |
| 13 | DIFFERENCE IN STRETCHING RATIO | ISOPHTHALIC ACID | 7 | 130 | 1.8 | END-FREE | 65 | 5 | WITH | 0.12-0.25 | WITH | 75 | 2.8 | 5.04 | 3 |
| 14 | | ISOPHTHALIC ACID | 7 | 130 | 1.8 | END-FREE | 65 | 5 | WITH | 0.12-0.25 | WITH | 75 | 3.1 | 5.58 | 3 |
| 15 | | ISOPHTHALIC ACID | 7 | 130 | 1.8 | END-FREE | 65 | 5 | WITH | 0.12-0.25 | WITH | 75 | 3.6 | 6.48 | 3 |
| 16 | DIFFERENCE IN STRETCHING RATIO FOR END-FIXED STRETCHING | ISOPHTHALIC ACID | 7 | 130 | 1.8 | END-FIXED | 100 | 4 | WITH | 0.12-0.25 | WITH | 75 | 3.3 | 5.94 | 2 |
| 17 | | ISOPHTHALIC ACID | 7 | 130 | 1.8 | END-FIXED | 100 | 4 | WITH | 0.12-0.25 | WITH | 75 | 3.9 | 7.02 | 2 |
| 18 | | ISOPHTHALIC ACID | 7 | 130 | 1.8 | END-FIXED | 100 | 4 | WITH | 0.12-0.25 | WITH | 75 | 4.4 | 7.92 | 2 |

FIG.29

| EXAMPLE NO. | COPOLYMERIZING MATERIAL WITH PET SUBSTRATE | ELEVATED TEMPERATURE IN-AIR STRETCHING | | PET ORIENTATION FUNCTION |
|---|---|---|---|---|
| | | TEMPERATURE (°C) | RATIO | |
| EXAMPLE 1 | ISOPHTHALIC ACID | 130 | 1.8 | 0.02 |
| EXAMPLE 2 | ISOPHTHALIC ACID | 130 | 1.8 | 0.01 |
| EXAMPLE 3 | ISOPHTHALIC ACID | 130 | 1.8 | 0.01 |
| EXAMPLE 4 | ISOPHTHALIC ACID | 130 | 1.8 | 0.01 |
| EXAMPLE 5 | ISOPHTHALIC ACID | 130 | 1.8 | 0.01 |
| EXAMPLE 6 | CHDM | 130 | 1.8 | 0.01 |
| EXAMPLE 7 | ISOPHTHALIC ACID | 130 | 1.2 | 0.01 |
| EXAMPLE 8 | ISOPHTHALIC ACID | 130 | 1.5 | 0.01 |
| EXAMPLE 9 | ISOPHTHALIC ACID | 130 | 2.5 | 0.01 |
| EXAMPLE 10 | ISOPHTHALIC ACID | 95 | 1.8 | 0.10 |
| EXAMPLE 11 | ISOPHTHALIC ACID | 110 | 1.8 | 0.05 |
| EXAMPLE 12 | ISOPHTHALIC ACID | 150 | 1.8 | 0.01 |
| EXAMPLE 13 | ISOPHTHALIC ACID | 130 | 1.8 | 0.01 |
| EXAMPLE 14 | ISOPHTHALIC ACID | 130 | 1.8 | 0.01 |
| EXAMPLE 15 | ISOPHTHALIC ACID | 130 | 1.8 | 0.01 |
| EXAMPLE 16 | ISOPHTHALIC ACID | 130 | 1.8 | 0.01 |
| EXAMPLE 17 | ISOPHTHALIC ACID | 130 | 1.8 | 0.01 |
| EXAMPLE 18 | ISOPHTHALIC ACID | 130 | 1.8 | 0.01 |
| EXAMPLE 19 | ISOPHTHALIC ACID | 130 | 2.0 | 0.01 |
| EXAMPLE 20 | ISOPHTHALIC ACID | 130 | 2.0 | 0.01 |
| EXAMPLE 21 | ISOPHTHALIC ACID | 130 | 2.0 | 0.01 |
| EXAMPLE 22 | ISOPHTHALIC ACID | 130 | 2.0 | 0.01 |
| EXAMPLE 23 | ISOPHTHALIC ACID | 130 | 2.0 | 0.01 |
| EXAMPLE 24 | ISOPHTHALIC ACID | 110 | 2.0 | 0.06 |
| EXAMPLE 25 | ISOPHTHALIC ACID | 95 | 2.0 | 0.12 |

| REFERENCE SAMPLE NO. | THERMOPLASTIC RESIN SUBSTRATE | ELEVATED TEMPERATURE IN-AIR STRETCHING | | PET ORIENTATION FUNCTION |
|---|---|---|---|---|
| | | TEMPERATURE (°C) | RATIO | |
| REFERENCE SAMPLE 1 | CRYSTALLIZABLE PET | 110 | 4.0 | 0.51 |
| REFERENCE SAMPLE 2 | CRYSTALLIZABLE PET | 100 | 4.5 | 0.78 |
| REFERENCE SAMPLE 3 | CRYSTALLIZABLE PET | 90 | 4.5 | 0.79 |

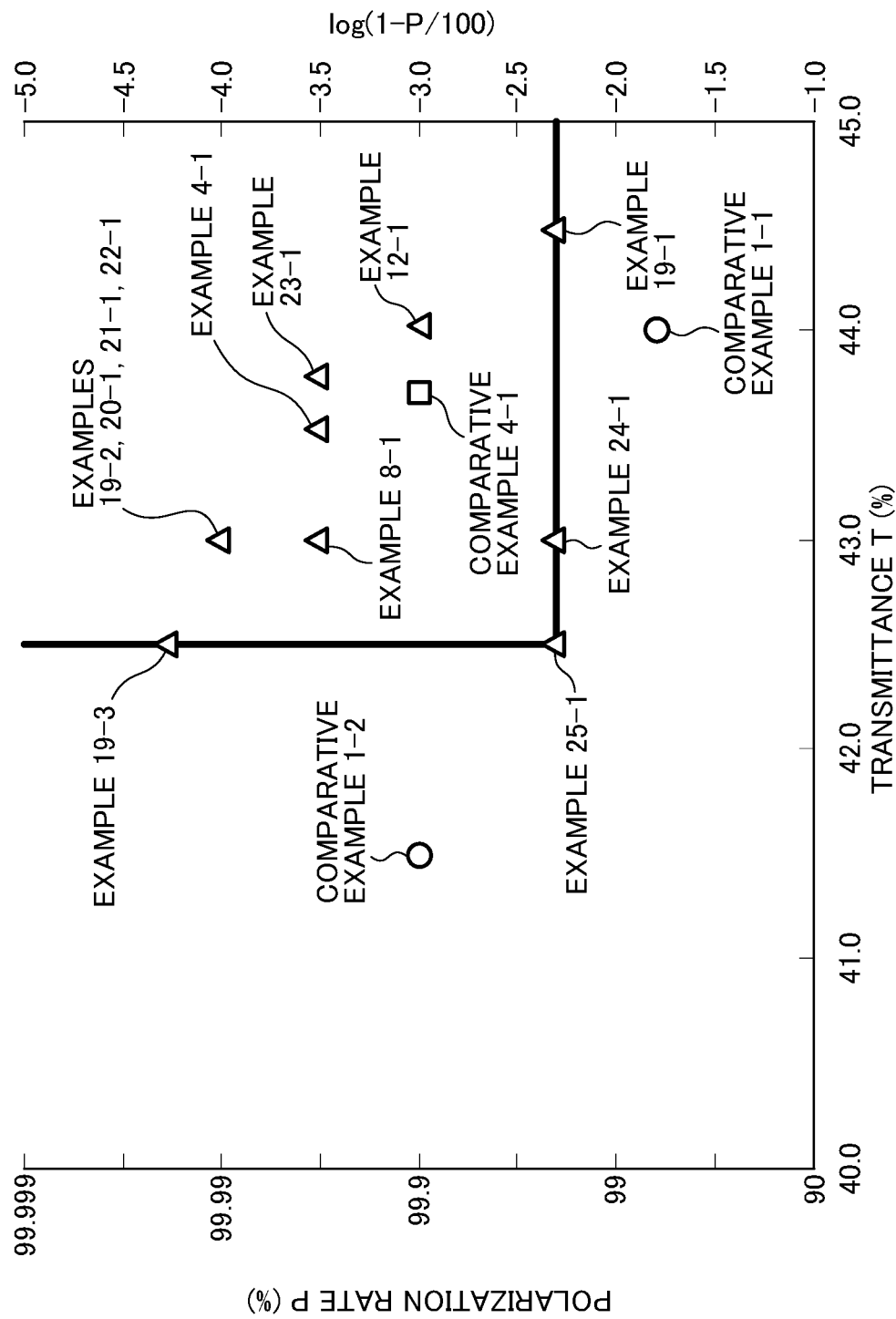

POLARIZING FILM FOR AN ORGANIC ELECTROLUMINESCENT (EL) DISPLAY, A METHOD OF MAKING THE SAME AND AN ORGANIC EL DISPLAY DEVICE HAVING THE POLARIZING FILM

CROSS REFERENCE TO RELATED APPLICATION

This application claims the priority of Japanese Patent Application No. 2010-197413 filed on Sep. 3, 2010, Japanese Patent Application No. 2010-269002 filed on Dec. 2, 2010, and Japanese Patent Application No. 2011-068513 filed on Mar. 25, 2011 in the JPO (Japan Patent Office), the disclosure of which is incorporated herein in their entirety by reference.

TECHNICAL FIELD

The present invention relates to a polarizing film, an optical film laminate including a polarizing film, a stretched laminate for use in the production of an optical film laminate including a polarizing film, production methods for them, and an organic electroluminescence (EL) display device having a polarizing film. In particular, the present invention relates to a polarizing film which consists of a polyvinyl alcohol type resin having a dichroic material impregnated therein in a molecularly oriented state and has a thickness of 10 μm or less, an optical film laminate including the polarizing film, a stretched laminate for use in the production of the optical film laminate including the polarizing film, production methods for them, and an organic EL display device having the polarizing film.

BACKGROUND ART

There has been widely known a method in which a single layer made of a polyvinyl alcohol type resin (hereinafter referred to as "PVA type resin") and formed in a film shape is subjected to dyeing and stretching to produce a polarizing film comprising a PVA type resin layer, wherein molecules of the PVA type resin are oriented in a direction of the stretching, and a dichroic material is impregnated in the PVA type resin in a molecularly oriented state. The polarizing film to be obtained by the above conventional method using a PVA type resin single layer film usually has a thickness in the range of about 15 to 35 μm. The conventional method makes it possible to obtain a polarizing film having the optical characteristics: a single layer transmittance of 42% or more; and a polarization rate of 99.95% or more. Currently, polarizing films produced by the conventional method are used in optical display devices for televisions, mobile telephones, PDAs and other appliances.

It should however be noted that a PVA type resin is hydrophilic and highly hygroscopic, so that a polarizing film produced using the PVA type resin is sensitive to changes in temperature and humidity, and more likely to expand and contract due to changes in surrounding environments, and is liable to be subjected to occurrence of crack. Moreover, the expansion and contraction caused by environmental changes during use will produce stress applied to an adjacent member to which the polarizer film is joined, and thereby cause deformation, such as warp, in the adjacent member.

Thus, in order to suppress such expansion and contraction of a polarizer film to thereby reduce the influence of change in temperature and humidity, it has been a usual practice to employ, in the case of a polarizing film for use in optical display devices for televisions, mobile telephones, PDAs and other appliances, a laminate prepared by laminating a triacetylcellulose (TAC) film having a thickness of 40 to 80 μm and serving as a protection film, on each of opposite surfaces of a polarizing film. However, even in such a structure, in cases where a single layer polarizing film is used therein, because of a limit in reducing the thickness of the polarizing film, expansion and contraction forces produced in the polarizing film are of a level which cannot be ignored, so that it is difficult to completely avoid the influence of expansion and contraction of the polarizing film, and a certain level of expansion and contraction will inevitably occur in the optical film laminate including the polarizing film. If expansion or contraction occurs in such an optical film laminate including a polarizing film, stress arising from the expansion or contraction will cause deformation, such as warp, in an adjacent member. This deformation, even if it is small, leads to the occurrence of non-uniformity of display in an optical display device. Thus, in order to suppress the occurrence of non-uniformity of display, it is necessary to make design considerations, for example, to carefully select a material for each member to be used in the optical film laminate including the polarizing film. Further, the stress produced by the contraction of the polarizing film will cause the optical film laminate being peeled off the display panel, so that there will be a need to use an adhesive having a high adhesive power is required to join the optical film laminate to the display panel. However, the use of such a high-power adhesive gives rise to a problem of difficulty in re-working which is an operation of, when the presence of an optical defect is found in a polarizing film of an optical film laminate laminated to a display panel through a subsequent inspection, peeling the optical film laminate from the display panel and laminating another optical film laminate to the display panel. In a liquid-crystal display device where an optical film laminate including a polarizing film is disposed on each of opposite surfaces of a liquid-crystal display panel, contraction stresses of the polarizing films on the opposite surfaces cancel out each other, so that the above problem is somewhat eased. However, in an organic EL display device using an organic EL display panel, the problem becomes prominent, because an optical film laminate including a polarizing film is disposed on only one of opposite surfaces of the display panel. In addition to non-uniformity of display and difficulty in re-working, the organic EL display device involves a problem that a sealing material for the display panel is destroyed due to the warp of the display panel, and an organic light-emitting layer is degraded due to humidity. This is a technical problem encountered in a polarizing film produced by the conventional method using a single layer of a PVA type resin formed in a film shape.

Thus, there is a need for a new method of producing a polarizing film, as an alternative to the conventional polarizing film production method using a PVA type resin single layer, which is incapable of reducing the thickness of a polarizing film to a sufficient level due to the above problem. Specifically, it is practically impossible to produce a polarizing film having a thickness of 10 μm or less by the conventional method using a PVA type resin single layer formed in a film shape. This is because, in producing a polarizing film using a single layer of a film-shaped PVA type resin, if the thickness of the PVA type resin single layer is excessively reduced, dissolution and/or breaking is likely to occur in the PVA type resin layer in the dyeing step and/or the stretching step, so that it becomes impossible to form a polarizing film having a uniform thickness.

In order to cope with this problem, there has been proposed a method designed such that a PVA type resin layer is applied and formed on a thermoplastic resin substrate, and the PVA type resin layer formed on the resin substrate is stretched together with the resin substrate, and subjected to dyeing, so as to produce a polarizing film significantly thinner than the polarizing film obtained by the conventional method. This polarizing film production method using a thermoplastic resin substrate is noteworthy in that it provides a possibility of producing a polarizing film more uniformly than the polarizing film production method using a PVA type resin single layer.

For example, Japanese Patent JP 4279944B (Patent Document 1) discloses a polarizing plate production method which comprises: step of forming a polyvinyl alcohol resin layer having a thickness of 6 μm to 30 μm, on one of opposite surfaces of a thermoplastic resin film by a coating process; stretching the polyvinyl alcohol resin layer at a stretching ratio of 2.0 to 5.0 in such a manner that the polyvinyl alcohol resin layer is formed as a transparent coating element layer to thereby form a composite film consisting of two layers: the thermoplastic resin film and the transparent coating element layer; laminating an optical transparent resin film layer on the side of the transparent coating element layer of the composite film consisting of the two layers, through a bonding agent; peeling and removing the thermoplastic resin film; and dyeing and fixing the transparent coating element layer in such a manner that the transparent coating element layer is formed as a polarizing element layer. A polarizing plate to be obtained by this method has a two-layer structure consisting of the optical transparent resin film layer and the polarizing element layer. According to the description of the Patent Document 1, the polarizing element has a thickness of 2 to 4 μm.

The method disclosed in the Patent Document 1 is designed to perform stretching under elevating temperature by a uniaxial stretching process, wherein the stretching ratio is restricted to the range of 2.0 to 5.0, as mentioned above. As for the reason why the stretching ratio is restricted to 5.0 or less, the Patent Document 1 explains that stretching at a high stretching ratio of greater than 5.0 makes it extremely difficult to maintain stable production. Thus, when the stretching ratio is 5.0 or less but close to 4.0 to 5.0, it would be difficult to ensure stable production. Specifically, there is described that the ambient temperature during stretching is set to 55° C. in cases where ethylene-vinyl acetate copolymer is used as the thermoplastic resin film, to 60° C. in cases where non-stretched polypropylene is used as the thermoplastic resin film, or to 70° C. in cases where non-stretched nylon is used as the thermoplastic resin film. The method disclosed in the Patent Document 1 employs a uniaxial stretching process in air under an elevated temperature. Further, as described in the Patent Document 1, the stretching ratio is restricted to 5.0 or less. Thus, this method has difficulty in stably producing a polarizing film which has an extremely small thickness of 2 to 4 μm and satisfies optical characteristics required when it is used for organic EL display devices. In other words, a polarizing film having an extremely small thickness of 2 to 4 μm produced by this method cannot satisfy the optical characteristics required when it is used such as organic EL display devices.

The method of forming a polarizing film with steps of forming a PVA type resin layer on a thermoplastic resin substrate by a coating process, and stretching the PVA type resin layer together with the substrate is also disclosed in Japanese Patent Laid-Open Publication JP 2001-343521A (Patent Document 2) and Japanese Patent Laid-Open Publication JP 2003-043257A (Patent Document 3). The methods disclosed in the Patent Documents 2 and 3 are designed such that a laminate consisting of a thermoplastic resin substrate and a PVA type resin layer applied on the substrate is subjected to uniaxial stretching at a temperature of 70° C. to 120° C., in cases where the substrate is made of a non-crystallizable polyester resin. Then, the PVA type resin layer molecularly oriented by the stretching is subjected to dyeing to allow a dichroic material to be impregnated therein. In the Patent Document 2, there is described that the uniaxial stretching may be longitudinal uniaxial stretching or may be transverse uniaxial stretching. Differently, in the Patent Document 3, a method is described in which transverse uniaxial stretching is performed, and, during or after the transverse uniaxial stretching, contracting the length in a direction perpendicular to a direction of the stretching by a specific amount. In both of the Patent Documents 2 and 3, there is described that the stretching ratio is typically set to about 4.0 to 8.0. Further, there is described that the thickness of a polarizing film to be obtained is in the range of 1 to 1.6 μm.

In the Patent Documents 2 and 3, although there is described that the stretching ratio is typically set to 4.0 to 8.0, since the Patent Documents 2 and 3 adopts an elevated temperature in-air stretching process, when the stretching ratio is increased beyond 5.0, the methods disclosed in the Patent Documents 2 and 3 become extremely difficult to maintain stable production, as described, for example, in the Patent Document 1. None of the Patent Documents 2 and 3 describes a specific technique for achieving a stretching ratio of greater than 5.0 by the elevated temperature in-air stretching process. In fact, in Examples described in the Patent Documents 2 and 3, only a stretching ratio of 5.0 and a stretching ratio of 4.5 are described, respectively. Through additional tests on the methods disclosed in the Patent Documents 2 and 3, the inventors of the present invention have ascertained that the methods disclosed therein are incapable of performing stretching at a stretching ratio of greater than 5.0, and stably performing stretching at a stretching ratio of 4 to 5. Therefore, it should be understood that the method disclosed in each of the Patent Documents 2 and 3 is substantially performed only at a stretching ratio of 5.0 or less, and, when the stretching ratio is 5.0 or less but in the range of 4.0 to 5.0, the method has difficulty in ensuring stable production. As with the Patent Document 1, in the method disclosed in the Patent Documents 2 and 3, the stretching ratio is restricted to 5.0 or less. Thus, an obtainable extremely thin polarizing film is not enough to satisfy optical characteristics required when it is used for organic EL display devices, or it is difficult to stably produce an extremely thin polarizing film satisfying optical characteristics required when it is used for organic EL display devices.

U.S. Pat. No. 4,659,523 (Patent Document 4) discloses a polarizing film production method which comprises subjecting a PVA type resin layer coated on a polyester film to uniaxial stretching together with the polyester film. This method disclosed in the Patent Document 4 is intended to form the polyester film serving as a substrate of the PVA type resin layer in such a manner as to have optical characteristics allowing the polyester film to be used together with a polarizing film, but it is not intended to produce a polarizing film comprising a PVA type resin layer and having a small thickness and excellent optical characteristic. Specifically, the method disclosed in the Patent Document 4 is no more than a technique of improving optical characteristics of a polyester resin film to be stretched together with a PVA type resin layer to be formed as a polarizing film. A polarizer material production method having the same object is also disclosed in Japanese Patent Publication JP 08-012296B (Patent Document 5).

LIST OF PRIOR ART DOCUMENTS

Patent Documents

Patent Document 1: Japanese Patent JP 4279944B
Patent Document 2: Japanese Laid-Open Patent Publication JP 2001-343521A
Patent Document 3: Japanese Laid-Open Patent Publication JP 2003-043257A
Patent Document 4: U.S. Pat. No. 4,659,523
Patent Document 5: Japanese Patent Publication JP 08-012296B
Patent Document 6: Japanese Laid-Open Patent Publication JP 2002-258269A
Patent Document 7: Japanese Laid-Open Patent Publication JP 2004-078143A
Patent Document 8: Japanese Laid-Open Patent Publication JP 2007-171892A
Patent Document 9: Japanese Laid-Open Patent Publication JP 2004-338379A
Patent Document 10: Japanese Laid-Open Patent Publication JP 2005-248173A
Patent Document 11: Japanese Laid-Open Patent Publication JP 2011-002759A
Patent Document 12: Japanese Laid-Open Patent Publication JP 05-27118A
Patent Document 13: Japanese Laid-Open Patent Publication JP 11-149015A

Non-Patent Documents

Non-Patent Document 1: K. Matsuhiro, "Xpol and its Application to 3D-TV", "EKISHO", Vol. 14, No. 4, 2010, pp 219-232
Non-Patent Document 2: H. W. Siesler, Advanced Polymeric Science, 65, 1, 1984

DISCLOSURE OF THE INVENTION

Problem to be Solved by the Invention

As disclosed in the Patent Documents 1 to 5, a method has already been known in which a PVA type resin layer is formed on a thermoplastic resin substrate by a coating process, and the PVA type resin layer is stretched together with the thermoplastic resin substrate to produce a polarizing film. However, a highly-functional polarizing film which has an extremely small thickness of 10 μm or less, and satisfies optical characteristics consisting of a single layer transmittance of 42.5 or more and a polarization rate of 99.5 or more, preferably, a single layer transmittance of 43.0 or more and a polarization rate of 99.5 or more, has not been practically realized, or stable production of such a highly-functional polarizing film has not been practically realized.

It is therefore an object of the present invention to provide or stably provide a polarizing film which has an extremely thin thickness as compared to conventional polarizing films and satisfies required optical characteristics, an optical film laminate including the polarizing film, an extended laminate for use in the production of the optical film laminate, production methods for them, and an organic EL display device having the polarizing film.

Means for Solving the Problem

The inventors have successfully obtained a novel polarizing film, preferably, by subjecting a non-crystallizable thermoplastic resin substrate and a PVA type resin layer applied and formed on the substrate to a stretching together, more preferably, a 2-stage stretching consisting of preliminary in-air stretching and in-boric-acid-solution stretching, together, and subjecting the PVA type resin layer to dyeing using a dichroic pigment, wherein a thickness of the polarizing film is 10 μm or less, and optical characteristics of the polarizing film represented by a single layer transmittance T and a polarization rate P can satisfy characteristics required when it is used for optical display devices, and have accomplished the present invention. As optical characteristics of a polarizing film when it is used for organic EL display devices, the inventors have set conditions represented by the following formulas: $T \geq 42.3$; and $P \geq 99.9$, wherein T is a single layer transmittance, and P is a polarization rate. The present invention provides a polarizing film formed such that a thickness thereof is 10 μm or less, and optical characteristics thereof represented by a single layer transmittance T and a polarization rate P satisfy the above conditions, an optical film laminate including a polarizing film, a stretched laminate for use in the production of an optical film laminate including a polarizing film, production method for them, and an organic EL display device using a polarizing film.

Specifically, according to a first aspect of the present invention, there is a provided a continuous web of polarizing film for an organic EL display device which is made of a polyvinyl alcohol type resin including a molecularly oriented dichroic material therein, and formed through a stretching, preferably, by subjecting a laminate comprising a non-crystallizable thermoplastic resin substrate and the polyvinyl alcohol type resin layer formed on the substrate to a stretching, preferably, a 2-stage stretching consisting of preliminary in-air stretching and in-boric-acid-solution stretching, to thereby have a thickness of 10 μm or less and exhibit optical characteristics satisfying the following conditions: $T \geq 42.5$; and $P \geq 99.5$, wherein T is a single layer transmittance, and P is a polarization rate. More preferably, the single layer transmittance T satisfies the following condition: $T \geq 43.0$. The non-crystallizable thermoplastic resin substrate may be a non-crystallizable ester type thermoplastic resin substrate. The dichroic material may be iodine or a mixture of iodine and an organic dye.

A polarizing film satisfying the above conditions represented by a single layer transmittance T and a polarization rate P has performance required as an organic EL display.

According to another aspect of the present invention, there is provided an optically functional film laminate which is prepared by: laminating an optically functional film on one of opposite surfaces of the continuous web of polarizing film for an organic EL display device; forming an adhesive layer on the other surface; and releasably attaching a separator to the polarizing film through the adhesive layer. In the optically functional film laminate, the optically functional film can be a TAC (triacetyl cellulose-based) film.

As a material for joining or bonding a layer, a film or the like to an object, it is possible to use, as a base polymer, at least one appropriately selected from the group consisting of acrylic-based polymer, silicone-based polymer, polyester, polyurethane, polyamide, polyether, fluorine or rubber-based polymer, isocyanate-based polymer, polyvinyl alcohol-based polymer, gelatin-based polymer, vinyl or latex-based polymer, and waterborne polyester.

As a material for improving adhesion force of an adhesive layer, an anchor layer as disclosed, for example, in JP 2002-258269A (Patent Document 6), JP 2004-078143A (Patent Document 7) and JP 2007-171892A (Patent Document 8), may be provided. A binder resin is not limited to a particular type, as long as it is capable of improving anchoring force of the adhesive layer. Specifically, it is possible to use resin (polymer) having an organic reactive group, such as epoxy-based resins, polyurethane-based resins, polyester-based resins, polymers including an amino group in molecules, ester urethane-based resins, or acrylic-based resins including an oxazoline group.

Further, an antistatic agent as disclosed, for example, in JP 2004-338379A (Patent Document 9) may be added to the anchor layer to provide an antistatic capability thereto. The antistatic agent for providing an antistatic capability may includes an ionic surfactant-based material, a conductive polymer-based material such as polyaniline, polythiophene, polypyrrole or polyquinoxaline, and a metal oxide-based material such as tin oxide, antimony oxide or indium oxide. Particularly in view of optical characteristics, appearance, antistatic effect and stability of antistatic effects during heating or humidification, it is preferable to use the conductive polymer-based material. Among the conductive polymer-based materials, it is particularly preferable to use a water-soluble conductive polymer such as polyaniline or polythiophene, or a water-dispersible conductive polymer. When the water-soluble conductive polymer or the water-dispersible conductive polymer is used as a material for forming an antistatic layer, it becomes possible to suppress transformation of an optical film substrate due to an organic solvent during coating.

According to another aspect of the present invention, there is provided an optically functional film laminate which is prepared by: laminating a protective layer and a phase difference layer, respectively, to one of opposite surfaces and the other surface of the continuous web of polarizing film for an organic EL display device to form a laminate, wherein the phase difference layer is adapted to produce circularly-polarized light in cooperation with the polarizing film for an organic EL display device; and releasably attaching a separator to one of opposite surface of the laminate through an adhesive layer. In the optically functional film laminate, the protective layer can be a TAC (triacetyl cellulose-based) film, and the phase difference film can be a biaxial phase difference film having a three-dimensional refraction index satisfying the following relationship: nx>nz>ny, wherein: nx, ny and nz are a refractive index in a slow axis direction of the phase difference layer, a refractive index in a direction perpendicular to the slow axis direction and a refractive index in a thickness direction, respectively. This optically functional film laminate can significantly ease warp which would otherwise occur in an organic EL display device, as compared to a conventional optically functional film laminate or the optically functional film laminate according to the second aspect of the present invention. Specifically, a polarizing film has a property of easily expanding and contracting according to changes in surrounding environment. Due to the expansion and contraction, the polarizing film applies a force causing warp to a display panel. As the polarizing film is disposed closer to the display panel, the force causing warp becomes smaller and then warp of the display panel tends to be eased. In an optically functional film laminate comprising a polarizing film produced using a conventional PVA type resin single layer film, it is necessary to laminate a protective layer to each of opposite sides of the polarizing film to suppress expansion and contraction of the polarizing film. In contrast, in a polarizing film having a thickness of 10 μm or less according to the present invention, it is not necessary to laminate a protective layer to each of opposite sides thereof, because such a polarizing film has small expansion/contraction stress. Therefore, it becomes possible to omit a protective film between the polarizing film and a display panel, so as to reduce a distance between the polarizing film and the display panel to ease a force to be applied to the display panel to cause warp. As above, the polarizing film having a thickness of 10 μm or less according to the present invention can reduce contraction stress and omit a protective film between the polarizing film and a display panel, so that a force causing warp in the display panel can be reduced, which makes it possible to more significantly ease warp as compared to a conventional optically functional film laminate or the optically functional film laminate according to the second aspect of the present invention.

As a material for the protective layer, it is typical to use a thermoplastic resin excellent in transparency, mechanical strength, thermal stability, water barrier properties, isotropy, etc. Specifically, the thermoplastic resin may include cellulosic resin such as triacetylcellulose, polyester resin, polyethersulfone resin, polysulphone resin, polycarbonate resin, polyamide resin, polyimide resin, polyolefin resin, (meta) acrylic resin, cyclic polyolefin resin (norbornene-based resin), polyarylate resin, polystyrene resin, and polyvinyl alcohol resin, and a mixture of two or more thereof.

A surface of the protective layer to which the polarizing film is not to be bonded may be subjected to a hard coat treatment, or an anti-reflection treatment, or an optical diffusion or anti-glare treatment, to form a surface-treated layer therein or thereon. The surface-treated layer may contain an ultraviolet (UV) absorber. Preferably, in order to improve humidity resistance of the polarizing film, the surface-treated layer has a low moisture permeability. The hard coat treatment is intended to prevent damage to a surface of the polarizing film. For example, an appropriate UV-curable resin such as an acrylic or silicone-based resin may be applied to the surface of the transparent protective layer to form thereon a cured film (hard coat layer) excellent in hardness, slip characteristics, etc. The anti-reflection treatment is intended to prevent reflection of external light at a surface of the polarizing film. An anti-reflection effect may be achieved according to a conventional technique, for example, by forming a thin layer for preventing reflection by utilizing a reflected-light attenuating or canceling effect based on an optical interference action, as disclosed in the Patent Document 10 (JP 2005-248173A), or a low reflecting layer having a microstructure capable of providing a low reflectance to a surface, as disclosed in the Patent Document 11 (JP 2011-002759A). The anti-glare treatment is intended to prevent the occurrence a situation where external light is reflected at a surface of the polarizing film to hinder viewing of light transmitted through the polarizing film, etc. For example, a microscopic concave-convex structure may be formed in the surface of the transparent protective layer by surface-roughening such as sand-blasting or embossing, blending of transparent particles or any other appropriate technique. The anti-glare treatment may additionally serve as a diffusing layer for diffusing light transmitted through the polarizing film to widen a viewing angle (viewing-angle widening function, etc.). Preferably, the hard coat layer has a pencil hardness of 2H or more.

According to another aspect of the present invention, there is provided an optical film laminate which comprises: a continuous web of non-crystallizable thermoplastic resin substrate; and an polarizing film for an organic EL display device made of a polyvinyl alcohol type resin including a molecularly oriented dichroic material therein and formed on the non-crystallizable thermoplastic resin substrate, wherein the polarizing film for an organic EL display device is formed through a stretching, preferably, by subjecting a laminate comprising a non-crystallizable thermoplastic resin substrate and the polyvinyl alcohol type resin layer formed on the substrate to stretching, preferably, a 2-stage stretching consisting of preliminary in-air stretching and in-boric-acid-solution stretching, to have a thickness of 10 μm or less and satisfy the following conditions: T≧42.5; and P≧99.5, wherein T is a single layer transmittance, and P is a polarization rate. More preferably, the single layer transmittance T satisfies the following condition: T≧43.0. The non-crystallizable thermoplastic resin substrate may be a non-crystallizable ester type thermoplastic resin substrate.

In the optical film laminate according to the fourth aspect of the present invention, the non-crystallizable thermoplastic resin substrate has a thickness which is preferably 6 times or more, more preferably 7 times or more, a thickness of the PVA type resin layer formed thereon. As long as the thickness of the non-crystallizable thermoplastic resin substrate is 6 times or more the thickness of the PVA type resin layer, a problem with carryability or feedability, i.e., a problem that the optical film laminate is broken during carrying due to poor film strength, a problem of curling causing a trouble in an operation of laminating the optical film laminate to another film, and/or a problem with transferability, i.e., a problem that the polarizing film cannot be adequately transferred due to an excessively small thickness of the substrate, will never occur.

Refer to FIG. 1. FIG. 1 illustrates a result of a test for checking whether a problem occurs in connection with a relationship between a thickness of the non-crystallizable ester type thermoplastic resin substrate and a thickness of the coated PVA type resin layer (or a thickness of the polarizing film). As seen in FIG. 1, if the thickness of the substrate is about 5 times or less the thickness of the PVA type resin layer, a problem is likely to occur in terms of carryability. On the other hand, in a polarizing film having a thickness of 10 μm or more, a problem is likely to occur in terms of crack resistance.

In the optical film laminate according to the fourth aspect of the present invention, the non-crystallizable thermoplastic resin substrate is preferably non-crystallizable polyethylene terephthalate comprising polyethylene terephthalate copolymerized with one selected from the group consisting of isophthalic acid, cyclohexanedimethanol and other crystallization inhibitor. The substrate may be made of a transparent resin.

Preferably, the dichroic material in the polyvinyl alcohol type resin is iodine or a mixture of iodine and an organic dye.

According to another aspect of the present invention, there is provided an optical film laminate assembly which is prepared by releasably laminating a separator, to a surface of the polarizing film for an organic EL display device included in the optical film laminate, on a side opposite to a film-forming surface of the non-crystallizable thermoplastic resin substrate, through an adhesive layer. In this optical film laminate assembly, the non-crystallizable thermoplastic resin substrate serves as a protective film for the polarizing film for an organic EL display device. Thus, the non-crystallizable thermoplastic resin substrate must be transparent.

According to another aspect of the present invention, there is provided an optical film laminate assembly which is prepared by: laminating an optically functional film, to a surface of the polarizing film for an organic EL display device included in the optical film laminate, on a side opposite to a film-forming surface of the non-crystallizable thermoplastic resin substrate; forming an adhesive layer on the laminated optically functional film; and releasably laminating a separator to the optically functional film through the adhesive layer. Preferably, in the optical film laminate assembly, the optically functional film is a phase difference layer adapted to produce circularly-polarized light in cooperation with the polarizing film so as to prevent the occurrence of a situation where light entered from a viewing side of the polarizing film thereinto is internally reflected and emitted toward the viewing side.

As used here, the term "circularly-polarized light" includes elliptically-polarized light as long as it substantially provides an anti-reflection function. As for a normal-directional phase difference of the phase difference layer, ¼ wavelength phase difference is typically used. However, as long as the phase difference substantially provides the anti-reflection function, it is not limited to ¼ wavelength phase difference, but may be ⅕ wavelength phase difference or ⅙ wavelength phase difference. As used here, the term "normal-directional phase difference" means a numerical value calculatable using the following formula: $(nx-ny) \times d$, wherein: nx is a refractive index in a slow axis direction of the phase difference layer; ny is a refractive index in a direction perpendicular to the slow axis direction; and d (nm) is a thickness of the phase difference film. As for an arrangement angle of the phase difference layer, a linearly polarizing film and the phase difference layer are typically laminated to allow their axes to cross at 45 degrees or 135 degrees. However, as long as the arrangement angle substantially provides the anti-reflection function, it is not limited to 45 degrees or 135 degrees. For example, the phase difference layer may have a three-dimensional refraction index satisfying the following relationship: "nx>ny=nz", or "nx>ny>nz", or "nx>nz>ny". When the phase difference layer has a three-dimensional refraction index satisfying the following relationship: nx>nz>ny, an anti-reflection function in an oblique direction can be obtained as well as the anti-reflection function in the front direction. As for wavelength dispersibility of the phase difference layer, a wide range of dispersibility from positive dispersibility to negative dispersibility may be used as long as it substantially provides the anti-reflection function. As long as the phase difference layer substantially provides the anti-reflection function, it may be composed of a plurality of layers, wherein an arrangement angle of each of the layer is not limited to a specific value. There has been proposed a technique of improving wavelength dispersion characteristics using a plurality of sheets of phase difference films, as disclosed, for example, the Patent Document 12 (JP 05-27118A) and the Patent Document 13 (JP 11-149015A). A material for the phase difference film may include: a birefringent film prepared by subjecting a polymer raw material to uniaxial or biaxial stretching; an oriented liquid-crystal polymer; and a laminate comprising a film and an oriented liquid-crystal polymer supported by the film. The polymer raw material may include polyvinyl alcohol, polyvinyl butyral, poly(methyl vinyl ether), polyhydroxy ethyl acrylate, hydroxyethyl cellulose, hydroxypropylcellulose, methylcellulose, polycarbonate, polyarylate, polysulphone, polyethylene terephthalate, polyethylene naphthalate, polyether sulfone, polyphenylene sulfide, polyphenylene oxide, polyallyl sulfone, polyamide, polyimide, polyester, polyether ketone, polyamide-imide, polyester-imide, polyolefin, polyvinyl chloride, cellulosic resin, and cyclic polyolefin resin (norbornene-based resin), and their binary or ternary copolymers, graft copolymers or blends. For example, the liquid-crystal polymer may include a main chain or side chain type in which a linear atom group (mesogen) with conjugative properties for imparting liquid-crystal molecular orientation is introduced in a main chain or side chain of a polymer. A specific example of the main chain-type liquid-crystal polymer may include a liquid-crystal polymer having a structure in which a mesogenic group is coupled in a spacer region for imparting flexibility, such as a polyester-based liquid-crystal polymer which exhibits a nematic orientation, a discotic polymer or a cholesteric polymer. A specific example of the side chain-type liquid-crystal polymer may include a liquid-crystal polymer having a structure in which a main chain skeleton is made of polysiloxane, polyarylate, polymethacrylate or polymalonate, and a side chain comprises a mesogen region consisting of a para-substituted cyclic compound unit for imparting a nematic orientation, through a spacer region an atom group with conjugative properties. The liquid-crystal polymer may be prepared by forming a thin film made, for example, of polyimide or polyvinyl alcohol, on a glass plate and subjecting a surface of the thin film to rubbing, or by subjecting silicon oxide to oblique evaporation to obtain a molecularly oriented surface, and subjecting the silicon oxide to a heat treatment while spreading a liquid-crystal polymer solution over the molecularly oriented surface.

According to another aspect of the present invention, there is provided an optical film laminate assembly prepared by: laminating a phase difference layer, to a surface of the polarizing film for an organic EL display device included in the optical film laminate, on a side opposite to a film-forming surface of the non-crystallizable thermoplastic resin substrate, wherein the phase difference layer is adapted to produce circularly-polarized light in cooperation with the polarizing film for an organic EL display device; forming an adhesive layer on the laminated optically functional film; and releasably laminating a separator to the phase difference layer through the adhesive layer.

According to another aspect of the present invention, there is provided a stretched laminate for producing an optical film laminate comprising a continuous web of non-crystallizable ester type thermoplastic resin substrate, and an polarizing film for an organic EL display device which is made of a polyvinyl alcohol type resin including a molecularly oriented dichroic material therein, and formed on the non-crystallizable ester type thermoplastic resin substrate, wherein the stretched laminate includes a stretched intermediate product consisting of a molecularly oriented polyvinyl alcohol type resin. The non-crystallizable ester type thermoplastic resin substrate is made of non-crystallizable polyethylene terephthalate which is set to have an orientation function of 0.10 or less and subjected to preliminary in-air stretching, and the stretched intermediate product is made of a polyvinyl alcohol type resin which is set to have a crystallization degree of 27% to 40% and an orientation function of 0.05 to 0.35. Further, the stretched intermediate product is adapted to be formed as the polarizing film for an organic EL display device on the non-crystallizable ester type thermoplastic resin substrate to have a thickness of 10 μm or less and satisfy the following conditions: $T \geq 42.5$; and $P \geq 99.5$, wherein T is a single layer transmittance, and P is a polarization rate. More preferably, the single layer transmittance T satisfies the following condition: $T \geq 43.0$.

In the stretched laminate according to one aspect of the present invention, the non-crystallizable ester type thermoplastic resin substrate has a thickness which is preferably 6 times or more, more preferably 7 times or more, a thickness of the polyvinyl alcohol type resin layer formed thereon. As long as the thickness of the non-crystallizable thermoplastic resin substrate is 6 times or more the thickness of the PVA type resin layer, a problem with carryability or feedability, i.e., a problem that the optical film laminate is broken during carrying due to poor film strength, a problem of curling causing a trouble in an operation of laminating the optical film laminate to another film, and/or a problem with transferability, i.e., a problem that the polarizing film cannot be adequately transferred due to an excessively small thickness of the substrate, will never occur.

In the stretched laminate according to one aspect of the present invention, the non-crystallizable ester type thermoplastic resin substrate is preferably non-crystallizable polyethylene terephthalate comprising polyethylene terephthalate copolymerized with one selected from the group consisting of isophthalic acid, cyclohexanedimethanol and other crystallization inhibitor, wherein the non-crystallizable polyethylene terephthalate is set to have an orientation function of 0.10 or less and subjected to a in-air stretching at elevated temperature. The substrate may be made of a transparent resin.

According to another aspect of the present invention, there is provided a method of producing an optical film laminate assembly which comprises a continuous web of non-crystallizable thermoplastic resin substrate and an polarizing film for an organic EL display device made of a polyvinyl alcohol type resin including a molecularly oriented dichroic material therein and formed on the substrate. The method comprises the steps of: subjecting a laminate comprising the non-crystallizable thermoplastic resin substrate and a polyvinyl alcohol type resin layer formed on the substrate to an in-air stretching at a elevated temperature to form a stretched laminate including a stretched intermediate product consisting of a molecularly oriented polyvinyl alcohol type resin layer; subjecting the stretched laminate to dyeing using a dichroic material to form a dyed laminate including a dyed intermediate product consisting of a polyvinyl alcohol type resin layer having a molecularly oriented dichroic material; and subjecting the dyed laminate to in-boric-acid-solution stretching to form an optical film laminate including an polarizing film for an organic EL display device made of a polyvinyl alcohol type resin including a molecularly oriented dichroic material therein, wherein optical characteristics of the polarizing film for an organic EL display device represented by a single layer transmittance T and a polarization rate P are in the following ranges: $T \geq 42.5$; and $P \geq 99.5$, and a thickness of the polarizing film for an organic EL display device is 10 μm or less. More preferably, the single layer transmittance T satisfies the following condition: $T \geq 43.0$. The non-crystallizable thermoplastic resin substrate may be a non-crystallizable ester type thermoplastic resin substrate.

In the method according to one aspect of the present invention, the non-crystallizable thermoplastic resin substrate has a thickness which is preferably 6 times or more, more preferably 7 times or more, a thickness of the PVA type resin layer formed thereon. As long as the thickness of the non-crystallizable thermoplastic resin substrate is 6 times or more the thickness of the PVA type resin layer, a problem with carryability or feedability, i.e., a problem that the optical film laminate is broken during carrying due to poor film strength, a problem of curling causing a trouble in an operation of laminating the optical film laminate to another film, and/or a problem with transferability, i.e., a problem that the polarizing film cannot be adequately transferred due to an excessively small thickness of the substrate, will never occur.

Refer to FIG. 1. FIG. 1 illustrates a result of a test for checking whether a problem occurs in connection with a relationship between a thickness of the non-crystallizable ester type thermoplastic resin substrate and a thickness of the coated PVA type resin layer (or a thickness of the polarizing film). As seen in FIG. 1, if the thickness of the substrate is about 5 times or less the thickness of the PVA type resin layer, a problem is likely to occur in terms of carryability.

In the method according to one aspect of the present invention, the thickness of the polarizing film is set to 10 μm or more. As seen in FIG. 2 which is a T-P graph representing polarization performance of a polarizing film, as long as a polarizing film has a thickness of 3 to 10 μm, i.e., in a 3

μm-thick polarizing film, an 8 μm-thick polarizing film and a 10 μm-thick polarizing film, there is no significant difference in polarization performance, and optical characteristic satisfying the above inequality can be obtained. FIG. 2 shows that a polarizing film having a thickness within 10 μm can obtain at least optical characteristics satisfying the required performance without concerning about a problem with crack resistance.

In the method according to one aspect of the present invention, the non-crystallizable ester type thermoplastic resin substrate is preferably non-crystallizable polyethylene terephthalate comprising polyethylene terephthalate copolymerized with one selected from the group consisting of isophthalic acid, cyclohexanedimethanol and other crystallization inhibitor. Preferably, the non-crystallizable thermoplastic resin substrate is made of a transparent resin so as to serve as an optically functional film for protecting one surface of the organic EL display-use polarizing film. The dichroic material may be iodine or a mixture of iodine and an organic dye.

The method according to the one aspect of the present invention may comprise a step of forming a PVA type resin layer on the non-crystallizable thermoplastic resin substrate. This step may be, but not limited to, a step of applying a polyvinyl alcohol type resin onto the non-crystallizable thermoplastic resin substrate and drying the applied polyvinyl alcohol type resin.

In the method according to one aspect of the present invention, a stretching ratio during the preliminary in-air stretching is preferably 3.5 times or less, and a stretching temperature during the preliminary in-air stretching is preferably equal to or greater than a glass transition temperature of the polyvinyl alcohol type resin. Preferably, a stretching temperature during the preliminary in-air stretching is in a range of 95° C. to 150° C.

In the method according to one aspect of the present invention, the dyed laminate including the PVA type resin layer in which iodine is oriented may be formed by immersing the stretched laminate including the PVA type resin layer molecularly oriented through the preliminary in-air stretching, to in an iodine dyeing solution containing the dichroic material.

In the method according to one aspect of the present invention, before immersing the stretched laminate in a dyeing solution, the stretched laminate is preliminarily subjected to insolubilization. Specifically, this step is designed, but not limited to, to immerse the stretched intermediate product in a boric acid aqueous solution having a temperature of 30° C., for 30 seconds to thereby insolubilize the PVA type resin layer in which PVA molecule included in the stretched laminate is oriented, included in the stretched laminate. The boric acid aqueous solution in this step may contain 3 weight parts of boric acid with respect to 100 weight parts of water. A technical requirement for this insolubilization step is to keep the PVA type resin layer included in the stretched laminate from being dissolved out. When this step is defined as a first insolubilization step, a step of, before the in-boric-acid-solution stretching, immersing the dyed laminate including the PVA type resin layer including the molecularly oriented dichroic material therein, in a boric acid aqueous solution at 40° C., for 60 seconds, to thereby insolubilize the dyed laminate by means of cross-linking, may be defined as a second insolubilization step. In the method according to one aspect of the present invention, each of the first insolubilization and the second insolubilization has an impact on optical characteristics of the polarizing film for an organic EL display included in the optical film laminate to be finally produced.

In the method according to one aspect of the present invention, in cases where the preliminary in-air stretching is performed by end-free uniaxially stretching, a total stretching ratio for the PVA type resin layer finally formed on the non-crystallizable thermoplastic resin substrate is preferably set in the range of 5.0 to 7.5. On the other hand, in cases where the preliminary in-air stretching is performed by end-fixed uniaxially stretching, a total stretching ratio for the PVA type resin layer finally formed on the non-crystallizable thermoplastic resin substrate is preferably set in the range of 5.0 to 8.5.

The method according to one aspect of the present invention may further comprise a step of cleaning the optical film laminate including the polarizing film for an organic EL display device made of the polyvinyl alcohol type resin including a molecularly oriented dichroic material therein, by an iodide salt-containing aqueous solution having a temperature less than a glass transition temperature of the non-crystallizable thermoplastic resin substrate comprised in the optical film laminate. The method may further comprise a step of drying the optical film laminate at a temperature of 50° C. to 100° C.

The method according to one aspect of the present invention may further comprise a step of laminating an optically functional film to an outer surface of the polarizing film for an organic EL display device formed on the non-crystallizable thermoplastic resin substrate included in the dried optical film laminate. Alternatively, the method may further comprise a step of laminating an optically functional film, to a surface of the polarizing film for an organic EL display device, on a side opposite to a film-forming surface of the non-crystallizable thermoplastic resin substrate included in the dried optical film laminate, while peeling the non-crystallizable thermoplastic resin substrate from the polarizing film for an organic EL display device, to thereby transfer the polarizing film for an organic EL display device to the optically functional film to form an optically functional film laminate having the polarizing film for an organic EL display device transferred to the optically functional film. The formed optically functional film laminate may be formed in various structures as described later.

According to one aspect of the present invention, there is provided an organic EL display device which comprises: a laminate including a first phase difference layer, and a polarizing film which is made of a polyvinyl alcohol type resin having a molecularly oriented dichroic material, and formed through a 2-stage stretching consisting of preliminary in-air stretching and in-boric-acid-solution stretching, to have a thickness of 10 μm or less and optical characteristics satisfying the following conditions: $T \geq 42.5$; and $P \geq 99.5$, wherein T is a single layer transmittance, and P is a polarization rate; wherein: a surface of the laminate on the side of the first phase difference layer is joined to one of opposite surfaces of the organic EL display panel through an optically transparent adhesive; a surface of the polarizing film on a side opposite to the first phase difference layer is joined to the protective layer made of a transparent resin material; and the laminate is designed to produce circularly-polarized light so as to allow light entered from a viewing side of the polarizing film thereinto and internally reflected to be kept from being emitted toward the viewing side. Preferably, the single layer transmittance T satisfies the following condition: $T \geq 43.0$.

The first phase difference layer is adapted to produce circularly-polarized light in cooperation with the polarizing film so as to allow light entered from a viewing side of the polarizing film thereinto and internally reflected to be kept from being emitted toward the viewing side. As used here, the term "circularly-polarized light" includes elliptically-polarized light as long as it substantially provides an anti-reflection function. A structure, properties, etc., of the first phase difference layer are the same as those in the optical film laminate assembly according to one aspect of the present invention.

The laminate including the polarizing film and the first phase difference layer may further include various layers other than the polarizing film and the first phase difference layer, such as a bonding-facilitating layer, a diffusing layer and a second protective layer.

In the organic EL display device according to one aspect of the present invention, the polarizing film and the first phase difference are preferably joined together. This structure can significantly ease warp which would otherwise occur in the organic EL display device, as compared to a conventional organic EL display device. Specifically, a polarizing film has a property of easily expanding and contracting according to changes in surrounding environment. Due to the expansion and contraction, the polarizing film applies a force causing warp to a display panel. As the polarizing film is disposed closer to the display panel, the force causing warp becomes smaller and thereby warp of the display panel tends to be eased. In an organic EL display device comprising a polarizing film produced using a conventional PVA type resin single layer film, it is necessary to laminate a protective layer to each of opposite sides of the polarizing film to suppress expansion and contraction of the polarizing film. In contrast, in a polarizing film having a thickness of 10 μm or less according to the present invention, it is not necessary to laminate a protective layer to each of opposite sides thereof, because such a polarizing film has small expansion/contraction stress. Therefore, it becomes possible to omit a protective film between the polarizing film and a display panel, so as to reduce a distance between the polarizing film and the display panel to ease a force to be applied to the display panel to cause warp. As above, the polarizing film having a thickness of 10 μm or less according to the present invention can reduce contraction stress and omit a protective film between the polarizing film and a display panel, so that a force causing warp in the display panel can be reduced, which makes it possible to more significantly ease warp as compared to a conventional organic EL display device.

In the organic EL display device according to one aspect of the present invention, a window may be disposed on an outer side of the protective layer. Further, a diffusion layer may be disposed at least one of a position between the protective layer and the polarizing film and a position between the polarizing film and the organic EL display panel. A bonding-facilitating layer may be disposed between the polarizing film and the protective layer to facilitate bonding between the polarizing film and the protective layer. An antistatic layer may be formed on the protective layer. The protective layer may be configured as a second phase difference layer for producing circularly-polarized light in cooperation with the polarizing film. In this case, linearly-polarized light emitted from the polarizing film is converted into circularly-polarized light. This provides an advantage of being able to eliminate a problem with viewing even when a viewer wears a polarized sunglass.

In the organic EL display device according to the tenth aspect of the present invention, the polarizing film may be formed by subjecting a polyvinyl alcohol type resin layer formed on a substrate made of an ester type thermoplastic resin material to the above-mentioned 2-stage stretching, together with the thermoplastic resin substrate, and the protective layer made of a transparent resin material may be composed of the thermoplastic resin substrate stretched together with the polyvinyl alcohol type resin layer. In this case, a non-crystallizable PET may be used as the ester type thermoplastic resin material.

In the organic EL display device according to one aspect of the present invention, the transparent resin material for the protective layer may comprise a cellulosic material or an acrylic resin material.

In the organic EL display device according to one aspect of the present invention, the protective layer may include a patterning phase difference layer. As an example of the patterning phase difference layer, there is a pattern retarder disclosed in the Non-Patent Document 1 (K. Matsuhiro, "Xpol and its Application to 3D-TV", "EKISHO", Vol. 14, No. 4, 2010, pp 219-232).

In the organic EL display device according to another aspect of the present invention, a touch panel laminate having a touch sensing function may be disposed on a viewing side with respect to the organic EL display panel. In this case, the touch panel laminate may be a capacitive touch panel configured such that a plurality of patterned pairs of transparent electrodes are disposed while interposing a dielectric layer therebetween.

Preferably, in above the organic EL display device, the touch panel laminate is disposed between the polarizing film and a viewing-side outermost member of the organic EL display device. Alternatively, the touch panel laminate may be disposed between the polarizing film and the organic EL display panel. Alternatively, the touch panel laminate may be a resistive touch panel configured such that a transparent electrode is disposed opposed to a counter electrode through an air gap, wherein the touch panel laminate is disposed between the polarizing film and the organic EL display panel, or between the polarizing film and a viewing-side outermost member.

Effect of the Invention

The present invention makes it possible to obtain or stably obtain a polarizing film extremely thinned as compared with conventional polarizing films and having required optical characteristics, an optical film laminate including such a polarizing film, a stretched laminate for use in the production of an optical film laminate including such a polarizing film, and an organic EL display device using a polarizing film extremely thinned as compared with conventional polarizing films and having required optical characteristics. Specifically, the present invention makes it possible to obtain or stably obtain a polarizing film made of a polyvinyl alcohol type resin including a molecularly oriented dichroic material therein and formed to have a thickness of 10 μm or less and exhibit required optical characteristics, an optical film laminate including the polarizing film, a stretched laminate for use in the production of the optical film laminate, production methods for them, and an organic EL display device using the polarizing film.

As mentioned above, any case of using a thermoplastic resin substrate and subjecting a PVA type resin layer formed on the substrate, to uniaxial stretching to attain a stretching ratio of 5.0 or more to thereby obtain a polarizing film having a thickness of 10 μm or less, or to uniaxial stretching to attain a stretching ratio of 4.0 to 5.0 to thereby stably obtain a polarizing film having a thickness of 10 μm or less, cannot be found in prior art documents.

A representative example of a polarizing film production method for use in the present invention, and an organic EL display device according to an embodiment of the present invention, will be specifically described below with reference to the following drawings.

BRIEF DESCRIPTION OF THE DRAWINGS

FIG. 5 is a comparative table comparatively illustrating the presence or absence of dissolution of a PVA type resin layer depending on a difference in iodine concentration of a dyeing bath.

FIG. 10g is a sectional view illustrating another further example of the modification of the organic EL display device according to the first embodiment.

FIG. 10h is a sectional view illustrating still a further example of the modification of the organic EL display device according to the first embodiment.

FIG. 12b is a sectional view illustrating an optical display device according to a fourth embodiment of the present invention.

FIG. 13 is a graph comparatively illustrating polarization performances of polarizing films in another group of inventive examples.

FIG. 27 is a table illustrating conditions for producing a polarizing film or an optical film laminate including the polarizing film, in each Example.

FIG. 28 is a table illustrating conditions for producing a polarizing film or an optical film laminate including the polarizing film, in each Example.

FIG. 29 is a comparative table illustrating values of the orientation function in Examples.

FIG. 30 is a graph illustrating polarization performance of a polarizing film in each Example.

DESCRIPTION OF EMBODIMENTS

[Technical Background of Polarizing Films]

Figure 1:
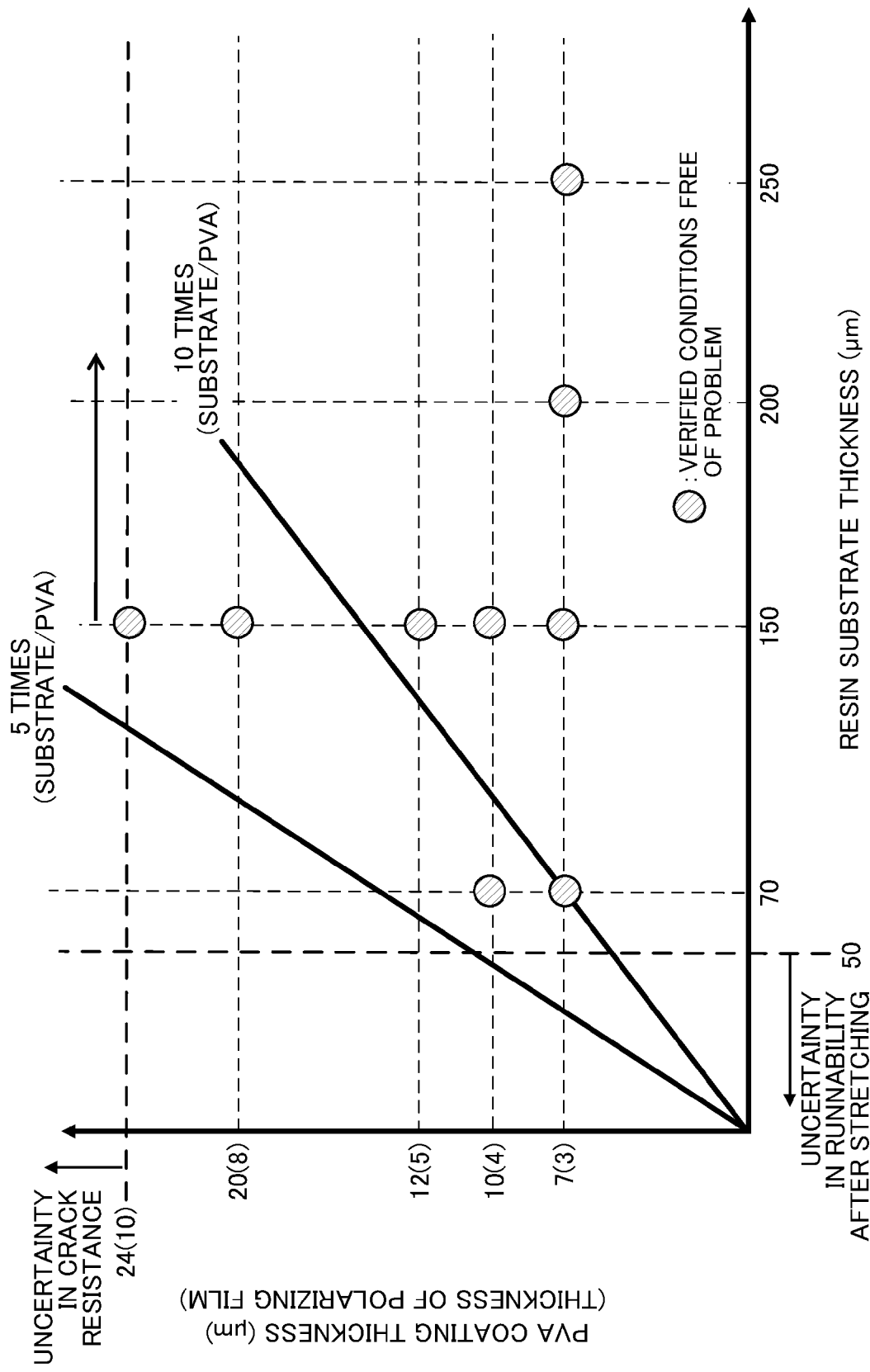
FIG. 1 is a diagram illustrating an appropriate thickness of a resin substrate with respect to a thickness of a PVA type resin layer (or a thickness of a polarizing film).

As the background art of polarizing films, optical characteristics represented by material characteristics of a thermoplastic resin substrate to be used in the present invention and polarization performance of a polarizing film will be described.

Firstly, general material characteristics of a thermoplastic resin suitable for use in the present invention will be described.

Thermoplastic resins are roughly classified into two types: one which is in a state in which polymer molecules are orderly arranged; and the other which is in a state in which only a small portion of polymer molecules are orderly arranged. The former state is called "crystallized state", and the latter state is called "amorphous or non-crystallized state. Correspondingly, one type of thermoplastic resin having a property capable of being transformed from a non-crystallized state into a crystallized state depending on conditions is called "crystallizable resin", and the other type of thermoplastic resin which does not have such a property is called "non-crystallizable resin". On the other hand, regardless of whether a crystallizable resin or a non-crystallizable resin, a resin which is not in a crystallized state or has not been transformed into a crystallized state, is called "amorphous or non-crystalline resin". The term "amorphous or non-crystalline" will be used herein in distinction from the term "non-crystallizable" which means a property incapable of transformation into a crystallized state.

For example, the crystallizable resin may include olefin type resins such as polyethylene (PE) and polypropylene (PP), and ester type resins such as polyethylene terephthalate (PET) and polybutylene terephthalate (PBT). One feature of the crystallizable resin is that, based on heating and/or stretching/orienting, polymer molecules are orderly arranged, and crystallization is progressed. Physical properties of the resin vary according to a degree of crystallization. On the other hand, even in the crystallizable resin, such as polypropylene (PP) or polyethylene terephthalate (PET), it is possible to suppress crystallization by inhibiting polymer molecules from being orderly arranged through heating or stretching/orienting. The crystallization-inhibited polypropylene (PP) and polyethylene terephthalate (PET) will hereinafter be referred to respectively as "non-crystallizable polypropylene" and "non-crystallizable polyethylene terephthalate", and referred to respectively and generically as "non-crystallizable olefin type resin" and "non-crystallizable ester type resin".

For example, in case of polypropylene (PP), it is possible to produce a crystallization-inhibited non-crystallizable polypropylene (PP) by forming it into an atactic structure having no stereoscopic regularity. Further, for example, in case of polyethylene terephthalate (PET), it is possible to produce a crystallization-inhibited non-crystallizable polyethylene terephthalate (PET) by copolymerizing isophthalic acid or a modifier group such as 1,4-cyclohexanedimethanol, as a polymerizing monomer, or by copolymerizing a molecule which inhibits crystallization of polyethylene terephthalate (PET).

Secondly, optical characteristics of a polarizing film usable in an organic EL display element will be generally described.

Basically, the term "optical characteristic" of a polarizing film means polarization performance represented by a polarization rate P and a single layer transmittance T. In general, the polarization rate P and the single layer transmittance T of a polarizing film are in trade-off relationship. The two optical characteristic values can be expressed by a T-P graph. As a plotted line of a polarizing film is located on a higher side in terms of the single layer transmittance and on a higher side in terms of the polarization rate in the T-P graph, the polarization performance of the polarizing film is evaluated to be better.

Figure 3:
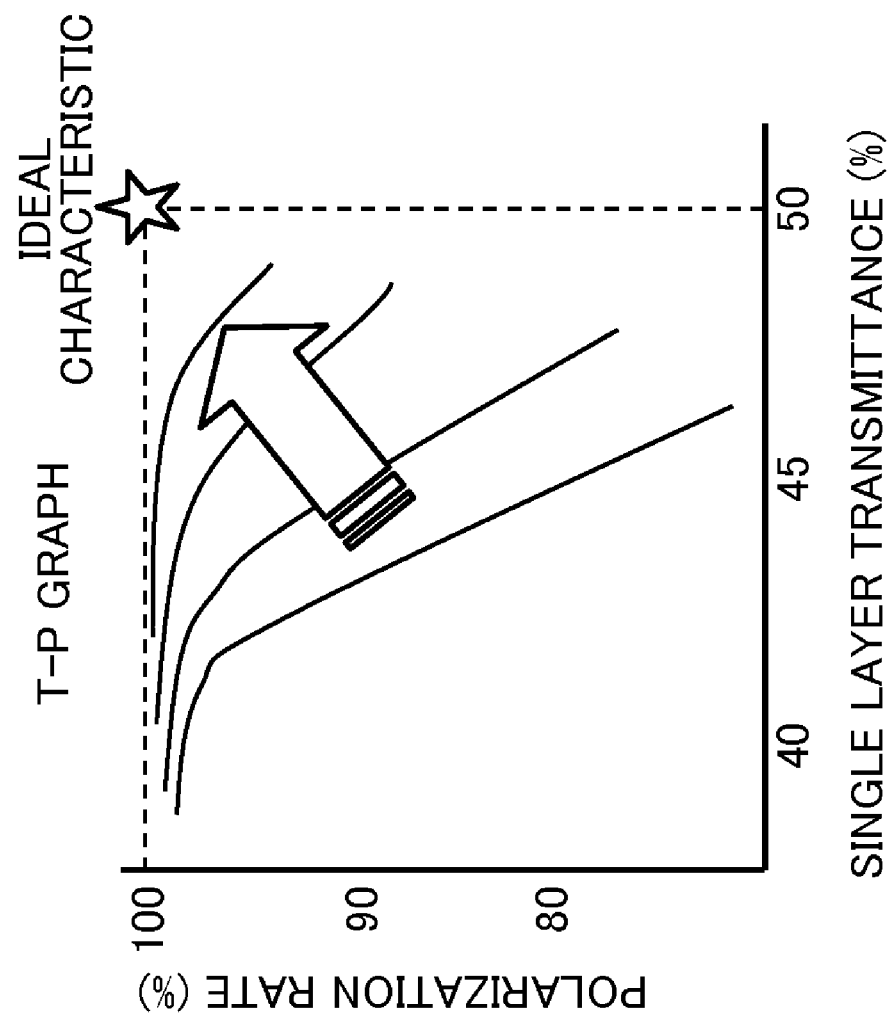
FIG. 3 is a graph illustrating a relationship between the single layer transmittance T and the polarization rate P.
Figure 4:
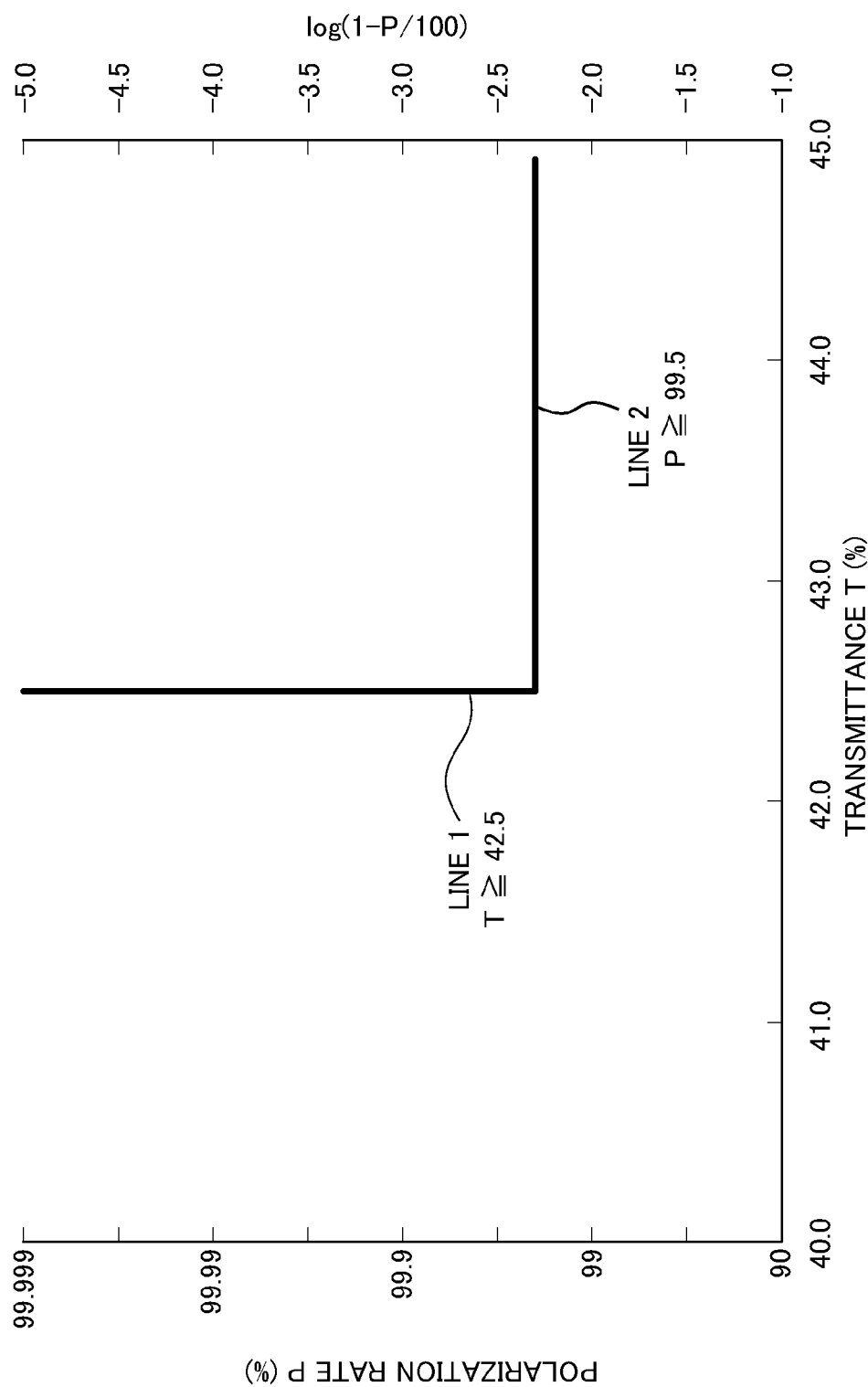
FIG. 4 is a graph illustrating a range of optical performance required for a polarizing film for use in an optical display device.

Referring to FIG. 3 illustrating a T-P graph, an ideal optical characteristic is a state in which P becomes 100% when T is 50%. As see in FIG. 3, a value of P tends to be more easily increased as T has a lower value, and tends to be more hardly increased as T has a higher value. Further, referring to FIG. 4 illustrating polarization performance of a polarizing film based on the relationship between the single layer transmittance T and the polarization rate P, a range defined as a region above the line 1 (T=42.5) and the line 2 (P=99.5) may be regarded as performance required for a polarizing film of an organic EL display device. More preferably, the single layer transmittance T satisfies the following relationship: $T \geq 43.0$. An ideal value of the single layer transmittance T is 50%. However, when light transmits through a polarizing film, a phenomenon occurs that a part of light is reflected at an interface between the polarizing film and air. Considering this reflection phenomenon, the single layer transmittance T is reduced by an amount corresponding to the reflection, and an actually attainable maximum value of the single layer transmittance T is in the range of about 45 to 46%.

On the other hand, the polarization rate P has a relationship with a function of a circularly polarizing plate for use in an organic EL display panel to reduce internal reflection of external light due to the organic EL display panel, wherein a capability to reduce internal reflection of external light is enhanced as the polarization rate becomes higher. For promoting better understanding, an organic EL display device will be specifically described below.

Typically, the organic EL display device has a light emitter (organic EL light-emitter) comprising a transparent electrode, an organic light-emitting layer and a metal electrode which are laminated on a transparent substrate in this order. The organic light-emitting layer is a laminate of various organic thin films. For example, the organic light-emitting layer includes a laminate of a hole-injecting layer made, for example, of a triphenylamine derivative, and a luminescent layer consisting of a fluorescent organic solid made, for example, of anthracene, a laminate of an electron-injecting layer made, for example, of a perylene derivative, and the luminescent layer, a laminate of the hole-injecting layer, the luminescent layer and the electron-injecting layer, and various other combinations.

The above organic EL display device emits light according to the following principle: Upon applying a voltage between the positive and negative electrodes, holes and electrons are injected into the organic light-emitting layer, so that energy generated from recombination between the holes and electrons excites a fluorescent material, and the excited fluorescent material emits light when the excited state returns to its ground state. The mechanism based on the recombination between the holes and electrons is the same as that of a conventional diode, and current and emission intensity exhibit strong nonlinearity with a rectifying action for an applied voltage.

In the organic EL display device, in order to extract light emitted from the organic light-emitting layer, at least one of the electrodes needs to be transparent. Generally, a transparent electrode made of a transparent conductor such as an indium tin oxide (ITO) is used as the positive electrode. On the other hand, in order to facilitate electron injection to enhance luminous efficiency, it is important that the negative electrode is made of a material having a small work function.

Generally, a metal electrode, such as a Mg—Ag electrode or an Al—Li electrode, is used as the negative electrode.

In the organic EL display device having the above structure, it is desirable to form the organic light-emitting layer into an extremely thin film having a thickness of about 10 μm. This is intended to allow light to be substantially fully transmitted through the organic light-emitting layer in the same manner as that in the transparent electrode. Therefore, internally reflected light, such as light reflected by the metal electrode after being entered from a surface of the transparent electrode and transmitted through the transparent electrode and the organic light-emitting layer, is returned toward the surface of the transparent electrode. Thus, particularly in a black state, i.e., a non-luminous state, a display surface of the organic EL device looks like a minor surface when viewed from the outside.

Therefore, as measures for blocking internal reflection, such as reflection from the metal electrode, there has been proposed a technique of using a polarizing film in combination with a phase difference plate such as a ¼ wavelength phase difference plate. For example, the phase difference plate and the polarizing film have a function of polarizing light entered from the outside and reflected at the metal electrode, so that they provide an advantageous effect to prevent a mirror surface of the metal electrode from being viewed from the outside by the polarizing function. Particularly, when a ¼ wavelength phase difference plate is used as the phase difference plate, an angle between respective polarizing directions of the polarizing film and the phase difference plate is adjusted to π/4, the mirror surface of the metal electrode can be substantially fully masked. Specifically, when external light entered into the organic EL display device passes through the polarizing film, the polarizing film permits only a linearly-polarized light component along a transmission axis direction to be transmitted therethrough. This linearly-polarized light is generally converted into an elliptically-polarized light by the phase difference plate. Particularly, when the phase difference plate is a ¼ wavelength phase difference plate, and the angle is set to π/4, the linearly-polarized light is converted into a circularly-polarized light.

This circularly-polarized light is transmitted, for example, through a transparent substrate, a transparent electrode and an organic thin film, and, after being reflected by the metal electrode and re-transmitted through the organic thin film, the transparent electrode and the transparent substrate, re-converted into a linearly-polarized light by the phase difference plate. This linearly-polarized light is oriented orthogonal to the transmission axis direction of the polarizing plate, and thereby cannot be transmitted through the polarizing plate, so that it becomes possible to substantially fully mask the mirror surface of the metal plate, as mentioned above.

Thus, as a prerequisite to reducing an internal reflectance of the organic EL display device to a given value or less, it is necessary to set a cross transmittance (transmittance when respective absorption axes of two polarizing films are arranged to cross orthogonally) to a given value or less. This means that it is necessary to set a polarization rate of the polarizing plate a given value or more.

Figure 2:
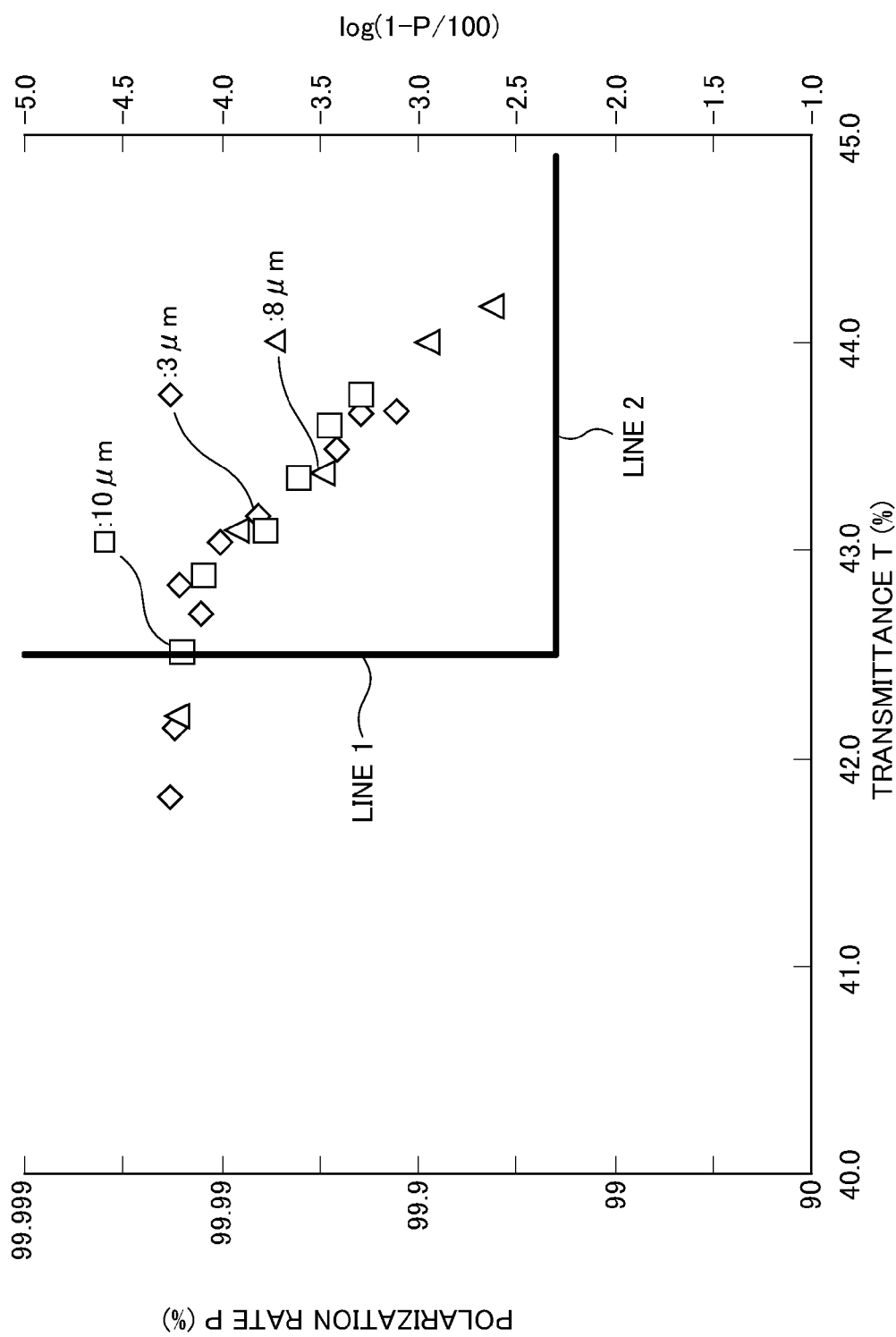
FIG. 2 is a comparative graph illustrating respective polarization performances of polarizing films having thicknesses of 3 μm, 8 μm and 10 μm.

In conclusion, a polarizing for organic EL display devices (polarizing film for an organic EL display device) is required to satisfy optical characteristics which fall within the range defined as the region above the line 1 (T=42.5) and the line 2 (P=99.5) in FIG. 2, i.e., optical characteristics in which the single layer transmittance T is 42.5 or more and the polarization rate P is 99.5 or more, preferably the single layer transmittance T is 43.0 or more and the polarization rate P is 99.5 or more.

[Examples on Production of Polarizing Film]

Examples 1 to 25 will be described as specific examples of a polarizing film for an organic EL display device according to the present invention. However, the present invention is not limited to these examples. FIGS. 27 and 28 illustrate conditions for producing polarizing films in the Examples 1 to 18. Further, as comparative examples, a reference sample and a comparative example were also set up. FIG. 29 illustrates a value of orientation function of a PET resin substrate of a stretched laminate in each of the Examples and of reference samples 1 to 3, after completion of first-stage elevated temperature in-air stretching. Further, respective measurement methods for thickness, transmittance and polarization rate, and respective evaluation methods for orientation function of PET, orientation function of PVA and crystallization degree of PVA, will be described below.

[Measurement Method]

(Thickness Measurement)

A thickness of each of the non-crystallizable PET substrate, the crystallizable PET substrate and the PVA layer was measured using a digital micrometer (KC-351C from Anritsu Electric Co., Ltd.).

(Measurement of Transmittance and Polarization Rate)

Each of the single layer transmittance T, the parallel transmittance Tp and the cross transmittance Tc of the polarizing film was measured using a UV-visible spectrophotometer (V7100 from JASCO Corporation). Each value of T, Tp and Tc is presented by a Y value measured according to JIS Z8701 (visual field of 2 degrees, C light source) and corrected for spectral luminous efficacy. The polarization rate P was calculated in accordance with the following formula using the above transmittance.

Polarization rate $P = \{(Tp-Tc)/(Tp+Tc)\}^{1/2} \times 100$ (Evaluation of Orientation Function of PET)

A Fourier Transform Infrared Spectrometer (FT-IR) (SPECTRUM 2000 from PerkinElmer, Inc.) was used as the measurement device. Attenuated total reflection (ATR) of polarizing light was measured to evaluate the surface of a PET resin layer. The orientation function was calculated in the following manner. Measurements were made on the polarizing light in the directions of 0° and 90° with respect to the stretching direction. Absorption intensity of the obtained spectral at 1340 cm$^{-1}$ was used to calculate the orientation function according to the Formula 4 (Non-Patent Document 2) described below. The condition of f=1 indicates a complete or perfect orientation, whereas the condition f=0 indicates a random orientation. The peak observed at 1340 cm$^{-1}$ is considered as indicating the absorption induced by a methylene in an ethylene glycol unit of PET.

$$f = (3\langle\cos^2\theta\rangle - 1)/2 \quad \text{(Formula 4)}$$
$$= [(R-1)(R_0+2)]/[(R+2)(R_0-1)]$$
$$= (1-D)/[c(2D+1)]$$
$$= -2 \times (1-D)/(2D+1)$$

where:
$c = (3\cos^2\beta - 1)/2$;
$\beta = 90°$, an angle of transition dipole moment with respect to an axis of molecular chain;

θ: an angle of molecular chain with respect to the stretching direction;

$R_0 = 2 \cot^2 \beta$;

$1/R = D = (I\perp)/(I//)$ (A value of D becomes larger as PET is more highly molecularly oriented);

$I\perp$ = absorption intensity measured when polarizing light is entered in a direction perpendicular to the stretching direction; and $I//$ = absorption intensity measured when polarizing light is entered in a direction parallel to the stretching direction.

(Evaluation of Orientation Function of PVA)

A Fourier Transform Infrared Spectrometer (FT-IR) (SPECTRUM 2000 from PerkinElmer, Inc.) was used as the measurement device. Attenuated total reflection (ATR) of polarizing light was measured to evaluate the surface of the PVA resin layer. The orientation function was calculated in the following manner. Measurements were made on the polarizing light in the directions of 0° and 90° with respect to the stretching direction. Absorption Intensity of the obtained spectral at 2941 cm$^{-1}$ was used to calculate the orientation function according to the above Formula 4. Intensity at 3330 cm$^{-1}$ was used as a reference peak, intensity at 2941 cm$^{-1}$/intensity at 3330 cm$^{-1}$ was calculated as the intensity I. The condition of f=1 indicates the complete or perfect orientation, whereas the condition f=0 indicates a random orientation. The peak observed at 2941 cm$^{-1}$ is considered to be absorption induced by vibration of the main chain of PVA (—CH$_2$—).

(Evaluation of Crystallization Degree of PVA)

A Fourier Transform Infrared Spectrometer (FT-IR) (SPECTRUM 2000 from PerkinElmer, Inc.) was used as the measurement device. Attenuated total reflection (ATR) of polarizing light was measured to evaluate the surface of the PVA resin layer. The crystallization degree was calculated in the following manner. Measurements were made on the polarizing light in the directions of 0° and 90° with respect to the stretching direction. Intensities of the obtained spectral at 1141 cm$^{-1}$ and at 1440 cm$^{-1}$ were used to calculate the crystallization degree. It was preliminarily ascertained that a level of the intensity at 1141 cm$^{-1}$ is correlated with an amount of crystal, and calculations were made using the intensity at 1440 cm$^{-1}$ as a reference peak to determine a crystallization index with the following equation (Formula 6). Further, a sample of PVA having a known crystallization degree was used to create a crystallization index and a calibration curve in advance, and the calibration curve was used to calculate the crystallization decree from the crystallization index (Formula 5).

Crystallization degree=63.8×(crystallization index)− 44.8 (Formula 5)

Crystallization index=(($I$(1141 cm$^{-1}$)0°+2×$I$(1141 cm$^{-1}$))90°/3)/(($I$(1440 cm$^{-1}$)0°+2×$I$(1440 cm$^{-1}$)) 90°/3) (Formula 6)

where:

I (1141 cm$^{-1}$) 0°=intensity at 1141 cm$^{-1}$ when polarizing light is entered in a direction parallel to the stretching direction;

I (1141 cm$^{-1}$) 90°=intensity at 1141 cm$^{-1}$ when polarizing light is entered in a direction perpendicular to the stretching direction;

I (1440 cm$^{-1}$) 0°=intensity at 1440 cm$^{-1}$ when polarizing light is entered in a direction parallel to the stretching direction; and I (1440 cm$^{-1}$) 90°=intensity at 1440 cm$^{-1}$ when polarizing light is entered in a direction perpendicular to the stretching direction.

Example 1

A continuous web of substrate was prepared as a non-crystallizable ester type thermoplastic resin substrate comprising isophthalic acid-copolymerized polyethylene terephthalate copolymerized with 6 mol % of isophthalic acid (hereinafter referred to as "non-crystallizable PET"). The non-crystallizable PET has a glass transition temperature of 75° C. A laminate comprising the continuous web of non-crystallizable PET substrate and a polyvinyl alcohol (hereinafter referred to as "PVA") layer was prepared in the following manner. For comparison, PVA has a glass transition temperature of 80° C.

A non-crystallizable PET substrate having a thickness of 200 μm was prepared, and a PVA aqueous solution having a PVA concentration of 4 to 5 wt % was also prepared by dissolving a PVA powder having a polymerization degree of 1000 or more and a saponification degree of 99% or more in water. As used here, the term "concentration" means a mixing ratio with respect to a total amount of the solution. In the following description, the term "concentration" will be used as the same meanings. Then, the PVA aqueous solution was applied to the 200 μm-thick non-crystallizable PET substrate, and dried at a temperature of 50 to 60° C., to form a PVA layer having a thickness of 7 μm on the non-crystallizable PET substrate. This product will hereinafter be referred to as a "laminate comprising the non-crystallizable PET substrate and the 7 μm-thick PVA layer formed on the non-crystallizable PET substrate", or as a "laminate including the 7 μm-thick PVA layer", or simply as a "laminate".

The laminate including the 7 μm-thick PVA layer was subjected to the following steps including a 2-stage stretching step consisting of preliminary in-air stretching and in-boric-acid-solution stretching, to produce a polarizing film having a thickness of 3 μm. Through the first-stage preliminary in-air stretching, the laminate including the 7 μm-thick PVA layer was stretched together with the non-crystallizable PET substrate to form a stretched laminate including a 5 μm-thick PVA layer. This product will hereinafter be referred to as a "stretched laminate". Specifically, the stretched laminate was obtained by placing the laminate including the 7 μm-thick PVA layer into a stretching apparatus arranged in an oven set to a stretching temperature environment of 130° C., to stretch the laminate in an end-free uniaxial manner to attain a stretching ratio of 1.8. Through this stretching step, the PVA layer in the stretched laminate was converted into a 5 μm-thick PVA layer in which PVA molecules are oriented.

Subsequently, the stretched laminate was subjected to a dyeing step to form a dyed laminate in which iodine is absorbed (impregnated) in the 5 μm-thick PVA layer having the oriented PVA molecules. This product will hereinafter be referred to as a "dyed laminate". Specifically, the dyed laminate was obtained by immersing the stretched laminate in a dyeing solution having a temperature of 30° C. and containing iodine and potassium iodide, for an arbitrary time, to cause iodine to be absorbed in the PVA layer included in the stretched laminate, so as to allow the PVA layer for making up a target polarizing film to have a single layer transmittance of 40 to 44%. In this step, the dyeing solution was prepared by adjusting a concentration of iodine and a concentration of potassium iodide to fall within the range of 0.12 to 0.30 wt % and the range of 0.7 to 2.1 wt %, respectively, using water as a solvent. A ratio of the concentration of iodine to the concentration of potassium iodide is 1:7.

Meanwhile, it is necessary to use potassium iodide to allow iodine to be dissolved in water. More specifically, the stretched laminate was immersed in a dyeing solution having an iodine concentration of 0.30 wt % and a potassium iodide concentration of 2.1 wt %, for 60 seconds, to form a dyed laminate in which iodine is absorbed in the 5 µm-thick PVA layer having the oriented PVA molecules. In the Example 1, various dyed laminates different in single layer transmittance and polarization rate were formed by changing an immersion time of the stretched laminate in the dyeing solution having an iodine concentration of 0.30 wt % and a potassium iodide concentration of 2.1 wt %, to adjust an amount of iodine to be absorbed, so as to allow a target polarizing film to have a single layer transmittance of 40 to 44%.

Further, through the second-stage in-boric-acid-solution stretching, the dyed laminate was further stretched together with the non-crystallizable PET substrate to form an optical film laminate including a PVA layer making up a 3 µm-thick polarizing film. This product will hereinafter be referred to as an "optical film laminate". Specifically, the optical film laminate was obtained by feeding the dyed laminate through a stretching apparatus arranged in treatment equipment having a boric acid aqueous solution containing boric acid and potassium iodide and having a temperature of 60 to 85° C., to subject the dyed laminate to an end-free uniaxial stretching to attain a stretching ratio of 3.3. More specifically, the temperature of the boric acid aqueous solution was 65° C. Further, the boric acid aqueous solution was set to contain 4 weight parts of boric acid with respect to 100 weight parts of water, and 5 weight parts of potassium iodide with respect to 100 weight parts of water.

In this step, the dyed laminate subjected to the adjustment in amount of absorbed iodine was first immersed in the boric acid aqueous solution for 5 to 10 seconds. Then, the dyed laminate was fed to directly pass between each of a plurality of set of rolls having different circumferential speeds and serving as the stretching apparatus arranged in the treatment equipment, and subjected to an end-free uniaxial stretching to attain a stretching ratio of 3.3 by taking a time of 30 to 90 seconds. Through this stretching, the PVA layer included in the dyed laminate is changed into a 3 µm-thick PVA layer in which absorbed iodine is highly oriented in one direction in the form of a polyiodide ion complex. This PVA layer makes up a polarizing film of an optical film laminate.

As above, in the Example 1, a laminate comprising a non-crystallizable PET substrate and a 7 µm-thick PVA layer formed on the substrate is first subjected to preliminarily in-air stretching at a stretching temperature of 130° C. to form a stretched laminate. Then, the stretched laminate is subjected to dyeing to form a dyed laminate. Then, the dyed laminate is subjected to in-boric-acid-solution stretching at a stretching temperature of 65° C., to form an optical film laminate including a 3 µm-thick PVA layer stretched together with the non-crystallizable PET substrate to attain a total stretching ratio of 5.94. Through the 2-stage stretching, it becomes possible to form an optical film laminate including a 3 µm-thick PVA layer in which PVA molecules in the PVA layer formed on the non-crystallizable PET substrate are highly oriented, and iodine absorbed through the dyeing is highly oriented in one direction in the form of a polyiodide ion complex.

Then, in a cleaning step although it is not essential in a production process of an optical film laminate, the optical film laminate was taken out of the boric acid aqueous solution, and boric acid deposited on a surface of the 3 µm-thick PVA layer formed on the non-crystallizable PET substrate was cleaned by a potassium iodide aqueous solution. Subsequently, in a drying step, the cleaned optical film laminate was dried by warm air at a temperature of 60° C. The cleaning step is designed to solve defective appearance due to deposition of boric acid.

Subsequently, in a lamination and/or transfer step, an 80 µm-thick triacetylcellulose (TAC) film was laminated to a surface of the 3 µm-thick PVA layer formed on the non-crystallizable PET substrate, while applying a bonding agent onto the surface of the 3 µm-thick PVA layer. Then, the non-crystallizable PET substrate was peeled to allow the 3 µm-thick PVA layer to be transferred to the 80 µm-thick triacetylcellulose (TAC) film.

Example 2

In the Example 2, as with the Example 1, a 7 µm-thick PVA layer was formed on a non-crystallizable PET substrate to form a laminate, and then the laminate including the 7 µm-thick PVA layer was subjected to preliminary in-air stretching and stretched at a stretching ratio of 1.8 to form a stretched laminate, whereafter the stretched laminate was immersed in a dyeing solution containing iodine and potassium iodide and having a temperature of 30° C. to form a dyed laminate including an iodine-absorbed PVA layer. Differently from the Example 1, a process in the Example 2 additionally comprises a cross-linking step. The cross-linking step is designed to immerse the dyed laminate in a cross-linking boric acid aqueous solution at a temperature of 40° C., for 60 seconds, so as to allow PVA molecules of the iodine-absorbed PVA layer to be subjected to cross-linking. The cross-linking boric acid aqueous solution in this step was set to contain 3 weight parts of boric acid with respect to 100 weight parts of water, and 3 weight parts of potassium iodide with respect to 100 weight parts of water.

The cross-linking step in the Example 2 is intended to expect at least three technical effects. The first is an insolubilization effect of preventing a thinned PVA layer included in the dyed laminate from being dissolved during subsequent in-boric-acid-solution stretching. The second is a dyeing stabilization effect of preventing elution of iodine absorbed in the PVA layer. The third is a node formation effect of forming nodes by cross-linking molecules of the PVA layer together.

In the Example 2, the cross-linked dyed laminate was immersed in an in-boric-acid-solution stretching bath at 75° C. which is higher than a stretching temperature of 65° C. in the Example 1, and stretched at a stretching ratio of 3.3 to form an optical film laminate, as with the Example 1. The process in the Example 2 further comprises a cleaning step, a drying step and a lamination and/or transfer step each of which is the same as that in the Example 1.

In order to further clarify the technical effects expected of the cross-linking step in advance of the in-boric-acid-solution stretching, a non-cross-linked dyed laminate in the Example 1 was immersed in the in-boric-acid-solution stretching bath at a stretching temperature of 70 to 75° C. In this case, the PVA layer included in the dyed laminate was dissolved in the in-boric-acid-solution stretching bath to preclude the stretching.

Example 3

In the Example 3, as with the Example 1, a 7 µm-thick PVA layer was formed on a non-crystallizable PET substrate to form a laminate, and then the laminate including the 7 µm-thick PVA layer was subjected to preliminary in-air stretching and stretched at a stretching ratio of 1.8 to form a stretched laminate. Differently from the Example 1, a process in the Example 3 additionally comprises an insolubilization step. The insolubilization step is designed to immerse the stretched laminate in a boric acid insolubilizing aqueous solution at a solution temperature of 30° C., for 30 seconds, so as to insolubilize a PVA layer included in the stretched laminate and having oriented PVA molecules. The boric acid insolubilizing aqueous solution in this step was set to contain 3 weight parts of boric acid with respect to 100 weight parts of water. A technical effect expected of the insolubilization step in the Example 3 is to prevent the PVA layer included in the stretched laminate from being dissolved at least during a subsequent dyeing step.

In the Example 3, as with the Example 1, the insolubilized stretched laminate was immersed in a dyeing solution containing iodine and potassium iodide and having a temperature of 30° C. to form a dyed laminate including an iodine-absorbed PVA layer. Subsequently, the dyed laminate was immersed in the in-boric-acid-solution stretching bath at 65° C. which is equal to the stretching temperature in the Example 1, and stretched at a stretching ratio of 3.3 in the same manner as that in the Example 1 to form an optical film laminate. The process in the Example 3 further comprises a cleaning step, a drying step and a lamination and/or transfer step each of which is the same as that in the Example 1.

In order to further clarify the technical effects expected of the insolubilization step in advance of the dyeing step, a non-insolubilized stretched laminate in the Example 1 was subjected to dyeing to form a dyed laminate, and the formed dyed laminate was immersed in the in-boric-acid-solution stretching bath at a stretching temperature of 70 to 75° C. In this case, the PVA layer included in the dyed laminate was dissolved in the in-boric-acid-solution stretching bath to preclude the stretching, as with the Example 2.

In another test, a dyeing solution was prepared using water as a solvent to set an iodine concentration in the range of 0.12 to 0.25 wt % instead of the dyeing solution of the Example 1, which sets the iodine concentration of 0.30 wt % set, while keeping the remaining conditions unchanged. Then, the non-insolubilized stretched laminate in the Example 1 was immersed in the prepared dyeing solution. In this case, the PVA layer included in the stretched laminate was dissolved in the dyeing bath to preclude the dyeing. In contrast, when the insolubilized stretched laminate in the Example 3 was used, the dyeing to the PVA layer could be performed without dissolution of the PVA layer, even if the iodine concentration of the dyeing solution was in the range of 0.12 to 0.25 wt %.

In the Example 3 where the dyeing to the PVA layer can be performed even if the iodine concentration of the dyeing solution is in the range of 0.12 to 0.25 wt %, various dyed laminates different in single layer transmittance and polarization rate were formed by changing the iodine concentration and the potassium iodide concentration of the dyeing solution in the certain range in the Example 1, while keeping an immersion time of the stretched laminate in the dyeing solution constant, to adjust an amount of iodine to be absorbed, so as to allow a target polarizing film to have a single layer transmittance of 40 to 44%.

Example 4

In the Example 4, an optical film laminate was formed by a production process in which the insolubilization step in the Example 3 and the cross-linking step in the Example 2 are added to the production process in the Example 1. Firstly, a 7 μm-thick PVA layer was formed on a non-crystallizable PET substrate to form a laminate, and then the laminate including the 7 μm-thick PVA layer was subjected to preliminary in-air stretching based on an end-free uniaxial stretching process to attain a stretching ratio of 1.8 to thereby form a stretched laminate. In the Example 4, as with the Example 3, through the insolubilization step of immersing the formed stretched laminate in a boric acid insolubilizing solution at a temperature of 30° C. for 30 seconds, the PVA layer included in the stretched laminate and having oriented PVA molecules was insolubilized. Then, in the Example 4, as with the Example 3, the stretched laminate including the insolubilized PVA layer was immersed in a dyeing solution containing iodine and potassium iodide and having a temperature of 30° C. to form a dyed laminate including an iodine-absorbed PVA layer.

In the Example 4, as with the Example 2, through the cross-linking step of immersing the formed dyed laminate in a boric acid cross-linking solution at 40° C. for 60 seconds, PVA molecules of the iodine-absorbed PVA layer are cross-linked together. Then, in the Example 4, the cross-linked dyed laminate was immersed in an in-boric-acid-solution stretching bath at 75° C. which is higher than a stretching temperature of 65° C. in the Example 1, for 5 to 10 seconds, and subjected to end-free uniaxial stretching to attain a stretching ratio of 3.3, in the same manner as that in the Example 2, to thereby form an optical film laminate. The process in the Example 4 further comprises a cleaning step, a drying step and a lamination and/or transfer step each of which is the same as that in each of the Examples 1 to 3.

As with the Example 3, the PVA layer in the Example 4 is never dissolved even if the iodine concentration of the dyeing solution is in the range of 0.12 to 0.25 wt %. In the Example 4, various dyed laminates different in single layer transmittance and polarization rate were formed by changing the iodine concentration and the potassium iodide concentration of the dyeing solution in the certain range in the Example 1, while keeping an immersion time of the stretched laminate in the dyeing solution constant, to adjust an amount of iodine to be absorbed, so as to allow a target polarizing film to have a single layer transmittance of 40 to 44%.

As above, in the Example 4, a 7 μm-thick PVA layer is formed on a non-crystallizable PET substrate to form a laminate, and then the laminate including the 7 μm-thick PVA layer is subjected to preliminarily in-air stretching based on an end-free uniaxial stretching process to attain a stretching ratio of 1.8 to thereby form a stretched laminate. The formed stretched laminate is immersed in a boric acid insolubilizing solution at a solution temperature of 30° C. for 30 seconds to insolubilize the PVA layer included in the stretched laminate. The stretched laminate including the insolubilized PVA layer is immersed in a dyeing solution containing iodine and potassium iodide and having a temperature of 30° C. to form a dyed laminate in which iodine is absorbed in the insolubilized PVA layer. The dyed laminate including the iodine-absorbed PVA layer is immersed in a boric acid cross-linking solution at 40° C. for 60 seconds to cross-link PVA molecules of the iodine-absorbed PVA layer together. The dyed laminate including the cross-linked PVA layer is immersed in an in-boric-acid-solution stretching bath containing iodine and potassium iodide and having a temperature of 75° C., for 5 to 10 seconds, and then subjected to in-boric-acid-solution stretching based on an end-free uniaxial stretching process to attain a stretching ratio of 3.3 to thereby form an optical film laminate.

In the Example 4, based on the 2-stage stretching consisting of the elevated temperature in-air stretching and the in-boric-acid-solution stretching, and pre-treatments consisting of the insolubilization in advance of the immersion into a dyeing bath and the cross-linking in advance of the in-boric-acid-solution stretching, it becomes possible to stably form an optical film laminate including a 3 μm-thick PVA layer making up a polarizing film, in which PVA molecules of the PVA layer formed on the non-crystallizable PET substrate are highly oriented, and iodine reliably absorbed in the PVA molecules through the dyeing is highly oriented in one direction in the form of a polyiodide ion complex.

Example 5

In the Example 5, an optical film laminate was produced under the same conditions as those in the Example 4, except the following difference. The difference is a thickness of the PVA layer formed on the non-crystallizable PET substrate. In the Example 4, the PVA layer initially had a thickness of 7 μm, and the PVA layer finally included in the optical film laminate had a thickness of 3 μm, whereas, in the Example 5, the PVA layer initially had a thickness of 12 μm, and the PVA layer finally included in the optical film laminate had a thickness of 5 μm.

Example 6

In the Example 6, an optical film laminate was produced under the same conditions as those in the Example 4, except the following difference. The difference is a polymerizing monomer used in the non-crystallizable PET substrate. In the Example 4, the non-crystallizable PET substrate was prepared by copolymerizing PET and isophthalic acid, whereas, in the Example 6, the non-crystallizable PET substrate was prepared by copolymerizing PET and 1,4-cyclohexanedimethanol serving as a modifier group.

Example 7

In the Example 7, an optical film laminate was produced under the same conditions as those in the Example 4, except the following difference. The difference is that a stretching ratio for each of the preliminary in-air stretching and the in-boric-acid-solution stretching was changed to allow a total stretching ratio to become equal to or close to 6.0. In the Example 4, the stretching ratios for the preliminary in-air stretching and the in-boric-acid-solution stretching were set, respectively, to 1.8 and 3.3, whereas, in the Example 7, the two stretching ratios were set, respectively, to 1.2 and 4.9. Meanwhile, the total stretching ratio in the Example 4 was 5.94, whereas the total stretching ratio in the Example 7 was 5.88. The reason is that, in the in-boric-acid-solution stretching, it was unable to perform the stretching at a stretching ratio of 4.9 or more.

Example 8

In the Example 8, an optical film laminate was produced under the same conditions as those in the Example 4, except the following difference. The difference is that a stretching ratio for each of the preliminary in-air stretching and the in-boric-acid-solution stretching was changed to allow a total stretching ratio to become equal to 6.0. In the Example 8, the stretching ratios for the preliminary in-air stretching and the in-boric-acid-solution stretching were set to 1.5 and 4.0, respectively.

Example 9

In the Example 9, an optical film laminate was produced under the same conditions as those in the Example 4, except the following difference. The difference is that a stretching ratio for each of the preliminary in-air stretching and the in-boric-acid-solution stretching was changed to allow a total stretching ratio to become equal to 6.0. In the Example 9, the stretching ratios for the preliminary in-air stretching and the in-boric-acid-solution stretching were set to 2.5 and 2.4, respectively.

Example 10

In the Example 10, an optical film laminate was produced under the same conditions as those in the Example 4, except the following difference. In the Example 4, a stretching temperature for the preliminary in-air stretching was set to 130° C., whereas, in the Example 10, the stretching temperature for the preliminary in-air stretching was set to 95° C.

Example 11

In the Example 11, an optical film laminate was produced under the same conditions as those in the Example 4, except the following difference. In the Example 4, the stretching temperature for the preliminary in-air stretching was set to 130° C., whereas, in the Example 11, the stretching temperature for the preliminary in-air stretching was set to 110° C.

Example 12

In the Example 12, an optical film laminate was produced under the same conditions as those in the Example 4, except the following difference. In the Example 4, the stretching temperature for the preliminary in-air stretching was set to 130° C., whereas, in the Example 12, the stretching temperature for the preliminary in-air stretching was set to 150° C.

Example 13

In the Example 13, an optical film laminate was produced under the same conditions as those in the Example 4, except the following difference. The difference is that the stretching ratio for the preliminary in-air stretching was set to 1.8, and the stretching ratio for the in-boric-acid-solution stretching was changed to 2.8. As a result, in the Example 13, the total stretching ratio was about 5.0 (accurately, 5.04), whereas, in the Example 4, the total stretching ratio was about 6.0 (accurately, 5.94).

Example 14

In the Example 14, an optical film laminate was produced under the same conditions as those in the Example 4, except the following difference. The difference is that the stretching ratio for the preliminary in-air stretching was set to 1.8, and the stretching ratio for the in-boric-acid-solution stretching was changed to 3.1. As a result, in the Example 14, the total stretching ratio was about 5.5 (accurately, 5.58), whereas, in the Example 4, the total stretching ratio was about 6.0 (accurately, 5.94).

Example 15

In the Example 15, an optical film laminate was produced under the same conditions as those in the Example 4, except the following difference. The difference is that the stretching ratio for the preliminary in-air stretching was set to 1.8, and the stretching ratio for the in-boric-acid-solution stretching was changed to 3.6. As a result, in the Example 15, the total stretching ratio was about 6.5 (accurately, 6.48), whereas, in the Example 4, the total stretching ratio was about 6.0 (accurately, 5.94).

Example 16

In the Example 16, an optical film laminate was produced under the same conditions as those in the Example 4, except the following difference. The difference is a stretching scheme in the preliminary in-air stretching. In the Example 4, the preliminary in-air stretching was performed based on an end-free uniaxial stretching process to attain a stretching ratio of 1.8, whereas, in the Example 16, the preliminary in-air stretching was performed based on an end-fixed uniaxial stretching process to attain a stretching ratio of 1.8.

Example 17

In the Example 17, an optical film laminate was produced under the same conditions as those in the Example 16, except the following difference. The difference is that the stretching ratio for the preliminary in-air stretching was set to 1.8, and the stretching ratio for the in-boric-acid-solution stretching was changed to 3.9. As a result, in the Example 17, the total stretching ratio was about 7.0 (accurately, 7.02), whereas, in the Example 16, the total stretching ratio was about 6.0 (accurately, 5.94).

Example 18

In the Example 18, an optical film laminate was produced under the same conditions as those in the Example 16, except the following difference. The difference is that the stretching ratio for the preliminary in-air stretching was set to 1.8, and the stretching ratio for the in-boric-acid-solution stretching was changed to 4.4. As a result, in the Example 18, the total stretching ratio was about 8.0 (accurately, 7.92), whereas, in the Example 16, the total stretching ratio was about 6.0 (accurately, 5.94).

Example 19

In the Example 19, an optical film laminate was produced under the same conditions as those in the Example 4, except the following difference. The difference is that the thickness of the PVA layer formed on the non-crystallizable PET substrate is changed, and respective stretching ratios during the preliminary in-air stretching and the in-boric-acid-solution stretching were changed while allowing a total stretching ratio to be 6.0. Specifically, in the Example 4 where the PVA layer had an initial thickness of 7 µm, the thickness of the PVA layer included in the optical film laminate was finally reduced to 3 µm, whereas, in the Example 19 where the PVA layer had an initial thickness of 9 µm, the thickness of the PVA layer included in the optical film laminate was finally reduced to 3.5 µm. Further, in the Example 4, the stretching ratios during the preliminary in-air stretching and the in-boric-acid-solution stretching were set to 1.8 and 3.3, respectively, whereas, in the Example 19, the stretching ratios during the preliminary in-air stretching and the in-boric-acid-solution stretching were set to 2.0 and 3.0, respectively.

Example 20

In the Example 20, an optical film laminate was produced under the same conditions as those in the Example 19, except the following difference. The difference is that the thickness of the PVA layer formed on the non-crystallizable PET substrate is changed. Specifically, in the Example 19 where the PVA layer had an initial thickness of 9 µm, the thickness of the PVA layer included in the optical film laminate was finally reduced to 3.5 µm, whereas, in the Example 20 where the PVA layer had an initial thickness of 6 µm, the thickness of the PVA layer included in the optical film laminate was finally reduced to 2.5 µm.

Example 21

In the Example 21, an optical film laminate was produced under the same conditions as those in the Example 19, except the following difference. In the Example 21 where the PVA layer had an initial thickness of 14 µm, the thickness of the PVA layer included in the optical film laminate was finally reduced to 6 µm.

Example 22

In the Example 22, an optical film laminate was produced under the same conditions as those in the Example 19, except the following difference. In the Example 22 where the PVA layer had an initial thickness of 24 µm, the thickness of the PVA layer included in the optical film laminate was finally reduced to 10 µm.

Example 23

In the Example 23, an optical film laminate was produced under the same conditions as those in the Example 19, except the following difference. The difference is that the stretching ratio during the preliminary in-air stretching was set to 2.0, and the stretching ratio during the in-boric-acid-solution stretching was changed to 3.25. As a result, the total stretching ratio in the Example 23 was 6.5, whereas the total stretching ratio in the Example 19 was 6.0.

Example 24

In the Example 24, an optical film laminate was produced under the same conditions as those in the Example 19, except the following difference. The difference is that the stretching temperature during the preliminary in-air stretching and the stretching ratio during the in-boric-acid-solution stretching were changed. Specifically, in the Example 19, the stretching temperature during the preliminary in-air stretching was set to 130° C., whereas, in the Example 24, the stretching temperature during the preliminary in-air stretching was set to 110° C. Further, in the Example 19, the stretching ratio during the in-boric-acid-solution stretching was set to 3.0, and the total stretching ratio was set to 6.0, whereas, in the Example 24, the stretching ratio during the in-boric-acid-solution stretching was set to 2.5, and the total stretching ratio was set to 5.0.

Example 25

In the Example 25, an optical film laminate was produced under the same conditions as those in the Example 24, except the following difference. The difference is that the stretching temperature during the preliminary in-air stretching was changed. Specifically, in the Example 24, the stretching temperature during the preliminary in-air stretching was set to 110° C., whereas, in the Example 25, the stretching temperature during the preliminary in-air stretching was set to 95° C.

Comparative Example 1

In the comparative example 1, under the same conditions as those in the Example 4, a PVA solution was applied to a 200 μm-thick non-crystallizable PET substrate, and dried to form a laminate comprising the non-crystallizable PET substrate and a 7 μm-thick PVA layer formed on the substrate. Then, the laminate including the 7 μm-thick PVA layer was subjected to elevated temperature in-air stretching at a stretching temperature of 130° C. based on an end-free uniaxial stretching process to attain a stretching ratio of 4.0 to thereby form a stretched laminate. Through the stretching, the PVA layer included in the stretched laminate was changed to a 3.5 μm-thick PVA layer having oriented PVA molecules.

Then, the stretched laminate was subjected to dyeing to form a dyed laminate in which iodine is absorbed in the 3.5 μm-thick PVA layer having the oriented PVA molecules. Specifically, the dyed laminate was obtained by immersing the stretched laminate in a dyeing solution having a temperature of 30° C. and containing iodine and potassium iodide, for an arbitrary time, to cause iodine to be absorbed in the PVA layer included in the stretched laminate, so as to allow the PVA layer for making up a target polarizing film to have a single layer transmittance of 40 to 44%. Various dyed laminates different in single layer transmittance and polarization rate were formed by adjusting an amount of iodine to be absorbed in the PVA layer having the oriented PVA molecules, in the above manner.

Further, the dyed laminated was subjected to cross-linking. Specifically, the dyed laminated was cross-linked in such a manner that it is immersed in a boric acid cross-linking solution containing 3 weight parts of boric acid with respect to 100 weight pars of water and 3 weight parts of potassium iodide with respect to 100 weight pars of water and having a temperature of 40° C., for 60 seconds. The cross-linked dyed laminate in the comparative example 1 corresponds to the optical film laminate in the Example 4. Thus, a cleaning step, a drying step and a lamination and/or transfer step in the comparative example 1 are the same as those in the Example 4.

Comparative Example 2

In the comparative example 2, under the same conditions as those in the comparative example 1, the stretched laminate in the comparative example 1 was stretched to allow the stretching ratio to become 4.5, 5.0 and 6.0. The following comparative table illustrates phenomena occurring in a 200 μm-thick non-crystallizable PET substrate and a PVA layer formed on the non-crystallizable PET substrate, including the comparative examples 1 and 2. Based on the data, it was verified that the stretching ratio during the elevated temperature in-air stretching at a stretching temperature of 130° C. has an upper limit of 4.0.

TABLE 1

(COMPARATIVE TABLE)

| Stretching | | Stretched film | |
|---|---|---|---|
| Temperature 130° C. | Stretching Ratio | Non-crystallizable PET substrate (isophthalic acid-copolymerized PET) | Laminate of PVA type resin layer and non-crystallizable PET substrate |
| Comparative Process 1 | 4.0 | ○ Uniformly stretched without breakage | ○ Uniformly stretched without breakage |
| Comparative process 2 | 4.5 | Δ No breakage but occurrence of non-uniform stretching | x Breakage of laminate of PVA type resin layer and non-crystallizable PET substrate |
|  | 5.0 | Δ No breakage but occurrence of non-uniform stretching | Untested |
|  | 6.0 | x Breakage | Untested |

Comparative Example 3

In the comparative example 3, under the same conditions as those in the comparative example 1, a PVA aqueous solution was applied on a 200 μm-thick PET substrate and dried to form a laminate including a 7 μm-thick PVA layer formed on the PET substrate. Then, the laminate was immersed in a dyeing solution containing iodine and potassium iodide and having a temperature of 30° C. to form a dyed laminate including a PVA layer having iodine absorbed therein. Specifically, the dyed laminate is formed by immersing the laminate in a dyeing solution containing 0.30 wt % of iodine and 2.1 wt % of potassium iodide at a solution temperature of 30° C., for an arbitrary time, to allow the PVA layer making up a target polarizing film to have a single layer transmittance of 40 to 44%. Then, the dyed laminate including the PVA layer having the absorbed iodine was subjected to in-boric-acid-solution stretching at a stretching temperature of 60° C. based on an end-free uniaxial stretching process to attain a stretching ratio of 5.0. In this manner, various optical film laminates each including a 3 μm-thick PVA layer integrally stretched with the PET resin substrate were formed.

Comparative Example 4

A 75 μm-thick polyvinyl alcohol type resin film (trade name "POVAL FILM VF-PSN 7500" produced by Kuraray Co., Ltd.) was immersed in water at 30° C. to cause wetly swelling, and further uniaxially stretched in the water (stretching ratio: 3.5). Then, the stretched film was dyed in an iodine solution having an iodine concentration of 0.1 weight % (weight ratio of iodine to potassium iodide=1/8) at 30° C., for an arbitrary time. Then, the film was immersed in a boric acid aqueous solution (an boric acid concentration of 3 weight parts, and a potassium iodide concentration of 3 weight parts, with respect to 100 weight parts of water) at 30° C., for 45 seconds, and then stretched to attain a total stretching ratio of 6.0, while being immersed in a boric acid aqueous solution (an boric acid concentration of 4 weight parts, and a potassium iodide concentration of 5 weight parts, with respect to 100 weight parts of water) at 60° C. Then, the film was immersed in a potassium iodide aqueous solution (a potassium iodide concentration of 4 weight parts with respect to 100 weight parts of water) at 30° C., for 10 seconds. After the stretching, the film was dried in an oven at 60° C., for 3 minutes to obtain a polarizing film having a thickness of 30 µm.

(Reference Sample 1)

In the reference sample 1, a continuous web of crystallizable polyethylene terephthalate (hereinafter referred to as "crystallizable PET") was used as a resin substrate, and a PVA aqueous solution was applied on a 200 µm-thick crystallizable PET substrate and dried to form a laminate including a 7 µm-thick PVA layer formed on the crystallizable PET substrate. A glass transition temperature of the crystallizable PET is 80° C. Then, the formed laminate was subjected to elevated temperature in-air stretching at a stretching temperature of 110° C. based on an end-free uniaxial stretching process to attain a stretching ratio of 4.0 to thereby form a stretched laminate. Through the stretching, the PVA layer included in the stretched laminate was changed into a 3.3 µm-thick PVA layer having oriented PVA molecules. In the reference sample 1, the laminate could not be stretched at a stretching ratio of 4.0 or more in the elevated temperature in-air stretching at a stretching temperature of 110° C.

In a subsequent dyeing step, the stretched laminate was formed as a dyed laminate in which iodine is absorbed in the 3.3 µm-thick PVA layer having oriented PVA molecules. Specifically, the dyed laminate was formed by immersing the stretched laminate in a dyeing solution containing iodine and potassium iodide and having a temperature of 30° C., for an arbitrary time to cause iodine to be absorbed in the PVA layer included in the stretched laminate, so as to allow the PVA layer making up a target polarizing film to have a single layer transmittance of 40 to 44%. An amount of iodine to be absorbed in the PVA layer having oriented PVA molecules was adjusted to produce various dyed laminates different in single layer transmittance and polarization rate. Then, the formed dyed laminate was subjected to cross-linking. Specifically, the dyed laminate was cross-linked by immersing it in a cross-linking boric acid aqueous solution containing 3 weight parts of boric acid with respect to 100 weight parts of water and 3 weight parts of potassium iodide with respect to 100 weight parts of water, at a solution temperature of 40° C. for 60 seconds. The cross-linked dyed laminate in the comparative example 1 corresponds to the optical film laminate in the Example 4. Thus, cleaning, drying and lamination and/or transfer steps in the comparative example 1 are the same as those in the Example 4.

(Reference Sample 2)

In the reference sample 2, a crystallizable PET was used as a resin substrate, and a laminate including a 7 µm-thick PVA layer formed on the crystallizable PET substrate was formed in the same manner as that in the reference sample 1. Then, the formed laminate was subjected to elevated temperature in-air stretching at a stretching temperature of 100° C. based on an end-free uniaxial stretching process to attain a stretching ratio of 4.5 to thereby form a stretched laminate. Through the stretching, the PVA layer included in the stretched laminate was changed into a 3.3 µm-thick PVA layer having oriented PVA molecules. In the reference sample 2, the laminate could not be stretched at a stretching ratio of 4.5 or more in the elevated temperature in-air stretching at a stretching temperature of 100° C.

Then, a dyed laminate was formed from the stretched laminate. The dyed laminate was formed by immersing the stretched laminate in a dyeing solution containing iodine and potassium iodide and having a temperature of 30° C., for an arbitrary time to cause iodine to be absorbed in the PVA layer included in the stretched laminate, so as to allow the PVA layer making up a target polarizing film to have a single layer transmittance of 40 to 44%. In the reference sample 2, an amount of iodine to be absorbed in the PVA layer having oriented PVA molecules was adjusted to produce various dyed laminates different in single layer transmittance and polarization rate, as with the reference sample 1.

(Reference Sample 3)

In the reference sample 3, a crystallizable PET was used as a resin substrate, and a laminate including a 7 µm-thick PVA layer formed on the crystallizable PET substrate was formed in the same manner as that in the reference sample 1 or 2. Then, the formed laminate was immersed in a dyeing solution containing iodine and potassium iodide and having a temperature of 30° C., for an arbitrary time to cause iodine to be absorbed in the PVA layer included in the laminate, so as to allow the PVA layer making up a target polarizing film to have a single layer transmittance of 40 to 44%, to form various dyed laminates each including the PVA layer having iodine absorbed therein. Subsequently, the formed dyed laminate was subjected to elevated temperature in-air stretching at a stretching temperature of 90° C. based on an end-free uniaxial stretching process to attain a stretching ratio of 4.5 to thereby form a stretched laminate. Through the stretching, the PVA layer included in the stretched laminate was changed into a 3.3 µm-thick PVA layer having oriented PVA molecules. In the reference sample 3, the laminate could not be stretched at a stretching ratio of 4.5 or more in the elevated temperature in-air stretching at a stretching temperature of 90° C.

Respective optical characteristics of polarizing films obtained in the Examples 1 to 18, the comparative examples 1 to 4 and the reference samples 1 to 3 are illustrated in FIGS. 7, 13 to 17 and 26. It is understood that respective curves for the Examples, the comparative examples and the reference samples are illustrated for the purpose of reference, and actually prepared polarizing films correspond to only the plotted marks.

A specific one of the polarizing films obtained in each of the Examples 4, 8, 12 and 19 to 25 and the comparative examples 1 and 4 was selected, and the selected polarizing films were variously evaluated as follows. FIG. 30 illustrates optical characteristics of the polarizing films subjected to the evaluations, and Table 2 illustrates various characteristics including the optical characteristics and an evaluation result, wherein the number of each of the Examples, the comparative examples or the reference samples is assigned to a corresponding one of the polarizing films, together with a sub-number (sequential number in the same process).

TABLE 2

| Example No. | Stretching Target | Conditions for Preliminary Stretching | Conditions for In-Solution Stretching | Conditions for In-Air Stretching | Total Stretching Ratio | Thickness of Polarizing Film (μm) | Single Layer Transmittance (%) | Polarization Rate (—) | Reflectance (%) | White Luminance of Display | Warp (mm) | Color Heterogeneity |
|---|---|---|---|---|---|---|---|---|---|---|---|---|
| Example 4-1 | Laminate of PVA and Substrate | 130° C. 1.8 | 75° C. 3.3 | — | 5.94 | 3 | 43.5 | 99.97 | 1.5 | 99 | ○ 0.3 | ○ |
| Example 8-1 | Laminate of PVA and Substrate | 130° C. 1.5 | 75° C. 4.0 | — | 6 | 3 | 43 | 99.97 | 1.5 | 98 | ○ 0.3 | ○ |
| Example 12-1 | Laminate of PVA and Substrate | 150° C. 1.8 | 75° C. 3.3 | — | 5.94 | 3 | 44 | 99.9 | 1.5 | 100 | ○ 0.3 | ○ |
| Example 19-1 | Laminate of PVA and Substrate | 130° C. 2.0 | 75° C. 3.0 | — | 6 | 3.5 | 44.5 | 99.5 | 1.6 | 101 | ○ 0.3 | ○ |
| Example 19-2 | Laminate of PVA and Substrate | 130° C. 2.0 | 75° C. 3.0 | — | 6 | 3.5 | 43 | 99.99 | 1.4 | 98 | ○ 0.3 | ○ |
| Example 19-3 | Laminate of PVA and Substrate | 130° C. 2.0 | 75° C. 3.0 | — | 6 | 3.5 | 42.5 | 99.994 | 1.3 | 97 | ○ 0.3 | ○ |
| Example 20-1 | Laminate of PVA and Substrate | 130° C. 2.0 | 75° C. 3.0 | — | 6 | 2.5 | 43 | 99.99 | 1.4 | 98 | ○ 0.2 | ○ |
| Example 21-1 | Laminate of PVA and Substrate | 130° C. 2.0 | 75° C. 3.0 | — | 6 | 6 | 43 | 99.99 | 1.4 | 98 | ○ 0.4 | ○ |
| Example 22-1 | Laminate of PVA and Substrate | 130° C. 2.0 | 75° C. 3.0 | — | 6 | 10 | 43 | 99.99 | 1.4 | 98 | ○ 0.5 | ○ |
| Example 23-1 | Laminate of PVA and Substrate | 130° C. 2.0 | 75° C. 3.25 | — | 6.5 | 3.5 | 43.7 | 99.97 | 1.5 | 100 | ○ 0.3 | ○ |
| Example 24-1 | Laminate of PVA and Substrate | 110° C. 2.0 | 75° C. 2.5 | — | 5 | 3.5 | 43 | 99.5 | 1.6 | 98 | ○ 0.3 | ○ |
| Example 25-1 | Laminate of PVA and Substrate | 95° C. 2.0 | 75° C. 2.5 | — | 5 | 3.5 | 42.5 | 99.5 | 1.6 | 97 | ○ 0.3 | ○ |
| Comparative Example 1-1 | Laminate of PVA and Substrate | — | — | 130° C. 4.0 | 4 | 3.5 | 44 | 98 | 2.3 x | 100 | ○ 0.3 | ○ |
| Comparative Example 1-2 | Laminate of PVA and Substrate | — | — | 130° C. 4.0 | 4 | 3.5 | 41.5 | 99.9 | 1.5 | 95 x | ○ 0.3 | ○ |
| Comparative Example 4-1 | PVA Single-Layer Film | — | 60° C. 6.0 | — | 6 | 30 | 43.8 | 99.9 | 1.5 | 100 | x 3.3 | x |

A common structure of circularly-polarizing plates subjected to the evaluations will be first described.

As for the polarizing film in the comparative example 4-1, an optically functional film laminate was prepared by laminating a TAC (triacetylcellulose-based) film (thickness: 40 μm) and a hard coat (HC)-treated TAC (triacetylcellulose-based) film (thickness: 45 μm) to respective ones of opposite surfaces of the polarizing film, through a bonding agent, in the same manner as that in the conventional polarizing film. The obtained optically functional film laminate was laminated to a ¼ wavelength phase difference film (trade name "Pureace WR (S-148)" produced by TEIJIN Chemicals Ltd.) to prepare a circularly-polarizing plate. More specifically, a circularly-polarizing plate was prepared by laminating the non-HC treated surface of the TAC film of the optically functional film laminate to the ¼ wavelength phase difference film through an acrylic adhesive (20 μm), in such a manner that a slow axis of the ¼ wavelength phase difference film is oriented at 45 degrees with respect to an absorption axis of the polarizing film.

Differently from the comparative example 4-1, as for the polarizing films in the Examples 1 to 25 and the comparative examples 1-1, 1-2, a TAC (triacetylcellulose-based) film (thickness: 40 μm) was joined to only one of opposite surfaces of the polarizing film. Specifically, the optical film laminate was prepared by laminating a hard coat (HC)-treated TAC (triacetylcellulose-based) film (thickness: 45 μm) to a surface of a PVA layer formed on a non-crystallizable PET substrate, through a bonding agent. Then, an optically functional film laminate was prepared by peeling the non-crystallizable PET substrate from the optical film laminate, and transferring the PVA layer to the 45 μm-thick HC-treated TAC (triacetylcellulose-based) film. The obtained optically functional film laminate was laminated to a ¼ wavelength phase difference film (trade name "Pureace WR (S-148)" produced by TEIJIN Chemicals Ltd.) to prepare a circularly-polarizing plate. More specifically, the circularly-polarizing plate was prepared by laminating a surface of the polarizing film of the optically functional film laminate to the ¼ wavelength phase difference film through an acrylic adhesive (20 μm), in such a manner that a slow axis of the ¼ wavelength phase difference film is oriented at 45 degrees with respect to an absorption axis of the polarizing film.

(Reflectance)

A surface of the ¼ wavelength phase difference film of each of the circularly-polarizing plates was laminated to an organic EL display panel of an organic EL display device (trade name "GALAXY S" produced by Samsung Electronics) through an acrylic adhesive (20 μm), and a reflectance was measured. A comparative evaluation was performed after subtracting a reflectance (4.5%) of a surface of the laminate from each of the measured reflectance values. The organic EL display panel was used for the evaluation after preliminarily peeling an anti-reflection film laminated to a surface thereof.

(White Luminance)

The surface of the ¼ wavelength phase difference film of each of the circularly-polarizing plates was laminated to an organic EL display panel of an organic EL display device (trade name "GALAXY S" produced by Samsung Electronics) through an acrylic adhesive (20 μm), and a while luminance was measured. The white luminance was measured using BM-5 produced by TOPCON Technohouse Co. A comparative evaluation was performed on an assumption that a white luminance in the comparative example 1 is 100. The organic EL display panel was used for the evaluation after preliminarily peeling an anti-reflection film laminated to a surface thereof.

(Warp)

The surface of the ¼ wavelength phase difference film of each of the circularly-polarizing plates was laminated to one surface of a glass plate having a size of 255 mm×150 mm (thickness: 0.7 mm) through an acrylic adhesive (20 μm) to cover a surface area of 250 mm×150 mm, and placed in a constant-temperature oven at 80° C. for a holding time of 96 hours (subjected to a heating test). Then, warp amounts at four corners were measured, and an average of the measurement values was calculated.

(Variation in Chromaticity and Color Heterogeneity Due to Heating)

Figure 31A:
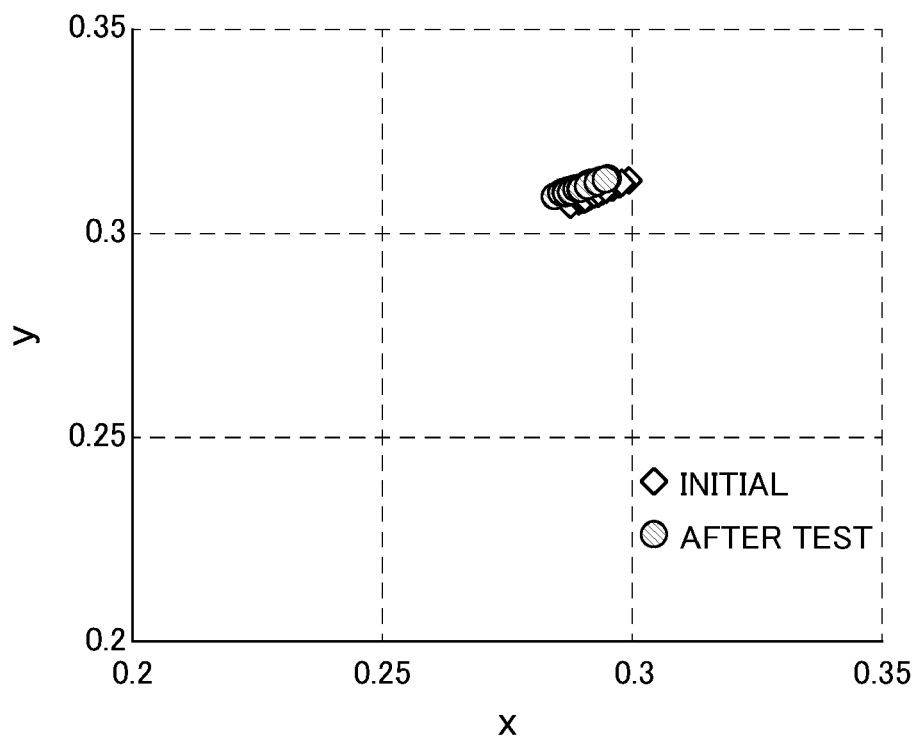
FIG. 31a is a chromaticity diagram illustrating a variation in chromaticity due to heating of an organic EL display device using a polarizing plate in each Example.
Figure 31B:
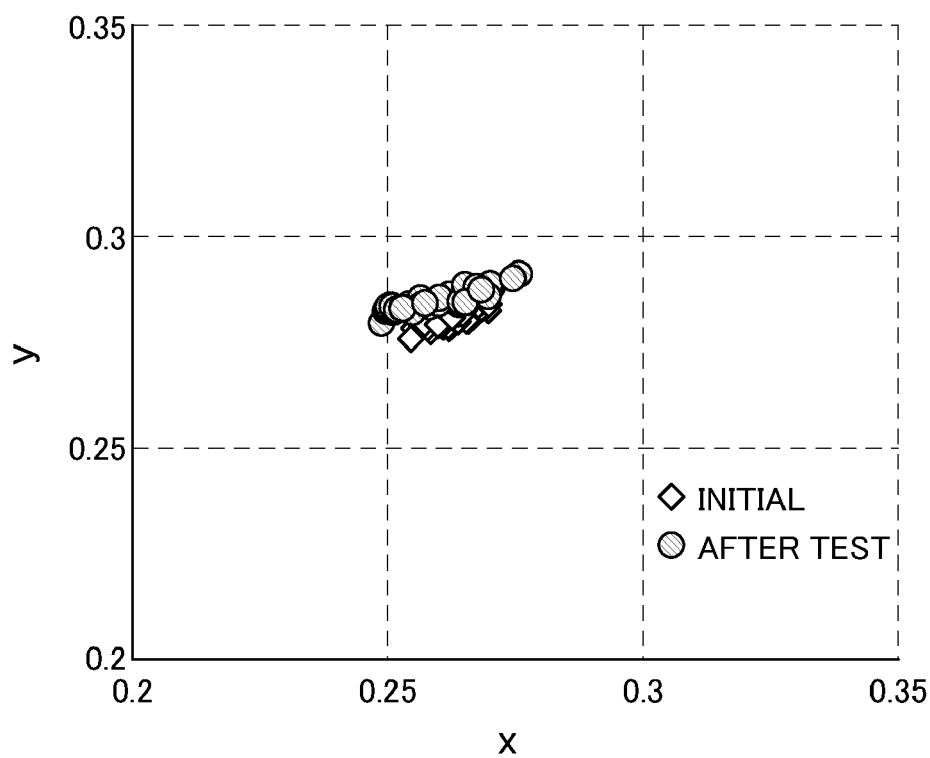
FIG. 31b is a chromaticity diagram illustrating a variation in chromaticity due to heating of an organic EL display device using a polarizing plate in a comparative example.
Figure 32A:
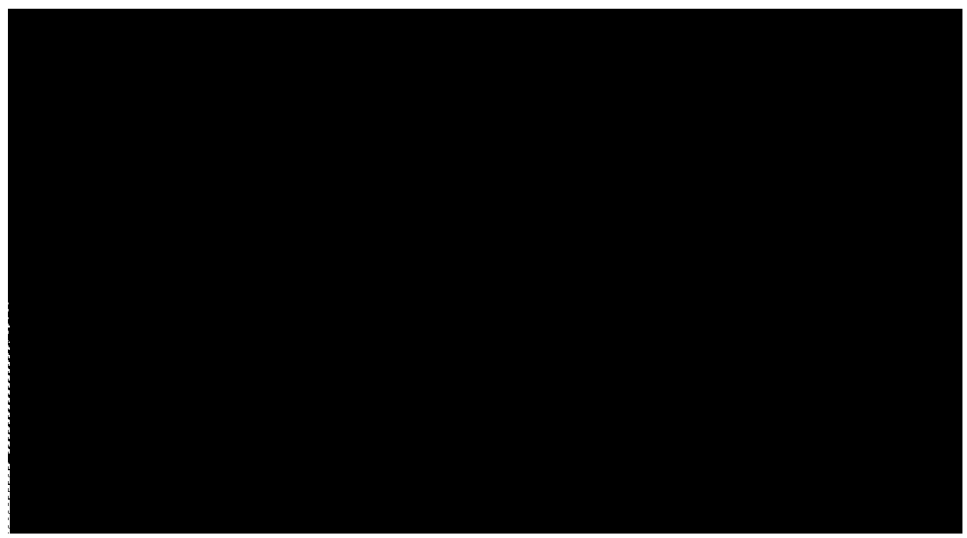
FIG. 32a is a photograph representing color heterogeneity according to heating of an organic EL display device using a polarizing plate in each Example.
Figure 32B:
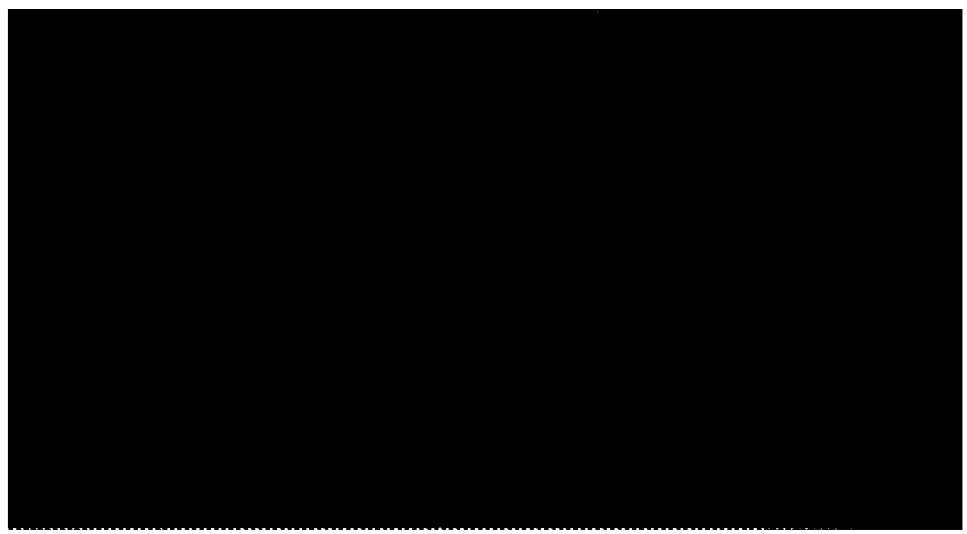
FIG. 32b is a photograph representing color heterogeneity according to heating of an organic EL display device using a polarizing plate in a comparative example.

Each of the circularly-polarizing plates was laminated to a viewing side of an organic EL display panel (trade name "15EL9500" produced by LG Display) through an acrylic adhesive (20 μm) to prepare an organic EL display device. Chromaticities (reflection colors) at 45 points on a surface of a display screen of the obtained organic EL display device were measured using a spectrophotometric colorimeter (trade name "CM-2600d" produced by Konica Minolta Sensing, Inc.). The measurement point was set at each center of 45 areas defined by dividing the display screen equally vertically and horizontally into 5×9 pieces. The organic EL display panel was used for the evaluation after preliminarily peeling an anti-reflection film laminated to a surface thereof. Additionally, after the organic EL display panel was placed in a constant-temperature oven at 85° C. for a holding time of 40 hours, chromaticities at the 45 points on the display screen were measured in the same manner. Further, homogeneity of reflection color on the entire display screen was visually evaluated. Based on an x, y chromaticity diagram and a photograph, FIGS. 31a and 32a illustrate an evaluation result on the Example 19-2, and FIGS. 31b and 32b illustrate an evaluation result on the comparative example 4-1. On each of the x, y chromaticity diagrams illustrated in FIGS. 31a and 31b, the chromaticities at the 45 points on the display screen are plotted as chromaticity coordinate (x, y). In these diagrams, a larger change between the plots indicates a larger variation in chromaticity within the display screen, which is undesirable as a display device.

As illustrated in Table 2, the polarizing film in the comparative example 1-1 where the polarization rate is less than 99.5, causes excessively large reflectance, which shows that this polarizing film is unsuitable for use in an anti-reflection circularly-polarizing plate of an organic EL display device. On the other hand, the polarizing film in each of the Examples where the polarization rate is 99.5 or more, allows the reflectance to be reduced to a sufficiently small value, which shows that this polarizing film has excellent characteristics for use in an anti-internal reflection circularly-polarizing plate of an organic EL display device.

Further, as illustrated in Table 2, the polarizing film in the comparative example 1-2 where the single layer transmittance is less than 42.5, causes excessively low the white luminance, which shows that this polarizing film is unsuitable for use in an anti-reflection circularly-polarizing plate of an organic EL display device. On the other hand, the polarizing film in each of the Examples where the single layer transmittance is 42.5 or more, achieves sufficient white luminance, which shows that this polarizing film has excellent characteristics for use in an anti-reflection circularly-polarizing plate of an organic EL display device.

As illustrated in Table 2, the polarizing film in the comparative example 4-1 where a thickness thereof is large, and a protective layer is joined to each of the opposite surface thereof, causes a large warp, which shows that this polarizing film is unsuitable for use in an anti-reflection circularly-polarizing plate of an organic EL display device. On the other hand, the polarizing film in each of the Examples where a thickness thereof is 10 μm or less, and a protective layer is joined to only one of the opposite surface thereof, allows the warp to be reduced to a sufficiently small value, which shows that this polarizing film has excellent characteristics for use in an anti-internal reflection circularly-polarizing plate of an organic EL display device.

As illustrated in FIG. 31b, in the heating test, the polarizing film in the comparative example 4-1 causes a large variation in chromaticity within the display screen from a neutral color having a chromaticity coordinate (x, y)=(0.3, 0.3) to a blue color having small coordinate values. On the other hand, as illustrated in FIG. 31a, the polarizing film in the Example 19-2 allows a change between the plots of the chromaticity coordinate (x, y), i.e., a variation in chromaticity within the display screen, to be maintained at a sufficiently small value even after the heating test. The same result was obtained in the remaining Examples. Further, as illustrated in FIG. 32b, the polarizing film in the comparative example 4-1 causes heterogeneity in reflection color within the display screen due to heating, whereas the polarizing film in the Example 19-2 allows heterogeneity in reflection color within the display screen to be maintained even after heating. The same result was obtained in the remaining Examples. From the above results, it has been verified that the polarizing film in each of the Examples where a thickness thereof is 10 μm or less, and a protective layer is joined to only one of the opposite surface thereof, has excellent characteristics for use in an anti-internal reflection circularly-polarizing plate of an organic EL display device.

[Technical Background of Stretching]

Figure 18:
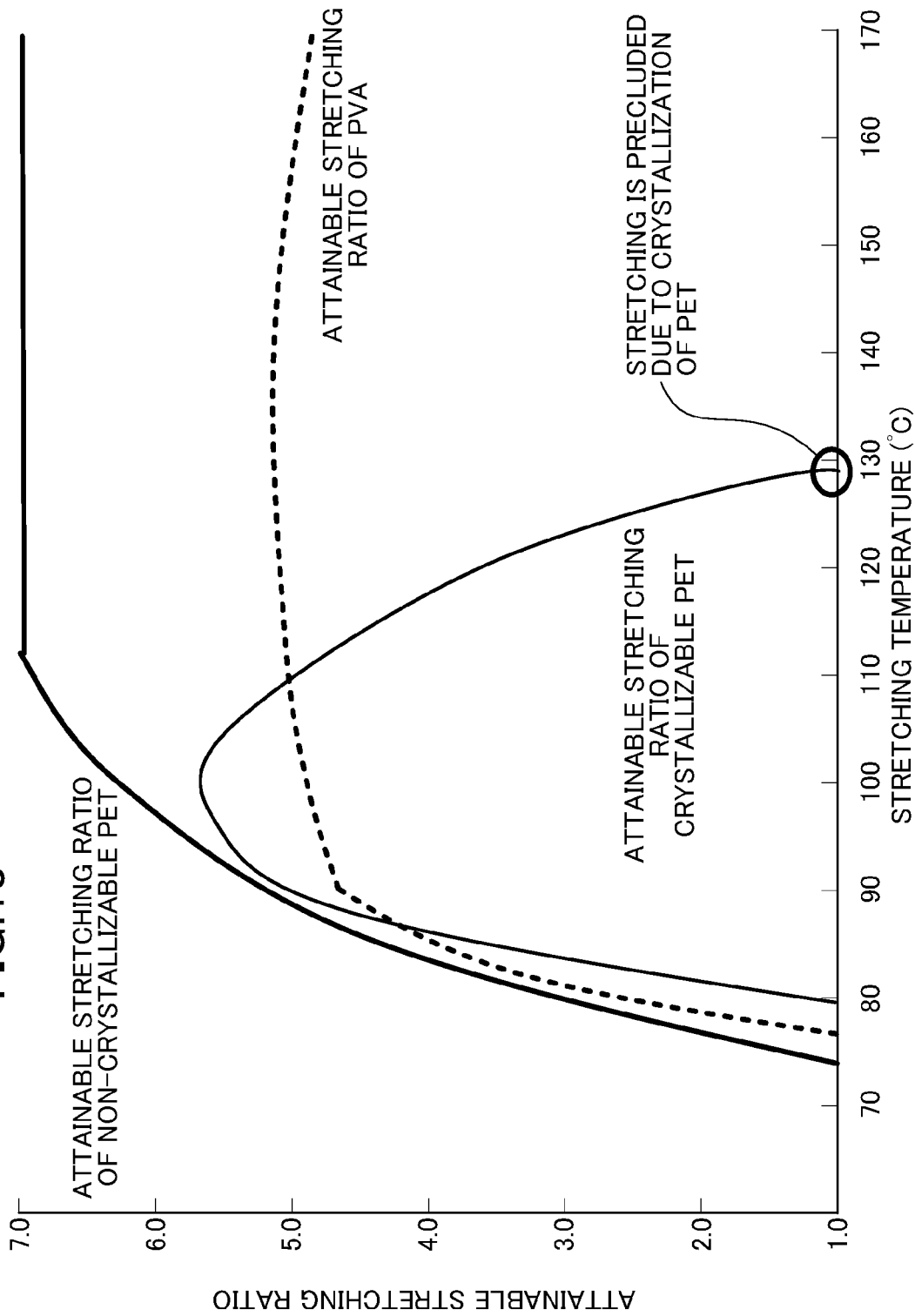
FIG. 18 is a graph illustrating a relative relationship between a stretching temperature and an attainable stretching ratio in each of crystallizable PET, non-crystallizable PET and PVA type resin.

FIGS. 18 to 22 were prepared based on experimental tests. Referring to FIG. 18, FIG. 18 is a graph illustrating a relative relationship between a stretching temperature and an attainable stretching ratio in each of a crystallizable PET, a non-crystallizable PET and a PVA type resin, based on experimental tests.

In FIG. 18, the thick solid line indicates a change in attainable stretching ratio in a non-crystallizable PET along with a change in stretching temperature. The non-crystallizable PET has a glass transition temperature Tg of about 75° C., and cannot be stretched at a temperature below this glass transition temperature Tg. As is evident from FIG. 18, an end-free uniaxial stretching process to be performed in air under elevated temperature (elevated temperature in-air end-free uniaxial stretching) is capable of achieving a stretching ratio of 7.0 or more at a stretching temperature of about 110° C. or more. On the other hand, the thin solid line in FIG. 18 indicates a change in attainable stretching ratio in a crystallizable PET along with a change in stretching temperature. The crystallizable PET has a glass transition temperature Tg of about 80° C., and cannot be stretched at a temperature below this glass transition temperature Tg.

Figure 19:
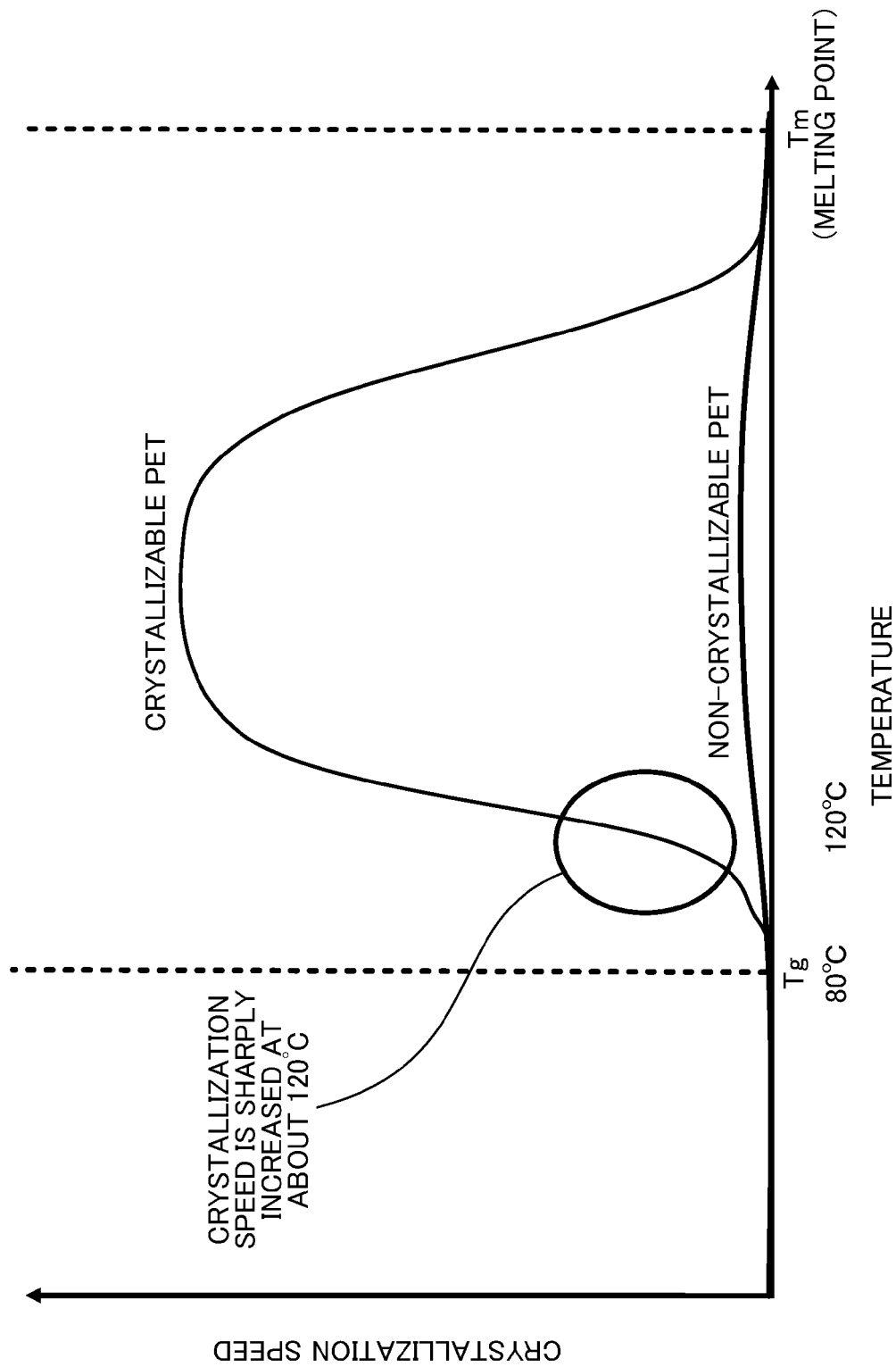
FIG. 19 is a graph illustrating a change in crystallization speed along with a change in temperature between a glass transition temperature Tg and a melting point Tm in each of the crystallizable PET and the non-crystallizable PET.

FIG. 19 illustrates a change in crystallization speed in each of the crystallizable PET and the non-crystallizable PET along with a change in temperature between a glass transition temperature Tg and a melting point Tm of polyethylene terephthalate (PET). FIG. 19 shows that the crystallizable PET in an amorphous state at a temperature of about 80 to 110° C. is rapidly crystallized at about 120° C.

As is clear from FIG. 18, in the crystallizable PET, an attainable stretching ratio during the elevated temperature in-air end-free uniaxial stretching has an upper limit of 4.5 to 5.5. In addition, an applicable stretching temperature is extremely limited, specifically, in the range of about 90° C. to about 110° C.

FIG. 29 illustrates an example where the elevated temperature in-air end-free uniaxial stretching is performed using a crystallizable PET, as reference samples 1 to 3. In each of the reference samples, a 3.3 μm-thick polarizing film was produced by forming a 7 μm-thick PVA layer on a 200 μm-thick crystallizable PET substrate to form a laminate, and stretching the laminate in air under elevated temperature. There is a difference between stretching temperatures of the reference samples. Specifically, the stretching temperatures are 110° C. in the reference sample 1, 100° C. in the reference sample 2 and 90° C. in the reference sample 3. A noteworthy parameter is an attainable stretching ratio. An upper limit of the attainable stretching ratio in the reference sample 1 is 4.0, and an upper limit of the attainable stretching ratio in each of the reference samples 2 and 3 is 4.5. It was impossible to perform stretching beyond the attainable stretching ratios, because laminates themselves in the reference samples 1 to 3 were finally broken. However, a possibility cannot be denied that the attainable stretching ratio of the PVA type resin layer itself formed on the crystallizable PET has an impact on the above result.

Referring to FIG. 18, the dotted line therein indicates an attainable stretching ratio of PVA belonging to a PVA type resin. A glass transition temperature Tg of the PVA type resin is in the range of 75 to 80° C., and a single layer body made of the PVA type resin cannot be stretched at a temperature below the glass transition temperature Tg. As is clear from FIG. 18, the attainable stretching ratio of the single layer body of the PVA type resin during the elevated temperature in-air end-free uniaxial stretching is limited to up to 5.0. Thus, the inventors have been able to clarify that, from the relationship between the stretching temperature and the attainable stretching ratio of each of a crystallizable PET and a PVA type resin, an attainable stretching ratio of a laminate comprising a crystallizable PET substrate and a PVA type resin layer formed on the substrate, during the elevated temperature in-air end-free uniaxial stretching, is limited to up to the range of 4.0 to 5.0 at a stretching temperature ranging from 90 to 110° C.

An example in which a laminate prepared by coating a PVA type resin layer on a non-crystallizable PET substrate is subjected to end-free uniaxial stretching in air under elevated temperature is shown as comparative examples 1 and 2 in the following Table 1. In the non-crystallizable PET substrate, there is no constraint of stretching temperature. In the comparative example 1, a polarizing film was produced by forming a 7 μm-thick PVA type resin layer on a 200 μm-thick non-crystallizable PET substrate to form a laminate, and subjecting the laminate to the elevated temperature in-air end-free uniaxial stretching at a stretching temperature of 130° C. A stretching ratio in the comparative example 1 was 4.0.

Referring to Table 1, in the comparative example 2, as with the comparative example 1, polarizing films were prepared by forming a 7 μm-thick PVA type resin layer on a 200 μm-thick non-crystallizable PET substrate to form a laminate, and stretching the laminate to allow the stretching ratio to become 4.5, 5.0 and 6.0. As illustrated in Table 1, in each of the polarizing films, non-uniform stretching or breaking occurs in a film surface of the non-crystalline PET substrate, and breaking of the PVA type resin layer occurs at a stretching ratio of 4.5. Based on the data, it was verified that the stretching ratio of the PVA type resin layer during the elevated temperature in-air end-free uniaxial stretching at a stretching temperature of 130° C. is limited to up to 4.0.

In each of the reference samples 1 to 3, although there is a difference in stretching temperature, a dyed laminate was produced by: forming a PVA type resin layer on a crystallizable PET substrate to form a laminate; subjecting the laminate to stretching at a stretching ratio of 4.0 to 4.5 to allow PVA molecules to be oriented; and causing iodine to be absorbed in the thinned PVA type resin layer. Specifically, the stretched laminate was immersed in a dyeing solution containing iodine and potassium iodide and having a temperature of 30° C., for an arbitrary time, to cause iodine to be absorbed in the PVA type resin layer included in the stretched laminate, so as to allow the PVA type resin layer making up a target polarizing film to have a single layer transmittance of 40 to 44%. In addition, an amount of iodine to be absorbed in the thinned PVA type resin layer was adjusted to produce various polarizing films different in single layer transmittance T and polarization rate P.

Figure 26:
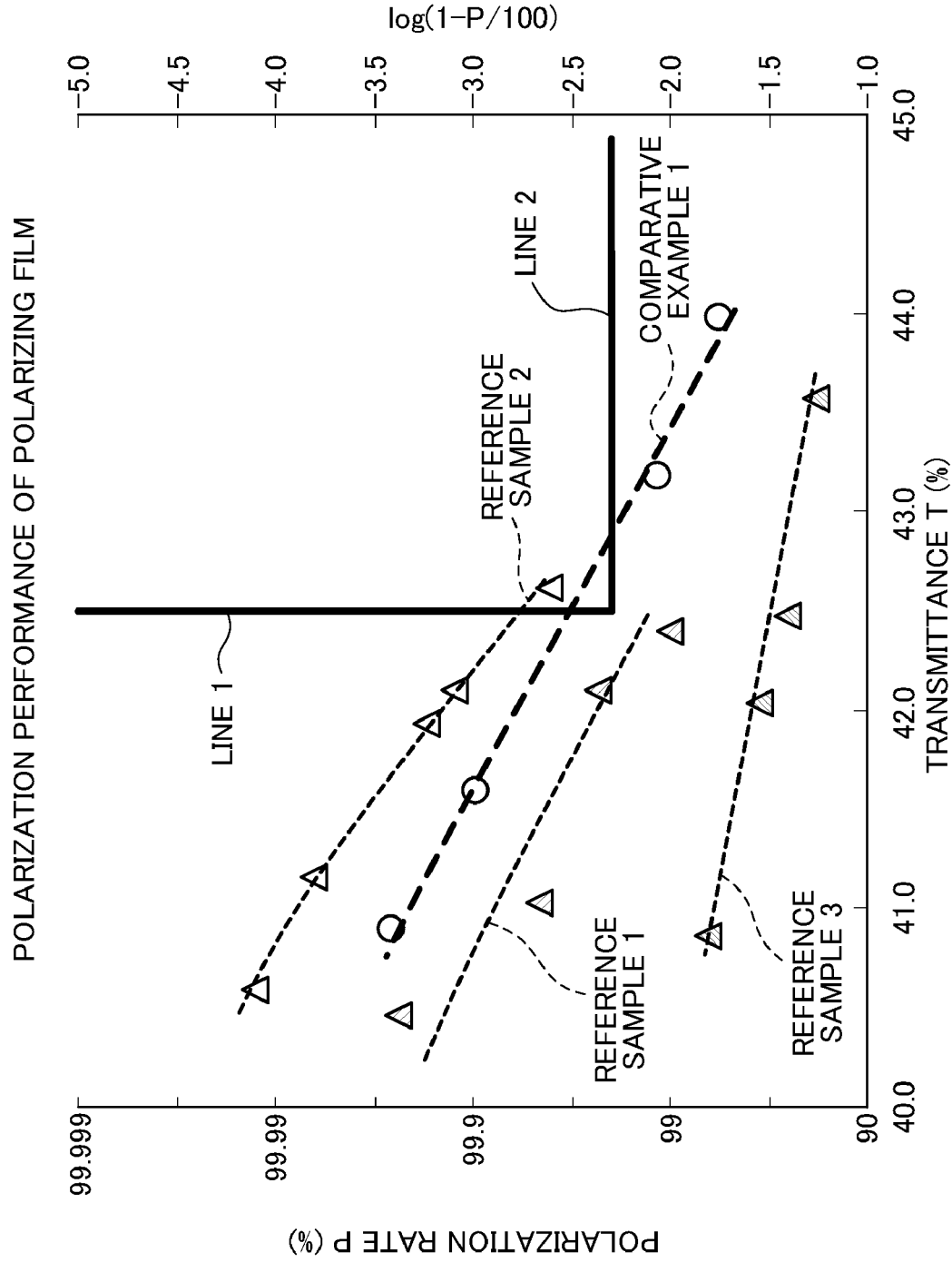
FIG. 26 is a graph illustrating polarization performance of an example of a polarizing film which is not included in the scope of the present invention.

Referring to FIG. 26, each of the polarizing films in the reference samples 1 to 3 has poor optical characteristics. The reason is because it is assumed that, although PVA molecules in the PVA type resin layer formed on the crystallizable PET substrate are oriented to a certain degree by the elevated temperature in-air stretching, the elevated temperature in-air stretching facilitates crystallization of the PVA molecules to hinder orientation of a non-crystalline portion of the molecules.

Therefore, prior to the present invention, the inventors have developed a polarizing film and a production method therefor disclosed in the international application PCT/JP 2010/001460. This is based on findings with a focus on a plasticizing function of water which allows a laminate comprising a PET substrate and a PVA type resin layer formed on the substrate to be stretched even at a stretching temperature below a glass transition temperature Tg thereof. An example of a polarizing film production process corresponding to this method is shown as a comparative example 3 herein. In accordance with this method, the laminate comprising the PET substrate and the PVA type resin layer formed on the substrate can be stretched at a stretching ratio of up to 5.0.

Through subsequent researches, the inventors have ascertained that the stretching ratio is limited to up to 5.0 because the PET substrate is made of crystallizable PET. Previously, it was recognized that a laminate comprising a PET substrate and a PVA type resin layer formed on the substrate is stretched in a boric acid aqueous solution at a temperature below a glass transition temperature Tg thereof, and therefore the stretching function is not largely affected by whether the PET substrate is crystallizable or non-crystallizable. However, it was found that, in cases where the PET substrate is made of non-crystallizable PET, the laminate can be stretched at a stretching ratio of up to 5.5. It is assumed that, in a polarizing film production method equivalent to the comparative example 3, the stretching ratio is limited to up to 5.5, due to the non-crystallizable PET substrate which places a limit on the stretching ratio.

In the comparative example 1, various polarizing films different in single layer transmittance T and polarization rate P were prepared. Respective optical characteristics of the polarizing films are illustrated in FIG. 26 together with those in the reference samples 1 to 3. The comparative examples and the curbs in respect with each referential example are shown only for reference and it is apparent that actually produced polarization films are not only polarization films shown by the plots.

Figure 20:
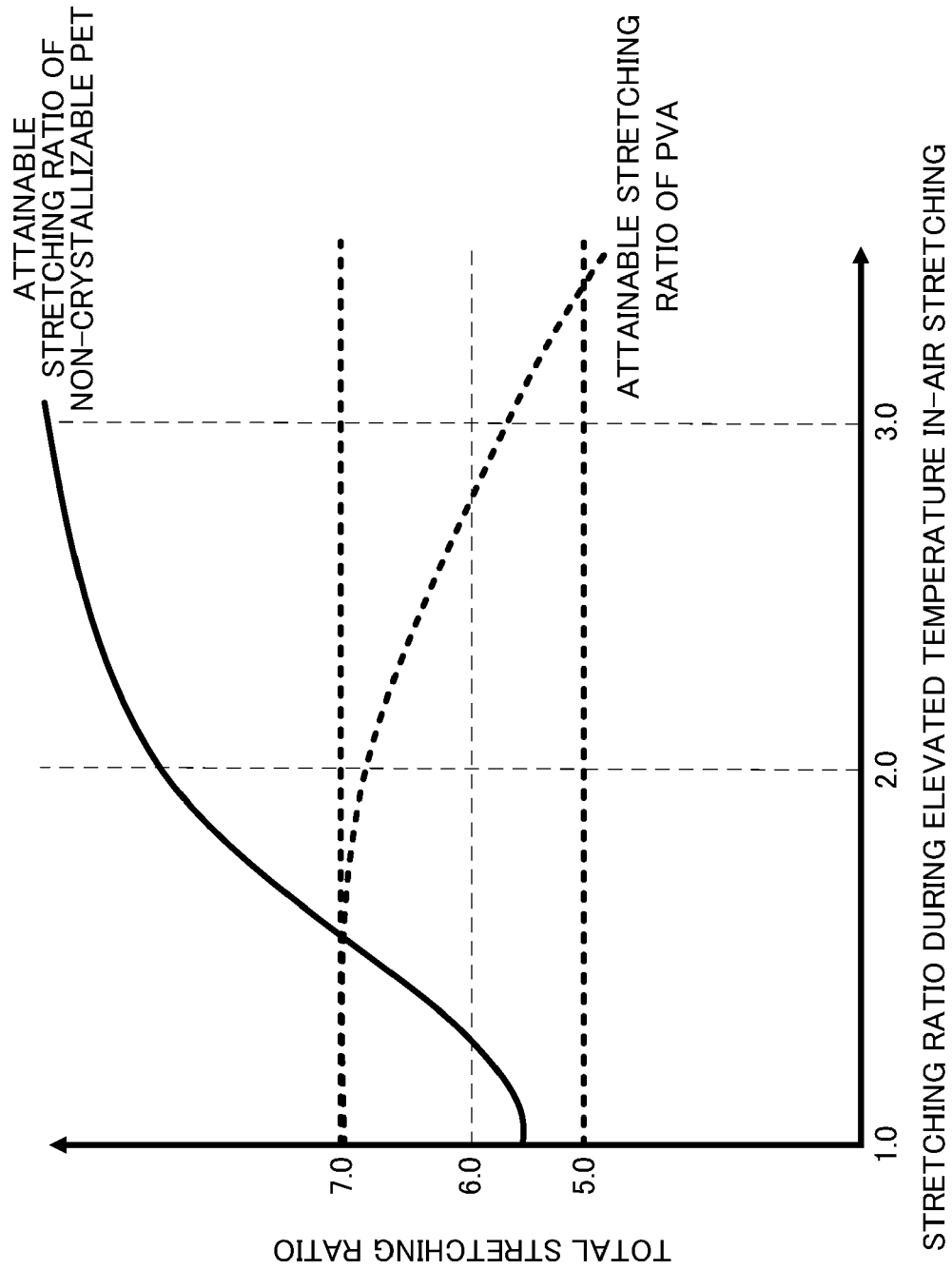
FIG. 20 is a graph illustrating a relationship between a stretching ratio during elevated temperature in-air stretching and a total stretching ratio, in the non-crystallizable PET and the PVA type resin.

FIG. 20 illustrates a relationship between a stretching ratio during the elevated temperature in-air stretching, and an overall or total stretching ratio (hereinafter referred to as "total stretching ratio") in 2-stage stretching, which has been conceived based on the above inventors' research results, wherein the horizontal axis represents a stretching ratio during elevated temperature in-air stretching at a stretching temperature of 130° C. the based on an end-free uniaxial stretching process, and the vertical axis represents a total stretching ratio which indicates how many times an original length is finally stretched by a 2-stage stretching including elevated temperature in-air stretching based on a end-free uniaxial stretching process on an assumption that the original length, i.e., a length before the elevated temperature in-air stretching, is 1. For example, in cases where the stretching ratio during the elevated temperature in-air stretching at a stretching temperature of 130° C. is 2.0, and a stretching ratio during the second-stage stretching is 3.0, the total stretching ratio will be 6.0 (2.0×3.0=6). The second-stage stretching after the elevated temperature in-air stretching is an end-free uniaxial stretching process to be performed within a boric acid aqueous solution at a stretching temperature of 65° C. (an operation of stretching an object while immersing it in a boric acid aqueous solution will hereinafter be referred to as "in-boric-acid-solution stretching"). The result illustrated in FIG. 20 can be obtained by combining the two stretching processes.

The solid line in FIG. 20 indicates an attainable stretching ratio of non-crystallizable PET. In cases where the in-boric-acid-solution stretching is directly performed without performing the elevated temperature in-air stretching, i.e., the stretching ratio during the elevated temperature in-air stretching is 1.0, the total stretching ratio of the non-crystallizable PET is limited to up to 5.5. If stretching is performed at a total stretching ratio of greater than this value, the non-crystallizable PET will be broken. However, this value corresponds to a minimum stretching ratio of the non-crystallizable PET. The total stretching ratio of the non-crystallizable PET becomes larger along with an increase in the attainable stretching ratio, and becomes greater than 10.0.

On the other hand, the dotted line in FIG. 20 indicates an attainable stretching ratio of a PVA type resin layer formed on the non-crystallizable PET. In cases where the in-boric-acid-solution stretching is directly performed without performing the elevated temperature in-air stretching, the total stretching ratio of the PVA type resin layer is 7.0, which is the maximum stretching ratio thereof. However, the total stretching ratio of the PVA type resin layer becomes smaller along with an increase in stretching ratio during the elevated temperature in-air stretching. At a point where the elevated temperature in-air stretching ratio is 3.0, the total stretching ratio of the PVA type resin layer becomes less than 6.0. If it is attempted to increase the total stretching ratio of the PVA type resin layer up to 6.0, the PVA type resin layer will be broken. As is also clear from FIG. 20, depending on a level of the stretching ratio during the elevated temperature in-air stretching, a factor causing a laminate comprising a non-crystallizable PET substrate and a PVA type resin layer formed on the substrate to become unable to be stretched is changed from the non-crystallizable PET substrate to the PVA type resin layer. For reference, the stretching ratio of PVA during the elevated temperature in-air stretching is up to 4.0, and the PVA cannot be stretched beyond this value. It is assumed that this stretching ratio corresponds to the total stretching ratio of the PVA.

Figure 21:
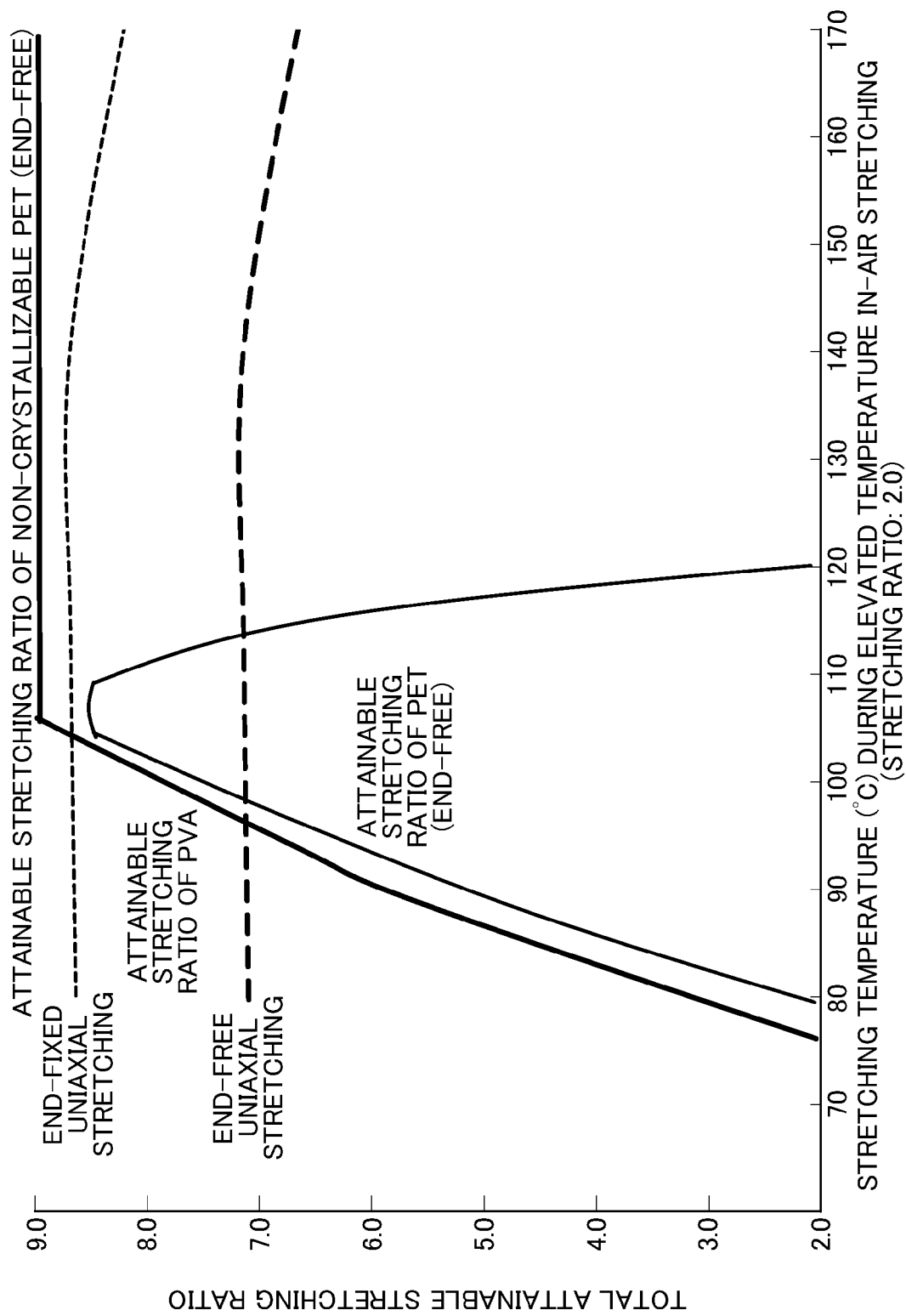
FIG. 21 is a graph illustrating a relative relationship between a stretching temperature during the elevated temperature in-air stretching and a total attainable stretching ratio, in each of the crystallizable PET, the non-crystallizable PET and the PVA type resin.

Referring now to FIG. 21, FIG. 21 is a graph indicating a relationship between a stretching temperature during the elevated temperature in-air stretching and a total attainable stretching ratio in the 2-stage stretching consisting of the elevated temperature in-air stretching and the in-boric-acid-solution stretching, in each of crystallizable PET, non-crystallizable PET and PVA type resin, wherein the graph is plotted based on experimental data. FIG. 18 illustrates characteristics of crystallizable PET, non-crystallizable PET and PVA type resin, wherein the horizontal axis represents a stretching temperature during the elevated temperature in-air stretching, and the vertical axis represents an attainable stretching ratio during the elevated temperature in-air stretching. FIG. 21 is different from FIG. 18 in that the horizontal axis represents a stretching temperature when the stretching ratio during the elevated temperature in-air stretching ratio is 2.0, and the vertical axis represents a total attainable stretching ratio during the elevated temperature in-air stretching and the in-boric-acid-solution stretching.

A polarizing film production method according to the present invention comprises a combination of 2-stage stretching steps consisting of elevated temperature in-air stretching and in-boric-acid-solution stretching, as will be described later. The combination of 2-stage stretching steps is not simply conceivable. Through various long-term researches, the inventers have finally reached a surprising conclusion that the following two technical problems can be simultaneously solved only by the combination. In an attempt to produce a polarizing film by forming a PVA type resin layer on a thermoplastic resin substrate to form a laminate, and subjecting the laminate to stretching and dyeing, there are two technical problems which have been considered to be insolvable.

The first technical problem is that the stretching ratio and the stretching temperature each having an impact on improvement in molecular orientation of a PVA type resin are largely restricted by a thermoplastic resin substrate having a PVA type resin layer formed thereon.

The second technical problem is that, for example, even if the problem on restrictions to the stretching ratio and the stretching temperature can be overcome, stretching of the PVA type resin is restricted by its crystallization because crystallization and stretchability of a crystallizable resin such as the PVA type resin and PET used for the thermoplastic resin substrate are conflicting physical properties.

The first technical problem will further be discussed as follows. A restriction in producing a polarizing film using a thermoplastic resin substrate is caused by the PVA type resin having characteristics that the stretching temperature is equal to or greater than a glass transition temperature Tg (about 75 to 80° C.) thereof and the stretching ratio is in the range of 4.5 to 5.0. If a crystallizable PET is used as a material for the thermoplastic resin substrate, the stretching temperature is further restricted to 90 to 110° C. It has been considered that a polarizing film produced by: forming a PVA type rein layer on a thermoplastic resin substrate to form a laminate; and subjecting the laminate to the elevated temperature in-air stretching to allow the PVA type rein layer included in the laminate to be thinned, cannot be free from the above restriction.

Therefore, with a focus on a plasticizing function of water, the inventors have proposed in-boric-acid-solution stretching capable of serving as an alternative to the elevated temperature in-air stretching. However, even in the in-boric-acid-solution stretching at a stretching temperature of 60 to 85° C., it has been difficult to overcome the restriction caused by the thermoplastic resin substrate, specifically, a restriction that a stretching ratio in a crystallizable PET is limited to up to 5.0, and a stretching ratio in a non-crystallizable PET is limited to up to 5.5. This places a restriction on improvement in orientation of PVA molecules, which leads to restriction to optical characteristics of the thinned polarizing film. This is the first technical problem.

Figure 22:
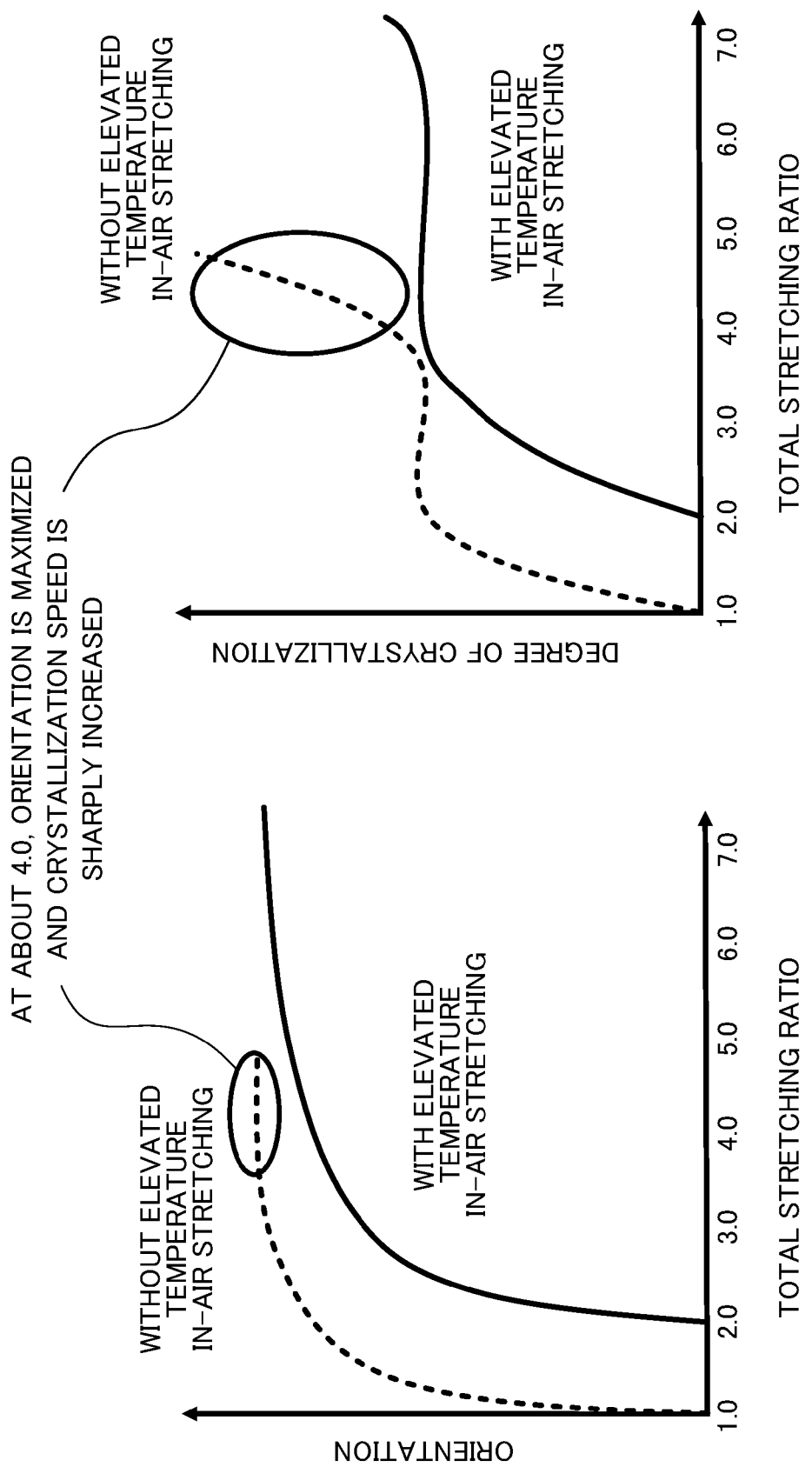
FIG. 22 is a graph illustrating a molecular orientation and a crystallization degree with respect to a total stretching ratio, in PET to be used as a thermoplastic resin substrate.

A solution to the first technical problem can be explained based on FIG. 22. FIG. 22 includes two related graphs: one illustrating a molecular orientation of PET used as the thermoplastic resin substrate: and the other illustrating a degree of crystallization of the PET, wherein the horizontal axis commonly represents a total stretching ratio during the elevated temperature in-air stretching and the in-boric-acid-solution stretching. Each of the dotted lines in FIG. 22 indicates the total stretching ratio during only the in-boric-acid-solution stretching. Regardless of whether crystallizable or non-crystallizable, the crystallization degree of the PET is sharply increased at a total stretching ratio of 4.0 to 5.0. Thus, even in cases where the in-boric-acid-solution stretching is employed, the stretching ratio is limited to up to 5.0 or 5.5. At this stretching ratio, the molecular orientation is maximized, and a stretching tension is sharply increased. This precludes stretching.

On the other hand, the solid lines in FIG. 22 illustrate a result of 2-stage stretching in which the elevated temperature in-air end-free uniaxial stretching is performed at a stretching temperature of 110° C. to attain a stretching ratio of 2.0, and then the in-boric-acid-solution stretching is performed at a stretching temperature of 65° C. Regardless of whether crystallizable or non-crystallizable, the crystallization degree of the PET is never sharply increased, differently from the cases where only the in-boric-acid-solution stretching is performed. This allows the total stretchable ratio to be increased up to 7.0. At this total stretchable ratio, the molecular orientation is maximized, and the stretching tension is sharply increased. As is clear from FIG. 21, this would result from employing the elevated temperature in-air end-free uniaxial stretching as the first-stage stretching. In contrast, if the elevated temperature in-air stretching is performed while constraining contraction in a direction perpendicular to a direction of the stretching, i.e., based on so-called "end-fixed uniaxial stretching process", as described later, the total attainable stretching ratio can be increased up to 8.5.

Figure 23:
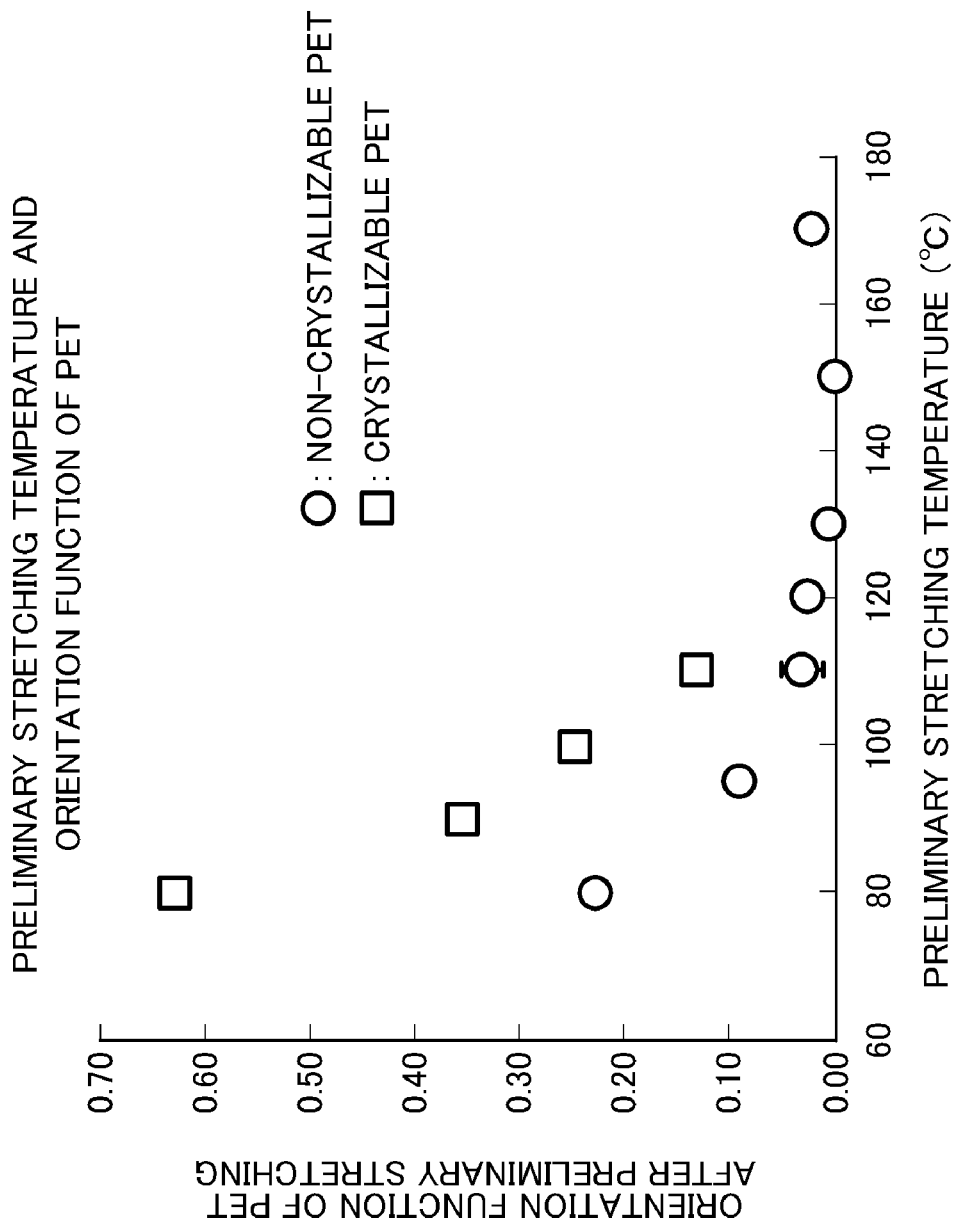
FIG. 23 is a graph illustrating a relationship between a preliminary stretching temperature during preliminary in-air stretching at a stretching ratio of 1.8, and an orientation function of PET after the preliminary in-air stretching.

The relationship between the molecular orientation and the crystallization degree of PET used as a material for the thermoplastic resin substrate, illustrated in FIG. 22, shows that crystallization of the PET can be suppressed, regardless of whether crystallizable or non-crystallizable, by performing a preliminary stretching based on the elevated temperature in-air stretching. However, referring to FIG. 23 which illustrates a relationship between a preliminary stretching temperature and a molecular orientation of PET, in cases where a crystallizable PET is used as a material for the thermoplastic resin substrate, the molecular orientation of the crystallizable PET after the preliminary stretching is 0.30 or more at 90° C., 0.20 or more at 100° C., and 0.10 or more even at 110° C. If the molecular orientation of the PET becomes equal to or greater than 0.10, a stretching tension in the second-stage stretching performed within a boric acid aqueous solution will be increased, and a load imposed on a stretching apparatus will be increased, which is undesirable in terms of production conditions. FIG. 23 shows that it is preferable to use, as a material for the thermoplastic resin substrate, a non-crystallizable PET, more preferably a non-crystallizable PET having an orientation function of 0.10 or less, particularly preferably a non-crystallizable PET having an orientation function of 0.05 or less.

FIG. 23 illustrates experimental data indicating a relationship between a stretching temperature during the elevated temperature in-air stretching at a stretching ratio of 1.8 and an orientation function of PET used as a material for the thermoplastic resin substrate. As is clear from FIG. 23, PET having an orientation function of 0.10 or less and allowing a stretched laminate to be stretched within a boric acid aqueous solution at a high stretching ratio is a non-crystallizable PET. Particularly, in cases where the orientation function is 0.05 or less, the non-crystallizable PET can be steadily stretched at a high stretching ratio without applying a large load to the stretching apparatus, for example, increasing the stretching tension, during the second-stage in-boric-acid-solution stretching. This feature can also be easily understood from values of the orientation function in the Examples 1 to 18 and the reference samples 1 to 3 in FIG. 29.

By solving the first technical problem, it has become possible to eliminate restrictions to the stretching ratio which would otherwise be caused by the PET substrate, and increase the total stretching ratio to improve the molecular orientation of the PVA type resin. Thus, optical characteristics of the polarizing film can be significantly improved. However, an improvement in the optical characteristics achieved by the inventors is not limited thereto. Further improvement will be achieved by solving the second technical problem.

Figure 24:
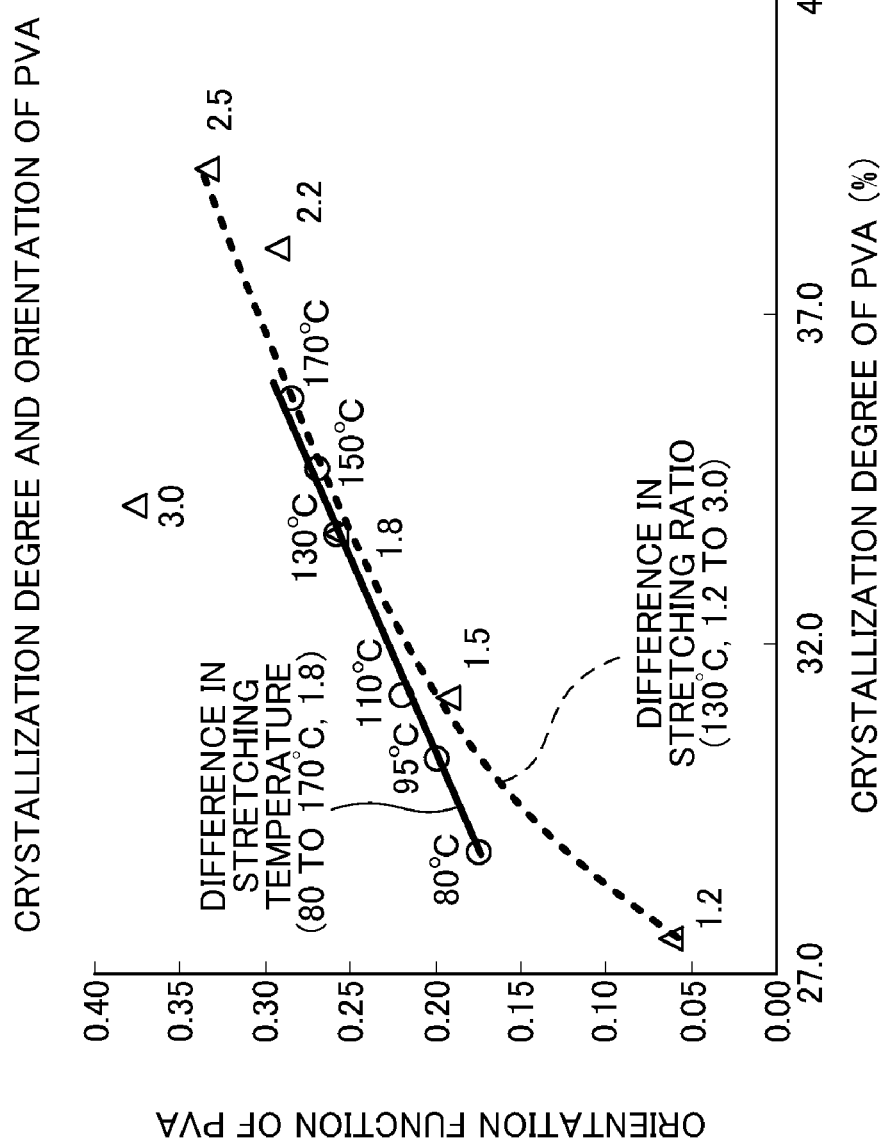
FIG. 24 is a graph illustrating a relationship between a crystallization degree and an orientation function of PVA.
Figure 25:
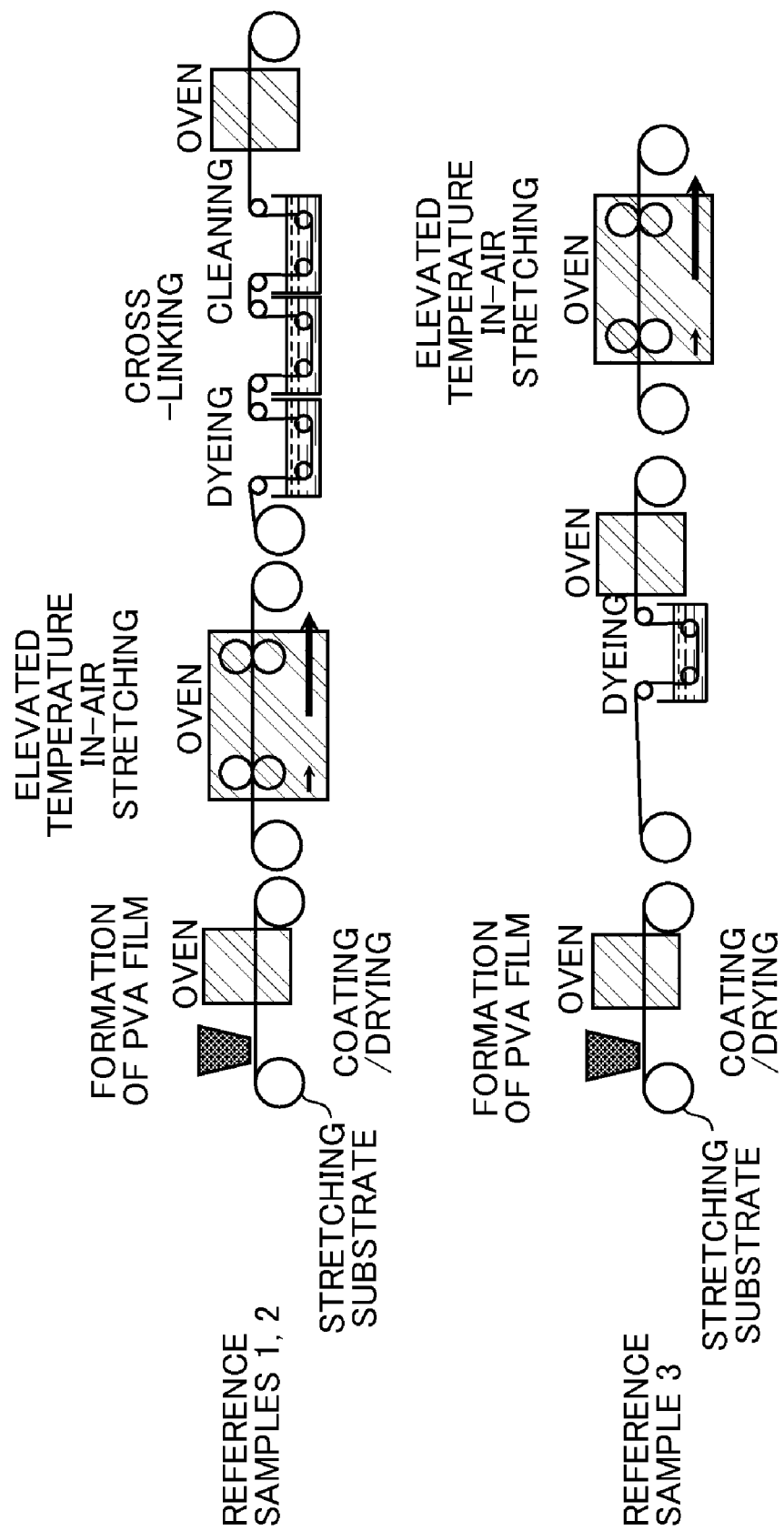
FIG. 25 is a schematic diagram illustrating a production process of producing a polarizing film using a thermoplastic resin substrate.

The second technical problem will further be discussed as follows. One feature of a PVA type resin and a crystallizable resin such as PET as a material for the thermoplastic resin substrate is that, in general, polymer molecules are orderly arranged by heating and stretching/orienting and thereby crystallization is progressed. Stretching of the PVA type resin is restricted by crystallization of the PVA type resin which is a crystallizable resin. Crystallization and stretchability are conflicting physical properties, and it has been commonly recognized that progress in crystallization of the PVA type resin hinders the molecular orientation of the PVA type resin. This is the second technical problem. Means for solving the second technical problem can be explained based on FIG. 24. In FIG. 24, each of the solid line and the dotted line indicates a relationship between the crystallization degree and the orientation function of the PVA type resin, calculated based on two experimental results.

The solid line in FIG. 24 indicates a relationship between a crystallization degree and an orientation function of a PVA type resin in each of six samples provided in the following manner. Firstly, six laminates each comprising a non-crystallizable PET substrate and a PVA type resin layer formed on the substrate were prepared under the same conditions. The prepared six laminates each including the PVA type resin layer were subjected to elevated temperature in-air stretching, respectively, at different stretching temperatures of 80° C., 95° C., 110° C., 130° C., 150° C. and 170° C., to attain the same stretching ratio of 1.8, so that six stretched laminates each including a PVA type resin layer were produced. Then, a crystallization degree of the PVA type resin layer included in each of the stretched laminates and an orientation function of the PVA type resin were measured and analyzed. Details of methods of the measurement and analysis will be described later.

Similarly, the dotted line in FIG. 24 indicates a relationship between a crystallization degree and an orientation function of a PVA type resin layer in each of six samples provided in the following manner. Firstly, six laminates each comprising a non-crystallizable PET substrate and a PVA type resin layer formed on the substrate were prepared under the same conditions. The prepared six laminates each including the PVA type resin layer were stretched by the elevated temperature in-air stretching at the same stretching temperature of 130° C. to attain different stretching ratios of 1.2, 1.5, 1.8, 2.2, 2.5 and 3.0, respectively, so that six stretched laminates each including a PVA type resin layer were produced. Then, a crystallization degree of the PVA type resin layer included in each of the stretched laminates and an orientation function of the PVA type resin were measured and analyzed by the aftermentioned methods.

The solid line in FIG. 24 shows that the molecular orientation of the PVA type resin included in the stretched laminate is improved as the stretching temperature during the elevated temperature in-air stretching is set to a higher value. Further, the dotted line in FIG. 24 shows that the molecular orientation of the PVA type resin included in the stretched laminate is improved as the stretching ratio during the elevated temperature in-air stretching is set to a higher value. In other words, in advance of the second-stage in-boric-acid-solution stretching, the molecular orientation of the PVA type resin is improved, i.e., the crystallization degree of the PVA type resin is increased. This leads to improvement in molecular orientation of the PVA type resin after the in-boric-acid-solution stretching. In addition, the improvement in molecular orientation of the PVA type resin leads to an improvement in orientation of polyiodide ions. This can be ascertained from the aftermentioned T-P graphs of the Examples.

As above, an unanticipated remarkable result has been obtained that the orientation of PVA molecules in the PVA type resin layer formed by the second-stage in-boric-acid-solution stretching can be further improved by setting the stretching temperature or the stretching ratio during the first-stage elevated temperature in-air stretching to a higher value.

Referring to the crystallization degree (horizontal axis) of the PVA type resin illustrated in FIG. 24. Preferably, the crystallization degree of PVA type resin layer is set to at least 27% or more so as to allow a dyed laminate to be formed without causing a problem such as dissolution of the PVA type resin layer, in a dyeing step of immersing the stretched laminate including the PVA type resin layer in a dyeing aqueous solution. This makes it possible to dye the PVA type resin layer without causing dissolution of the PVA type resin layer. The crystallization degree of the PVA type resin layer may be set to 30% or more. In this case, the stretching temperature during the in-boric-acid-solution stretching can be increased. This makes it makes it possible to stably perform the stretching of the dyed laminate and stably produce a polarizing film.

On the other hand, if the crystallization degree of the PVA type resin layer is set to 37% or more, dyeability of the PVA type resin layer will be deteriorated, and thereby it is necessary to increase a concentration of the dyeing aqueous solution, so that an amount of material to be used, and a required time for the dyeing, will be increased, which is likely to cause deterioration in productivity. If the crystallization degree of the PVA type resin layer is set to 40% or more, another problem, such as breaking of the PVA type resin layer during the in-boric-acid-solution stretching, is likely to occur. Therefore, the crystallization degree of the PVA type resin is preferably set in the range of 27% to 40%, more preferably in the range of 30% to 37%.

Referring to the orientation function (vertical axis) of the PVA type resin layer illustrated in FIG. 24. Preferably, the orientation function of the PVA resin layer is set to 0.05 or more so as to allow a highly functional polarizing film to be prepared using a non-crystallizable PET resin substrate. The orientation function of the PVA type resin layer may be set to 0.15 or more. In this case, the stretching ratio during the in-boric-acid-solution stretching for the dyed laminate including the PVA type resin layer can be reduced. This makes it possible to prepare a polarizing film having a larger width.

On the other hand, if the orientation function of the PVA type resin layer is set to 0.30 or more, the dyeability will be deteriorated, and thereby it is necessary to increase the concentration of the dyeing aqueous solution, so that an amount of material to be used, and a required time for the dyeing, will be increased, which is likely to cause deterioration in productivity. If the orientation function of the PVA type resin layer is set to 0.35 or more, another problem, such as breaking of the PVA type resin layer during the in-boric-acid-solution stretching, is likely to occur. Therefore, the orientation function of the PVA type resin is preferably set in the range of 0.05 to 0.35, more preferably in the range of 0.15 to 0.30.

Means for solving the first technical problem is to auxiliarily or preliminarily stretch a laminate comprising a non-crystallizable PET substrate and a PVA type resin layer formed on the substrate by the first-stage elevated temperature in-air stretching, whereby the PVA type resin layer can be stretched at a higher stretching ratio by the second-stage in-boric-acid-solution stretching without being restricted by the stretching ratio of the non-crystallizable PET substrate, so that the molecular orientation of the PVA is sufficiently improved.

Means for solving the second technical problem is to auxiliarily or preliminarily set the stretching temperature during the first-stage elevated temperature in-air stretching to a higher value, or auxiliarily or preliminarily set the stretching ratio during the first-stage elevated temperature in-air stretching to a higher value, whereby an unanticipated result has been provided that the orientation of PVA molecules in the PVA type resin layer formed by the second-stage in-boric-acid-solution stretching is further improved. In either case, the first-stage elevated temperature in-air stretching can be regarded as auxiliary or preliminary in-air stretching means for the second-stage in-boric-acid-solution stretching. The "first-stage elevated temperature in-air stretching" will hereinafter be referred to as "preliminary in-air stretching", in contrast to the second-stage in-boric-acid-solution stretching.

In particular, a mechanism for solving the second technical problem by performing the "preliminary in-air stretching" can be assumed as follows. As is ascertained in FIG. 24, the molecular orientation of the PVA type resin after the preliminary in-air stretching is improved as the preliminary in-air stretching is performed at a higher temperature or a higher ratio. It is assumed that this is because the stretching is performed in a more progressed state of crystallization of the PVA type resin as the stretching temperature or rate becomes higher. Consequently, the molecular orientation of the PVA type resin is improved. In this manner, the molecular orientation of the PVA type resin is improved by the preliminary in-air stretching in advance of the in-boric-acid-solution stretching. In this case, it is assumed that, when the PVA type resin is immersed in a boric acid aqueous solution, boric acid can be easily cross-linked with the PVA type resin, and the stretching is performed under a condition that nodes are being formed by the boric acid. Consequently, the molecular orientation of the PVA type resin is further improved after the in-boric-acid-solution stretching.

Considering all the above factors together, a polarizing film having a thickness of 10 μm or less and optical characteristics satisfying the following conditions can be obtained by performing stretching based on 2-stage stretching consisting of preliminary in-air stretching and in-boric-acid-solution stretching: $T \geq 42.5$; and $P \geq 99.5$, wherein T is a single layer transmittance, and P is a polarization rate.

This polarizing film can be used in an optically functional film laminate to be laminated to a viewing side of an organic EL display panel.

In implementation of the method of the present invention, wherein a polarizing film comprising a PVA type resin, using a thermoplastic resin substrate, an insolubilization process for insolubilizing the PVA type resin is regarded as a key technical problem. This point will be specifically described below.

In cases where the PVA type resin layer formed on the thermoplastic resin substrate is subjected to stretching, it is not easy to cause iodine to be absorbed (impregnated) in the PVA type resin layer, while preventing the PVA type resin layer included in a stretched intermediate product or a stretched laminate from being dissolved in a dyeing solution. In a production process of a polarizing film, a step of causing iodine to be absorbed in a thinned PVA type resin layer is essential. In a conventional dyeing step, an amount of iodine to be absorbed in the PVA type resin layer is adjusted by using a plurality of dyeing solutions having different iodine concentrations ranging from 0.12 to 0.25 wt %, and keeping an immersion time constant. In such a conventional dyeing step, dissolution of the PVA type resin layer will occur during production of a polarizing film to preclude dyeing.

As is clear from the test result illustrated in FIG. 5, the above technical problem can be solved by setting a concentration of iodine as the dichroic material to 0.3 wt % or more. Specifically, a plurality of polarizing films having various polarization performances can be produced by subjecting a stretched laminate including a stretched intermediate product comprising a PVA type resin layer to dyeing using dyeing solutions different in iodine concentration, while adjusting an immersion time for the dyeing to form various dyed laminates each including a dyed intermediate product, and then subjecting the dyed laminates to the in-boric-acid-solution stretching.

Figure 6:
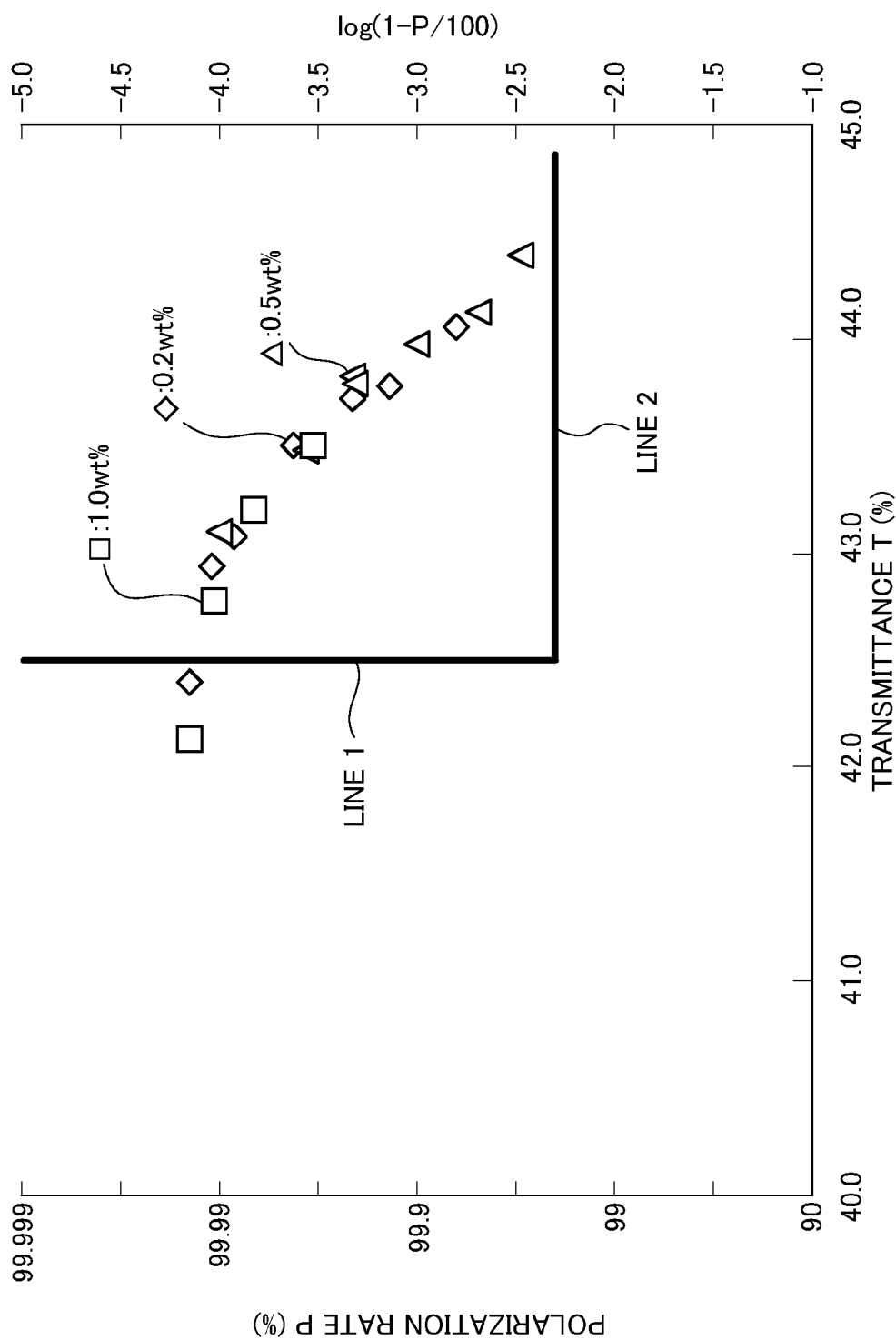
FIG. 6 is a graph illustrating a relationship between an iodine concentration of a dyeing bath and polarization performance of a polarizing film formed by a PVA type resin layer.

Referring now to FIG. 6, FIG. 6 shows that there is no significant difference in polarization performance between polarizing films formed by adjusting the iodine concentration to 0.2 wt %, 0.5 wt % and 1.0 wt %. Meanwhile, in order to realize dyeing excellent in uniformity during formation of a dyed laminate including a dyed intermediate product, it is preferable to reduce the iodine concentration so as to ensure a stable immersion time, rather than increasing the iodine concentration so as to perform the dyeing within a shorter immersion time.

Figure 7:
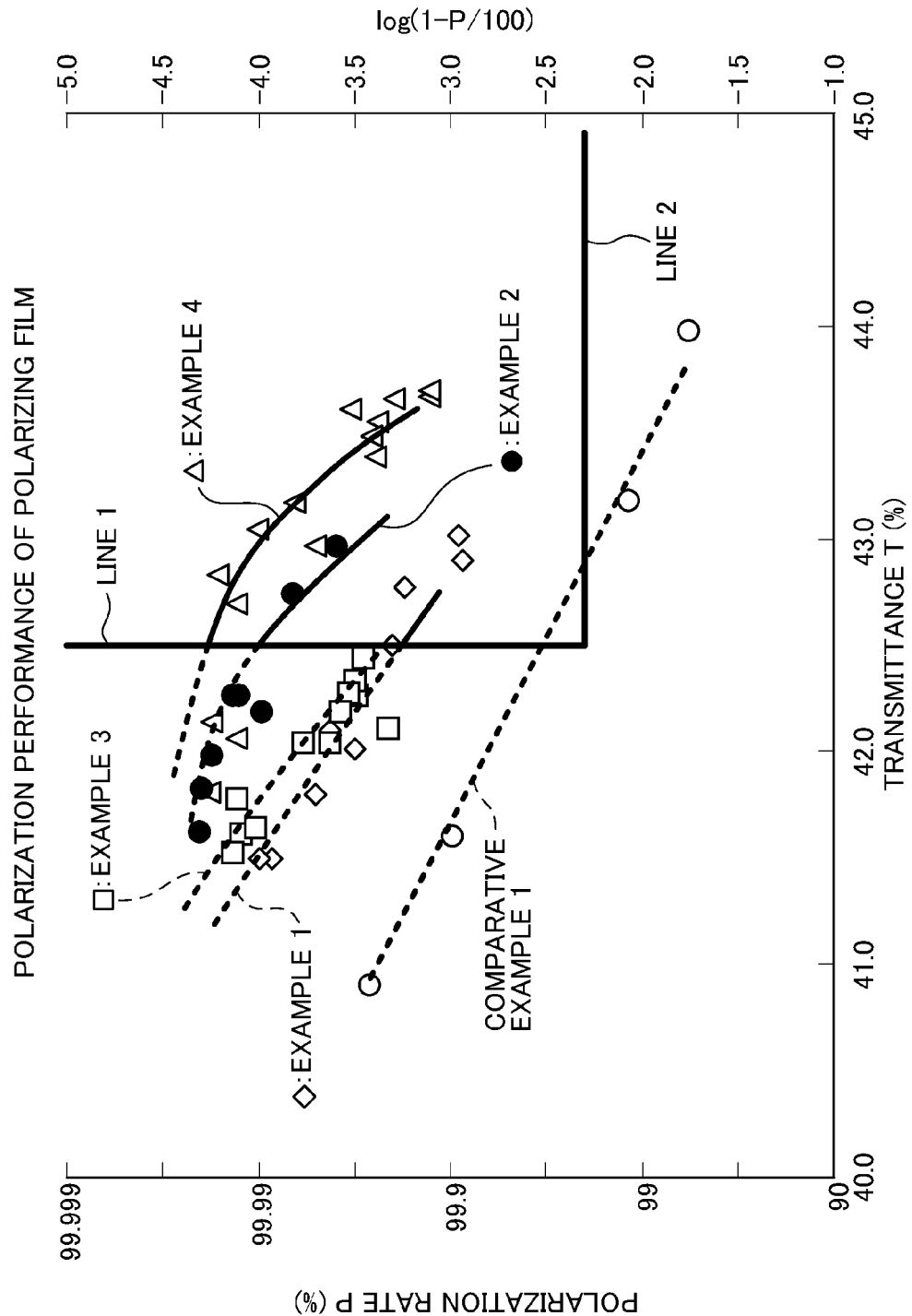
FIG. 7 is a graph illustrating respective polarization performances of polarizing films in inventive examples.

Referring to FIG. 7, FIG. 7 shows that two different insolubilizations during implementation of the present invention (hereinafter referred to as "first and second insolubilizations") also have impacts on optical characteristics of the target polarizing film. FIG. 7 can be considered as a result of analysis on functions of the first and second insolubilizations for the thinned PVA type resin layer. FIG. 7 illustrates respective optical characteristics of polarizing films produced based on the four Examples 1 to 4, each satisfying the required performance for an organic EL display device.

The Example 1 indicates optical characteristics of polarizing films produced without through the first and the second insolubilization steps. The Example 2 indicates optical characteristics of polarizing films produced by performing only the second insolubilization step without performing the first insolubilization step, and the Example 3 indicates optical characteristics of polarizing films produced by performed only the first insolubilization step without performing the second insolubilization step. The Example 4 indicates optical characteristics of polarizing films produced by performing both the first and second insolubilization steps.

In the present invention, a polarizing film satisfying the required performance can be produced without through the first and the second insolubilization steps. However, as is clear from FIG. 8, the optical characteristics of the non-insolubilized polarizing films in the Example 1 are inferior to those of the polarizing films in the Examples 2 to 4. Comparing respective optical characteristics of the Examples 1 to 4, a level of the optical characteristics becomes higher in the following order: Example 1<Example 3<Example 2<Example 4. In each of the Examples 1 and 2, a dyeing solution set to have an iodine concentration of 0.3 wt % and a potassium iodide concentration of 2.1 wt % was used. Differently, in the Examples 3 and 4, a plurality of types of dyeing solutions set to have a iodine concentration ranging from 0.12 to 0.25 wt % and a potassium iodide concentration ranging from 0.84 to 1.75 wt % were used. A significant difference between the group of the Examples 1 and 3 and the group of the Examples 2 and 4 is that the dyed intermediate product in the former group is not subjected to the insolubilization, whereas the dyed intermediate product in the latter group is subjected to the insolubilization. In the Example 4, not only the dyed intermediate product but also the stretched intermediate product before the dyeing are subjected to the insolubilization. Through the first and second insolubilizations, optical characteristics of the polarizing film could be significantly improved.

As is clear from FIG. 7, the mechanism for improving optical characteristics of a polarizing film is not based on the iodine concentration of the dyeing solution, but based on functions of the first and second insolubilizations. This finding can be regarded as means for solving a third technical problem in the production method of the present invention.

In one embodiment of the present invention, the first insolubilization is designed to prevent dissolution of the thinned PVA type resin layer included in the stretched intermediate product (or stretched laminate). On the other hand, the second insolubilization included in the cross-linking step is designed to stabilize dyeing so as to prevent iodine absorbed in the PVA type resin layer included in the dyed intermediate product (or a dyed laminate) from being dissolved out during the in-boric-acid-solution stretching at a solution temperature of 75° C. in a subsequent step, and prevent dissolution of the thinned PVA type resin layer.

If the second insolubilization is omitted, iodine absorbed in the PVA type resin layer will be acceleratedly dissolved out during the in-boric-acid-solution stretching at a solution temperature of 75° C., so that the PVA resin layer will be acceleratedly dissolved. The elution of iodine and dissolution of the PVA type resin layer can be handled by lowering a temperature of the boric acid aqueous solution. For example, it is necessary to stretch a dyed intermediate product (or dyed laminate) while immersing it in the boric acid aqueous solution at a solution temperature of less than 65° C. However, this makes it impossible to sufficiently bring out the plasticizing function of water, so that softening of the PVA type resin layer included in the dyed intermediate product (or dyed laminate) is not sufficiently obtained. This means deterioration in stretching performance. Thus, the dyed intermediate product (or dyed laminate) is likely to break during the course of the in-boric-acid-solution stretching. It should be understood that an intended total stretching ratio of the PVA type resin layer cannot be attained.

With reference to the drawings, one example of a process of producing a polarizing film for use in the present invention will be described below.

[Outline of Production Process]

Figure 8:
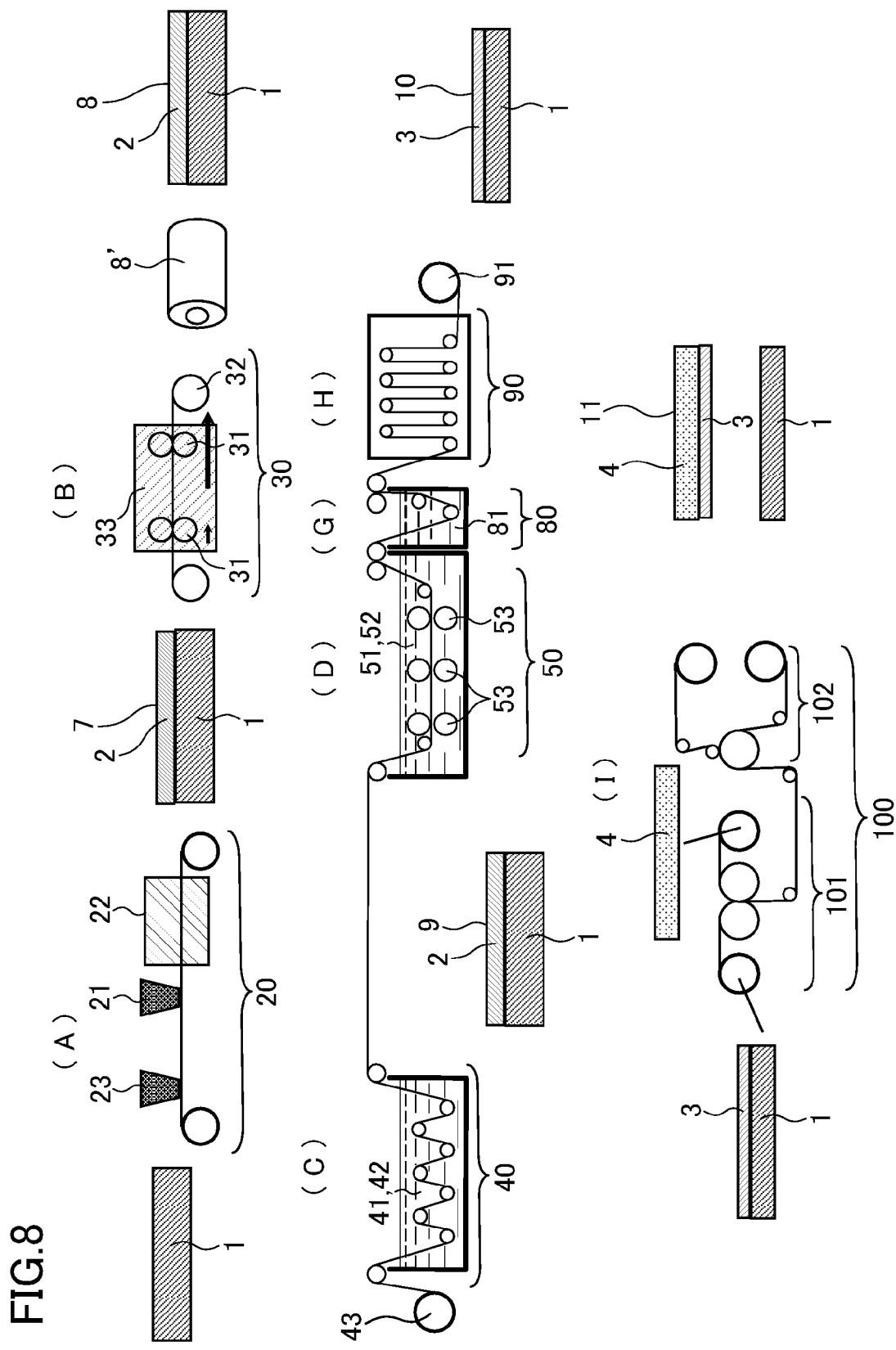
FIG. 8 is a schematic diagram illustrating a production process for producing an optical film laminate, wherein the process does not include any insolubilization treatment.

Referring to FIG. 8, FIG. 8 is a schematic diagram illustrating a production process for an optical film laminate 10 comprising a polarizing film 3, without an insolubilization step. The following description will be made about a process of producing an optical film laminate 10 comprising a polarizing film 3 based on the Example 1.

As a thermoplastic resin substrate, a continuous web of substrate made of isophthalic acid-copolymerized polyethylene terephthalate copolymerized with isophthalic acid in an amount of 6 mol % (hereinafter referred to as "non-crystallizable PET") was prepared. A laminate 7 comprising a continuous web of non-crystallizable PET substrate 1 having a glass transition temperature Tg of 75° C., and a PVA layer 2 having a glass transition temperature Tg of 80° C. was prepared in the following manner.

(Laminate Preparation Step (A))

Firstly, a non-crystallizable PET substrate 1 having a thickness of 200 μm, and a PVA solution prepared by dissolving a PVA powder having a polymerization degree of 1000 or more and a saponification degree of 99% or more, in water to have a concentration of 4 to 5 wt % were prepared. Then, in a laminate forming apparatus 20 equipped with a coating unit 21, a drying unit 22 and a surface modifying unit 23, the PVA solution was applied to the non-crystallizable PET substrate 1 having a thickness of 200 μm, and dried at a temperature of 50 to 60° C., to form a 7 μm-thick PVA layer 2 on the non-crystallizable PET substrate 1. The thickness of the PVA layer can be appropriately changed, as described later. The laminate obtained in the above manner will hereinafter be referred to as a "laminate 7 comprising a non-crystallizable PET substrate and a PVA layer formed on the substrate", or as a "PVA layer-including laminate 7", or simply as a "laminate 7".

The PVA layer-including laminate 7 will be finally produced as a 3 μm-thick polarizing film 3 through the following steps including a 2-stage stretching step consisting of preliminary in-air stretching and in-boric-acid-solution stretching. While the present invention is intended to use a polarizing film having a thickness of 10 μm or less, any polarizing film having an arbitrary thickness of 10 μm or less can be formed by appropriately changing a thickness of a PVA type resin layer to be formed on the PET substrate 1.

(Preliminary In-Air Stretching Step (B))

In a first-stage preliminary in-air stretching step (B), the laminate 7 including the 7 μm-thick PVA layer 2 was stretched integrally with the non-crystallizable PET substrate 1 to form a "stretched laminate 8" including a 5 μm-thick PVA layer 2. Specifically, in a preliminary in-air stretching apparatus 30 having stretching means 31 provided within an oven 33, the laminate 7 including the 7 μm-thick PVA layer 2 was fed to pass through the stretching means 31 within the oven 33 set to a temperature environment of 130° C., so that it was subjected to end-free uniaxial stretching to attain a stretching ratio of 1.8 to thereby form a stretched laminate 8. At this stage, the stretched laminate 8 may be wound on a reel-up unit 32 provided in side-by-side relation to the oven 33, to produce a roll 8' of the stretched laminate 8.

Now, "end-free stretching" and "end-fixed stretching" will be generally described. When a long film is stretched in a carrying or feeding direction, the film is contracted in a direction perpendicular to the direction of the stretching, i.e. in a width direction of the film. The end-free stretching means a technique of performing stretching without suppressing such contraction. "Longitudinal uniaxial stretching" is a technique of performing stretching only in a longitudinal direction of the film. The end-free uniaxial stretching is generally used in contrast with the end-fixed uniaxial stretching which is a technique of performing stretching while suppressing the contraction which would otherwise occur in a direction perpendicular to the stretching direction. Through the end-free uniaxial stretching, the 7 μm-thick PVA layer 2 included in the laminate 7 is formed into a 5 μm-thick PVA layer 2 in which PVA molecules are oriented in the stretching direction.

(Dyeing Step (C))

Then, in a dyeing step (C), a dyed laminate 9 was formed in which iodine as a dichroic material is absorbed in the 5 μm-thick PVA layer 2 having the oriented PVA molecules. Specifically, in a dyeing apparatus 40 equipped with a dyeing bath 42 of a dyeing solution 41 containing iodine and potassium iodide, the stretched laminate 8 unrolled from a feeding unit 43 provided in side-by-side relation to the dyeing apparatus 40 and loaded with the roll 8' was immersed in the dyeing solution 41 at a solution temperature of 30° C., for an appropriate time, to allow a PVA layer making up a target polarizing film 3 (to be finally formed) to have a single layer transmittance of 40 to 44%. In this manner, a dyed laminate 9 was formed in which iodine is absorbed in the molecularly oriented PVA layer 2 of the stretched laminate 8.

In the above step, in order to prevent dissolution of the PVA layer 2 included in the stretched laminate 8, the dyeing solution 41 was formed as an aqueous solvent having an iodine concentration of 0.30 wt %. Further, the dyeing solution 41 was adjusted to allow a concentration of potassium iodide for allowing iodine to be dissolved in water to become 2.1 wt %. A ratio of the iodine concentration to the potassium iodide concentration was 1:7. More specifically, the laminate 8 was immersed in the dyeing solution 41 having an iodine concentration of 0.30 wt % and a potassium iodide concentration of 2.1 wt %, for 60 seconds, to form a dyed laminate 9 having iodine absorbed in the 5 μm-thick PVA layer 2 having the oriented PVA molecules. In the Example 1, the immersion time of the stretched laminate 8 in the dyeing solution 41 having an iodine concentration of 0.30 wt % and a potassium iodide concentration of 2.1 wt % was changed to adjust an amount of iodine to be absorbed, so as to allow a target polarizing film 3 to have a single layer transmittance of 40 to 44%, to form various dyed laminates 9 different in single layer transmittance and polarization rate.

(In-Boric-Acid-Solution Stretching Step (D))

In a second-stage in-boric-acid-solution stretching step (D), the dyed laminate 9 including the PVA layer 2 dyed having molecularly oriented iodine was further stretched to form an optical film laminate 10 which includes the PVA layer having molecularly oriented iodine and making up a 3 μm-thick polarizing film 3. Specifically, in an in-boric-acid-solution stretching apparatus 50 equipped with stretching means 53 and a bath 52 of a boric acid aqueous solution 51 containing boric acid and potassium iodide, the dyed laminate 9 continuously fed from the dyeing apparatus 40 was immersed in the boric acid aqueous solution 51 set to a solution temperature environment of 65° C., and then fed to pass through the stretching means 53 provided in the in-boric-acid-solution stretching apparatus 50, so that it was subjected to an end-free uniaxial stretching to attain a stretching ratio of 3.3 to thereby form the optical film laminate 10.

More specifically, the boric acid aqueous solution 51 was adjusted to contain 4 weight parts of boric acid with respect to 100 weight parts of water, and 5 weight parts of potassium iodide with respect to 100 weight parts of water. In this step, the dyed laminate 9 having the absorbed iodine in an adjusted amount was first immersed in the boric acid aqueous solution 51 for 5 to 10 seconds. Then, the dyed laminate 9 was fed to directly pass through between a plurality of sets of rolls different in circumferential speed, as the stretching means 53 of the in-boric-acid-solution stretching apparatus 50, so that it was subjected to an end-free uniaxial stretching to attain a stretching ratio of 3.3 while taking a time of 30 to 90 seconds. Through this stretching, the PVA layer included in the dyed laminate 9 was changed into a 3 μm-thick PVA layer in which the absorbed iodine is highly oriented in one direction in the form of a polyiodide ion complex. This PVA layer makes up a polarizing film 3 of the optical film laminate 10.

As above, in the Example 1, a laminate 7 comprising a non-crystallizable PET substrate 1 and a 7 μm-thick PVA layer 2 formed on the substrate 1 is subjected to preliminarily in-air stretching at a stretching temperature of 130° C. to form a stretched laminate 8, and then the stretched laminate 8 is subjected to dyeing to form a dyed laminate 9. Further, the dyed laminate 9 is subjected to in-boric-acid-solution stretching at a stretching temperature of 65° C. to form an optical film laminate 10 including a 3 μm-thick PVA layer stretched integrally with the non-crystallizable PET substrate to attain a total stretching ratio of 5.94. Through the above 2-stage stretching, it is possible to form an optical film laminate 10 including a 3 μm-thick PVA layer making up a polarizing film 3 in which iodine absorbed therein through dyeing is highly oriented in the form of a polyiodide ion complex. Preferably, the optical film laminate 10 will be completed through subsequent cleaning, drying and transfer steps. Details of the cleaning step (G), the drying step (H) and the transfer step (I) will be described in connection with a production process based on the Example 4 incorporating an insolubilization step.

[Outline of Other Production Process]

Figure 9:
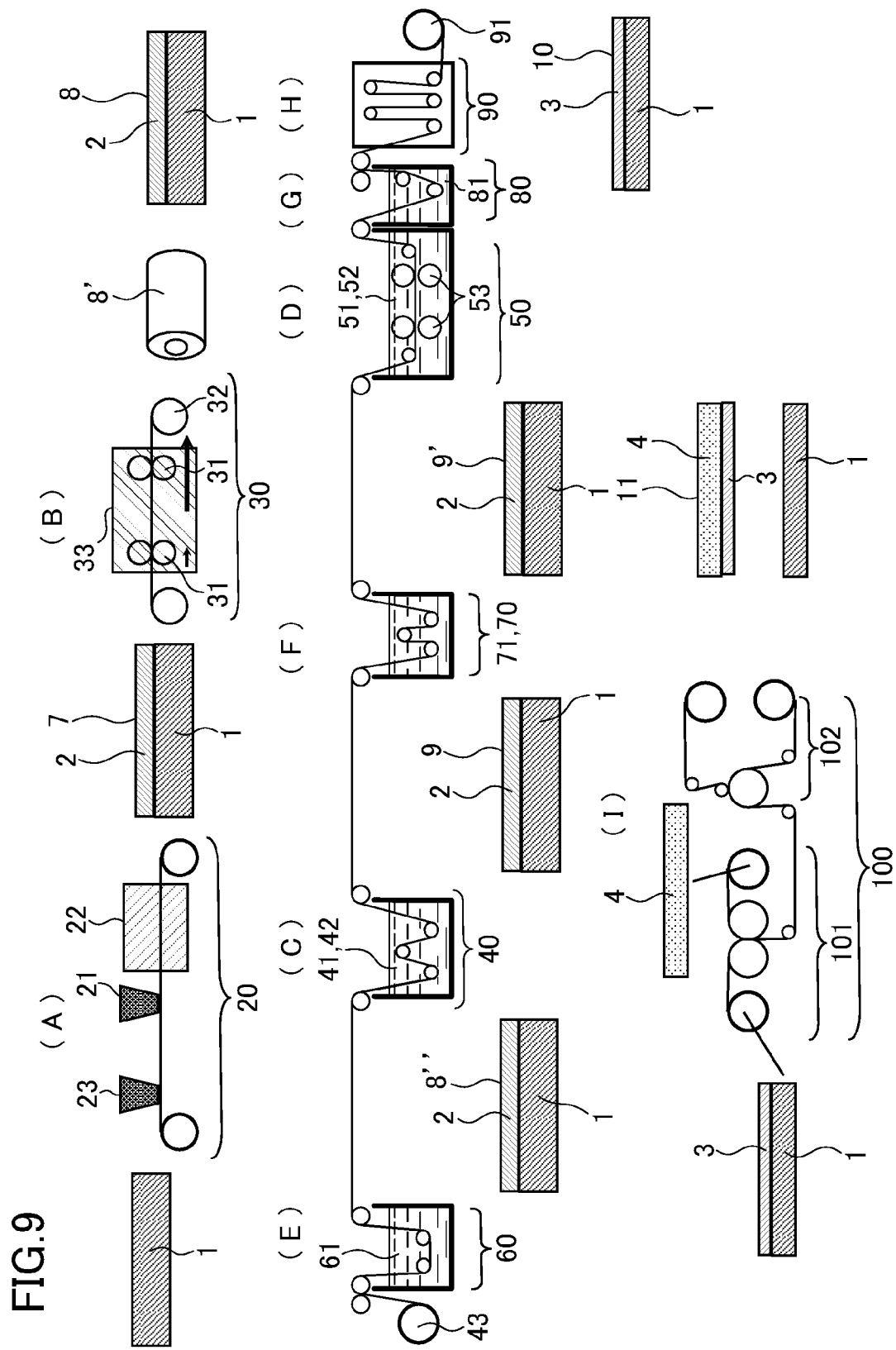
FIG. 9 is a schematic diagram illustrating a production process for producing an optical film laminate, wherein the process includes an insolubilization treatment.

Referring to FIG. 9, FIG. 9 is a schematic diagram illustrating a production process of an optical film laminate 10 including a polarizing film 3, which has an insolubilization step. The following description will be made about a production process of an optical film laminate 10 including a polarizing film 3 based on the Example 4. As is clear from FIG. 9, the production process based on the Example 4 may be assumed as a production process in which the first insolubilization step before the dyeing step and the cross-linking step including the second insolubilization before the in-boric-acid-solution stretching are incorporated into the production process based on the Example 1. A laminate preparation step (A), a preliminary in-air stretching step (B), a dyeing step (C) and an in-boric-acid-solution stretching step (D) in this process are the same as those in the production process based on the Example 1, except a difference in temperature of the boric acid aqueous solution for the in-boric-acid-solution stretching step. Thus, descriptions of this process will be simplified, and the first insolubilization step before the dyeing step and the cross-linking step including the second insolubilization before the in-boric-acid-solution stretching step will be primarily described.

(First Insolubilization Step (E))

The first insolubilization step is an insolubilization step (E) prior to the dyeing step (C). As with the production process based on the Example 1, in the laminate preparation step (A), a laminate 7 comprising a non-crystallizable PET substrate and a 7 μm-thick PVA layer 2 formed on the substrate is produced. Then, in the preliminary in-air stretching step (B), the laminate 7 including the 7 μm-thick PVA layer 2 is subjected to preliminary in-air stretching to form a stretched laminate 8 including a 5 μm-thick PVA layer 2. Subsequently, in the first insolubilization step (E), the stretched laminate 8 unrolled from the feeding unit 43 loaded with the roll 8' is subjected to insolubilization to form the insolubilized stretched laminate 8". It should be understood that the stretched laminate 8" insolubilized in this step includes an insolubilized PVA layer 2. This laminate 8" will hereinafter be referred to as an "insolubilized stretched laminate 8''".

Specifically, in an insolubilization apparatus 60 containing an insolubilizing boric acid aqueous solution 61, the stretched laminate 8 is immersed in the insolubilizing boric acid aqueous solution 61 at a solution temperature of 30° C., for 30 seconds. The insolubilizing boric acid solution 61 used in this step contains 3 weight parts of boric acid with respect to 100 weight parts of water (hereinafter referred to as "insolubilizing boric acid aqueous solution"). This step is intended to subject the stretched laminate 8 to insolubilization so as to prevent the 5 μm-thick PVA layer included in the stretched laminate 8 from being dissolved at least during the subsequent dyeing step (C).

After the insolubilization, the insolubilized stretched laminate 8 is fed to the dyeing step (C). Differently from the Example 1, in this dyeing step (C), a plurality of dyeing solutions in which the iodine concentration is changed in the range of 0.12 to 0.25 wt % are prepared. Then, various dyed laminates 9 different in single layer transmittance and polarization rate are formed by using the dyeing solutions while keeping the immersion time of the insolubilized stretched laminate 8" in each of the dyeing solutions constant, to adjust an amount of iodine to be absorbed, so as to allow a target polarizing film to have a single layer transmittance of 40 to 44%. Even after the immersion in the dyeing solutions having an iodine concentration of 0.12 to 0.25 wt %, the PVA layer in the insolubilized stretched laminate 8" is never dissolved.

(Cross-Linking Step Including Second Insolubilization (F))

The following cross-linking step may be considered that it includes the second insolubilization step, in view of the following purpose. The cross-linking step is intended to achieve (i) insolubilization for preventing dissolution of the PVA layer included in the dyed laminate 9 during the subsequent in-boric-acid-solution stretching step (D), (ii) stabilization in dyeing for preventing elution of iodine absorbed in the PVA layer; and (iii) formation of nodes by cross-linking of molecules in the PVA layer. The second insolubilization is intended to realize the fruits (i) and (ii).

The cross-linking step (F) is performed as a pretreatment for the in-boric-acid-solution stretching step (D). The dyed laminate 9 formed in the dyeing step (C) is subjected to cross-linking to form a cross-linked dyed laminate 9'. The cross-linked dyed laminate 9' includes a cross-linked PVA layer 2. Specifically, in a cross-linking apparatus 70 containing an aqueous solution 71 comprising iodine and potassium iodide (hereinafter referred to as "cross-linking boric acid aqueous solution"), the dyed laminate 9 is immersed in the cross-linking boric acid solution 71 at 40° C., for 60 seconds, so as to cross-link the PVA molecules of the PVA layer having the absorbed iodine, to form a cross-linked dyed laminate 9'. The cross-linking boric acid aqueous solution 71 used in this step contains 3 weight parts of boric acid with respect to 100 weight parts of water, and 3 weight parts of potassium iodide with respect to 100 weight parts of water.

In the in-boric-acid-solution stretching step (D), the cross-linked dyed laminate 9' is immersed in the boric acid aqueous solution at 75° C., and subjected to an end-free uniaxial stretching to attain a stretching ratio of 3.3 to thereby form an optical film laminate 10. Through this stretching, the PVA layer 2 included in the dyed laminate 9' and having absorbed iodine is changed into a 3 μm-thick PVA layer 2 in which the absorbed iodine is highly oriented in one direction in the form of a polyiodide ion complex. This PVA layer makes up a polarizing film 3 of the optical film laminate 10.

In the Example 4, a 7 μm-thick PVA layer 2 is first formed on a non-crystallizable PET substrate 1 to form a laminate 7, and then the laminate 7 is subjected to preliminary in-air stretching at a stretching temperature of 130° C. based on an end-free uniaxial stretching process to attain a stretching ratio of 1.8 to thereby form a stretched laminate 8. Then, the formed stretched laminate 8 is immersed in the insolubilizing boric acid aqueous solution 61 at a solution temperature of 30° C. to insolubilize the PVA layer included in the stretched laminate. The resulting product is an insolubilized stretched laminate 8". The insolubilized stretched laminate 8" is immersed in a dyeing solution containing iodine and potassium iodide and having a temperature of 30° C. to form a dyed laminate 9 in which iodine is absorbed in the insolubilized PVA layer. Then, the dyed laminate 9 including the PVA layer with the absorbed iodine is immersed in the cross-linking boric acid aqueous solution 71 under a solution temperature of 40° C., for 60 seconds, to cross-link PVA molecules of the PVA layer with the absorbed iodine. The resulting product is a cross-linked dyed laminate 9'. The cross-linked dyed laminate 9' is immersed in an in-boric-acid-solution stretching bath 51 containing boric acid and potassium iodide and having a temperature of 75° C., for 5 to 10 seconds, and then subjected to in-boric-acid-solution stretching based on an end-free uniaxial stretching process to attain a stretching ratio of 3.3 to thereby form an optical film laminate 10.

As above, based on the 2-stage stretching consisting of the elevated temperature in-air stretching and the in-boric-acid-solution stretching, and the pre-treatments consisting of the insolubilization before immersion in the dyeing bath and the cross-linking before the in-boric-acid-solution stretching, the process in the Example 4 makes it possible to stably form an optical film laminate 10 including a 3 μm-thick PVA layer making up a polarizing film in which PVA molecules in a PVA layer 2 formed on a non-crystallizable PET substrate 1 are highly oriented, and iodine reliably absorbed in the PVA molecules through dyeing is highly oriented in one direction in the form of an polyiodide ion complex.

(Cleaning Step (G))

The dyed laminate 9 or the cross-linked dyed laminate 9' in the Example 1 or 4 is subjected to stretching in the in-boric-acid-solution stretching step (D), and then taken out of the boric acid aqueous solution 51. Preferably, the taken-out optical film 10 including the polarizing film 3 is directly fed to a cleaning step (G). The cleaning step (G) is intended to wash out unnecessary residuals adhered on a surface of the polarizing film 3. Alternatively, the cleaning step (G) may be omitted, and the optical film 10 including the polarizing film 3 may be directly fed to a drying step (H). However, if the cleaning is insufficient, boric acid is likely to precipitate from the polarizing film 3 after drying of the optical film laminate 10. Specifically, the optical film laminate 10 is fed to a cleaning apparatus 80 and immersed in a cleaning solution 81 containing potassium iodide having a temperature of 30° C., for 1 to 10 seconds, so as to prevent dissolution of PVA of the polarizing film 3. A potassium iodide concentration of the cleaning solution 81 may be in the range of about 0.5 to 10 weight %.

(Drying Step (H))

The cleaned optical film laminate 10 is fed to a drying step (H) and dried therein. Then, the dried optical film laminate 10 is wound on a reel-up unit 91 provided in side-by-side relation to the drying apparatus 90, as a continuous web of optical film laminate 10, to form a roll of the optical film laminate 10 including the polarizing film 3. Any appropriate process, such as natural drying, blow drying and thermal drying, may be employed as the drying step (H). In each of the Examples 1 and 4, the drying was performed by warm air at 60° C., for 240 seconds in an oven type drying apparatus 90.

[Lamination and Transfer Step (I))

As mentioned above, the present invention is directed to providing an organic EL display device using a polarizing film which consists of a polyvinyl alcohol type resin having a molecularly oriented dichroic material, wherein the polarizing film is formed to have optical characteristics satisfying the aforementioned required conditions, through 2-stage stretching consisting of preliminary in-air stretching and in-boric-acid-solution stretching.

In order to form such an organic EL display device, an optical film laminate 10 including a polarizing film having a thickness of 10 μm or less for example, the above 3 μm-thick polarizing film 3 formed in the above Example and formed on a thermoplastic resin substrate such as a non-crystallizable PET substrate, is prepared as a roll of the optical film laminate 10. Then, in a lamination/transfer step (I), the optical film laminate 10 unrolled from the roll may be simultaneously subjected to a lamination operation and a transfer operation, in the following manner.

A thickness of a polarizing film 3 to be produced is set to 10 μm based on thinning by the stretching, typically to only about 2 to 5 μm. Thus, it is difficult to handle such a thin polarizing film 3 as a single layer body. For this reason, the polarizing film 3 is handled, for example, as an optical film laminate 10, i.e., under a condition that it is left on a thermoplastic resin substrate such as the non-crystallizable PET substrate, or, as an optically functional film laminate 11 obtained by laminating or transferring the polarizing film to another optically functional film 4.

In the lamination/transfer step (I) illustrated in FIGS. 8 and 9, the polarizing film 3 included in the continuous web of optical film laminate 10, and a separately prepared optically functional film 4 are laminated together and reeled up. In this reel-up step, the optically functional film laminate 11 is formed by transferring the polarizing film 3 to the optically functional film 4 while peeling the non-crystallizable PET substrate from the polarizing film 3. Specifically, the optical film laminate 10 is unrolled from the roll by an unrolling/laminating unit 101 included in a laminating/transferring apparatus 100, and the polarizing film 3 of the unrolled optical film laminate 10 is transferred to the optically functional film 4 by a reel-up/transferring unit 102. In the course of this operation, the polarizing film 3 is peeled from the substrate 1, and formed as the optically functional film laminate 11.

[Optical Characteristics of Polarizing Films Produced Under Various Conditions]

(1) Improvement in Optical Characteristics of Polarizing Film by Insolubilization (Examples 1 to 4)

As already described based on FIG. 7, each of the polarizing films produced based on the Examples 1 to 4 can overcome the aforementioned technical problems. The optical characteristics thereof can satisfy the required performance for an organic EL display device of a liquid-crystal television using a large-sized display element. Further, as is clear from FIG. 8, the optical characteristics of the non-insolubilized polarizing films in the Example 1 are inferior to the optical characteristics of any polarizing film in the Examples 2 to 4 subjected to the first and/or second insolubilizations. Comparing respective optical characteristics of the Examples, a level of the optical characteristics becomes higher in the following order: (Example 1)<(Example 3 including only the first insolubilization)<(Example 2 including only the second insolubilization)<(Example 4 including the first and second insolubilizations). A polarizing film produced by a production process comprising the first and/or second insolubilization steps, in addition to the production process for the optical film laminate 10 including the polarizing film 3, can be significantly improved in optical characteristic.

(2) Impact of Thickness of PVA Type Resin Layer on Optical Characteristics of Polarizing Film (Example 5)

In the Example 4, the 3 μm-thick polarizing film was formed by stretching the 7 μm-thick PVA layer. On the other hand, in the Example 5, the 12 μm-thick PVA layer was first formed, and the 5 μm-thick polarizing film was formed by stretching this PVA layer. The remaining conditions for producing these polarizing films was the same.

(3) Impact of Difference in Material of Non-Crystallizable PET Substrate on Optical Characteristics of Polarizing Film (Example 6)

In the Example 4, a non-crystallizable PET substrate copolymerized with isophthalic acid was used, whereas, in the Example 6, a non-crystallizable PET substrate copolymerized with 1,4-cyclohexanedimethanol as a modifier group was used. In the Example 6, a polarizing film was produced under the same conditions as those in the Example 4, except the above difference.

Referring to FIG. 13, it shows that there is no significant difference in optical characteristics between respective ones of the polarizing films produced based on the Examples 4 to 6. This would be considered that the thickness of the PVA type resin layer and the type of the non-crystallizable ester type thermoplastic resin do not have any recognizable impact on the optical characteristics.

(4) Improvement in Optical Characteristics of Polarizing Film by Stretching Ratio During Preliminary In-Air (Examples 7 to 9)

In the Example 4, the stretching ratio during the first-stage preliminary in-air stretching and the stretching ratio during the second-stage in-boric-acid-solution stretching were set to 1.8 and 3.3, respectively, whereas, in the Examples 7 to 9, the two stretching ratios were set to 1.2 and 4.9 for the Example 7, 1.5 and 4.0 for the Example 8, and 2.5 and 2.4 for the Example 9. In the Example 7 to 9, the polarizing film was produced under the same conditions as those in the Example 4, except the above difference. For example, the stretching temperature during the preliminary in-air stretching was 130° C., and the in-boric-acid-solution stretching was performed using a boric acid aqueous solution at a solution temperature of 75° C. The total stretching ratio in each of the Examples 8 and 9 was 6.0 which is similar to 5.94 as a total stretching ratio obtained when the stretching ratio during the preliminary in-air stretching in the Example 4 is set to 1.8. Differently, the total stretching ratio of the Example 7 was limited to up to 5.88. This is because the stretching ratio during the in-boric-acid-solution stretching could be set to 4.9 or more, which would be caused by the attainable stretching ratio of non-crystallizable PET having an impact on the relationship between the stretching ratio during the first-stage preliminary in-air stretching and the total stretching ratio, as described based on FIG. 20.

Figure 14:
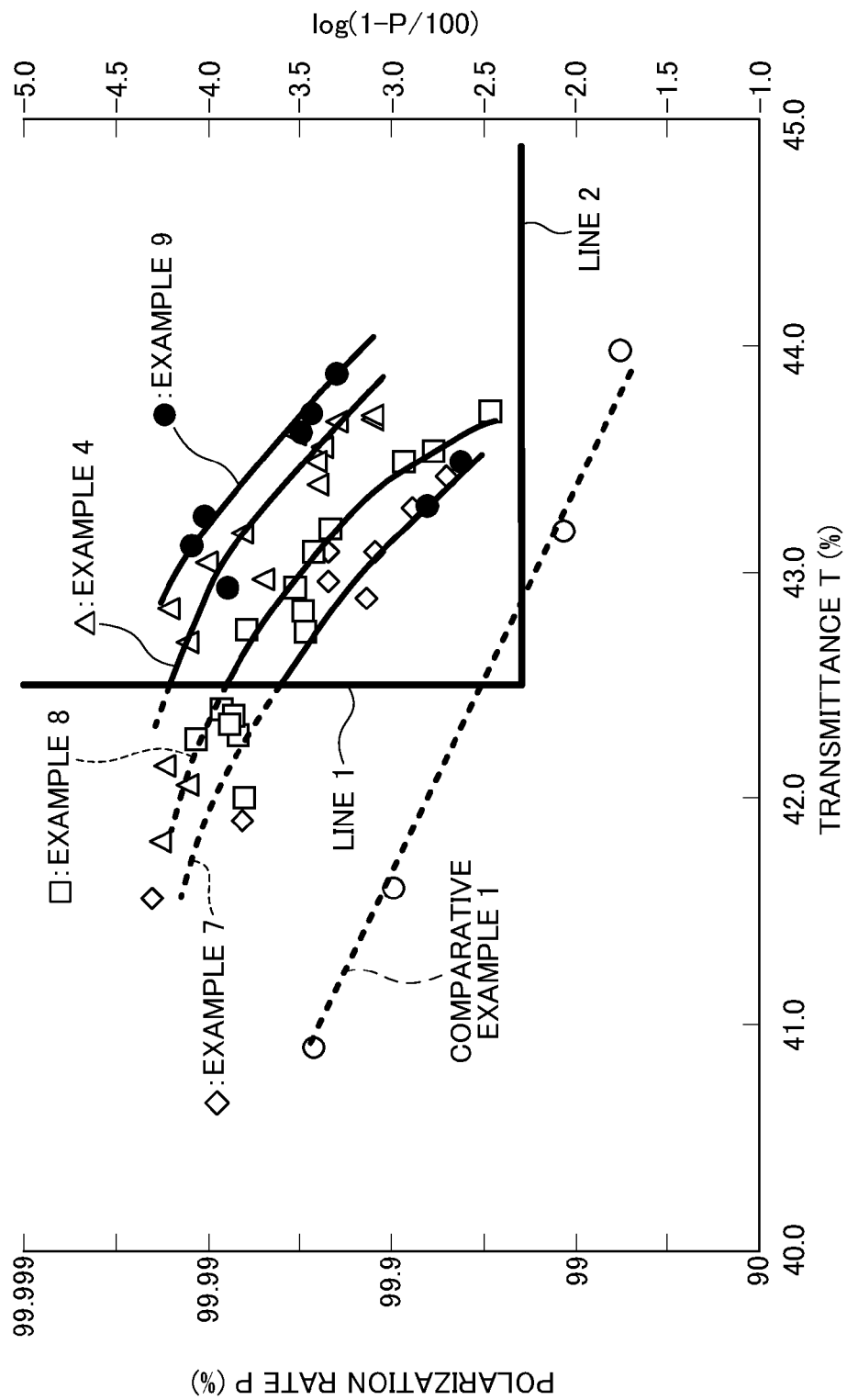
FIG. 14 is a graph illustrating polarization performances of polarizing films in yet another group of inventive examples.

Referring to FIG. 14, each of the polarizing films based on the Examples 7 to 9 can overcome the technical problems concerning production of a polarizing film having a thickness of 10 μm or less and has optical characteristics satisfying the required performance for organic EL display devices, as with the Example 4. Comparing respective optical properties of these Examples, a level of the optical properties becomes higher in the following order: Example 7<Example 8<Example 4<Example 9. This shows that, in cases where the stretching ratio during the first-stage preliminary in-air stretching is set in the range of 1.2 to 2.5, even if a final total stretching ratio after the second-stage in-boric-acid-solution stretching is set to a similar value, the optical characteristics of the polarizing film become better as the stretching ratio during the first-stage preliminary in-air stretching is set to a higher value. Thus, in a production process of an optical film laminate 10 including a polarizing film 3, optical characteristics of the optical film or the optical film laminate 10 including the polarizing film can be further improved by setting the stretching ratio during the first-stage preliminary in-air stretching to a higher value.

(5) Improvement in Optical Characteristics of Polarizing Film by Stretching Temperature During Preliminary In-Air Stretching (Examples 10 to 12)

In the Example 4, the stretching temperature during the preliminary in-air stretching was set to 130° C., whereas in the Examples 10 to 12, the stretching temperature during the preliminary in-air stretching was set, respectively, to 95° C., 110° C., and 150° C., which are higher than the glass transition temperature Tg of PVA. In these Examples, the polarizing film was produced under the same conditions as those in the Example 4, except the above difference. For example, the stretching ratio during the preliminary in-air stretching was set to 1.8, and the stretching ratio during the in-boric-acid-solution stretching was set to 3.3. The stretching temperature during the preliminary in-air stretching in the Example 4 is 130° C. In these Examples including the Example 4, the production conditions are the same except that the stretching temperature is set to 95° C. for the Example 10, 110° C. for the Example 11, 130° C. for the Example 4 and 150° C. for the Example 12.

Figure 15:
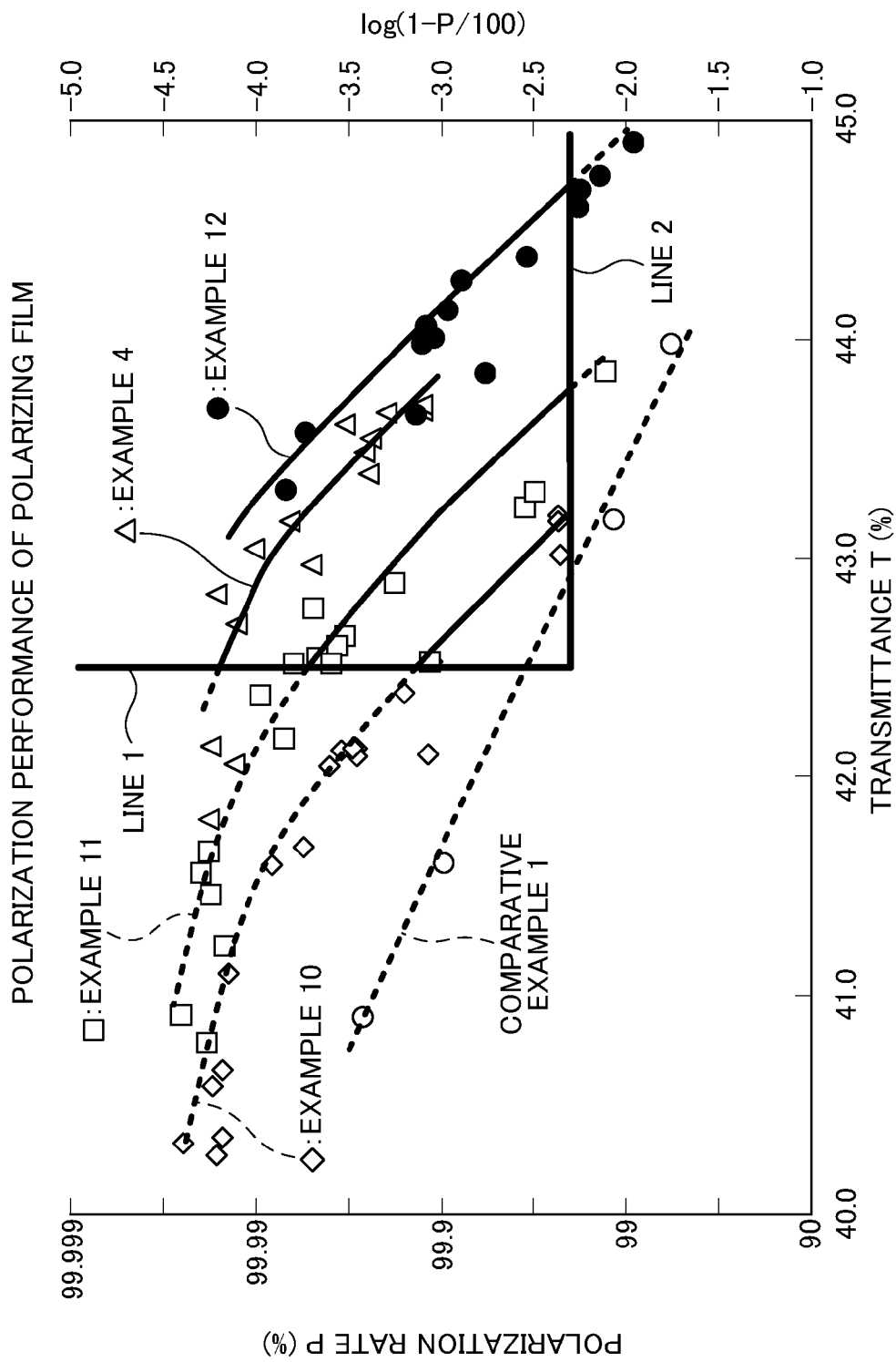
FIG. 15 is a graph illustrating polarization performances of polarizing films in still another group of inventive examples.

Referring to FIG. 15, each of the polarizing films based on the Examples 4 and 10 to 12 can overcome the technical problems concerning production of a polarizing film having a thickness of 10 μm or less, and has optical characteristics satisfying the required performance for organic EL display devices. Comparing respective optical properties of these Examples, a level of the optical properties becomes higher in the following order: Example 10<Example 11<Example 4<Example 12. This shows that, in cases where the stretching temperature during the first-stage preliminary in-air stretching is set to a higher value than the glass transition temperature, and gradually increased from 95° C. to 150° C., even if a final total stretching ratio after the second-stage in-boric-acid-solution stretching is set to a similar value, the optical characteristics of the polarizing film become better as the stretching temperature during the first-stage preliminary in-air stretching is set to a higher value. Thus, in a production process of an optical film laminate 10 including a polarizing film 3, optical characteristics of the optical film or the optical film laminate 10 including the polarizing film can be further improved by setting the stretching temperature during the first-stage preliminary in-air stretching to a higher value.

(6) Improvement of Optical Characteristics of Polarizing Film by Total Stretching Ratio (Examples 13 to 15)

In the Example 4, the stretching ratio during the first-stage preliminary in-air stretching was set to 1.8, and the stretching ratio during the second-stage in-boric acid solution stretching was set to 3.3. On the other hand, in the Examples 13 to 15, only the stretching ratio during the second-stage in-boric acid solution stretching was changed to 2.1, 3.1 and 3.6, respectively. This means that the total stretching ratios in the Examples 13 to 15 are set to 5.04 (about 5.0), 5.58 (about 5.5) and 6.48 (about 6.5), respectively. The total stretching ratio in the Example 4 is 5.94 (about 6.0). In these Examples including the Example 4, the production conditions are the same except that the total stretching ratio is set to 5.0 for the Example 13, 5.5 for the Example 14, 6.0 for the Example 4 and 6.5 for the Example 15.

Figure 16:
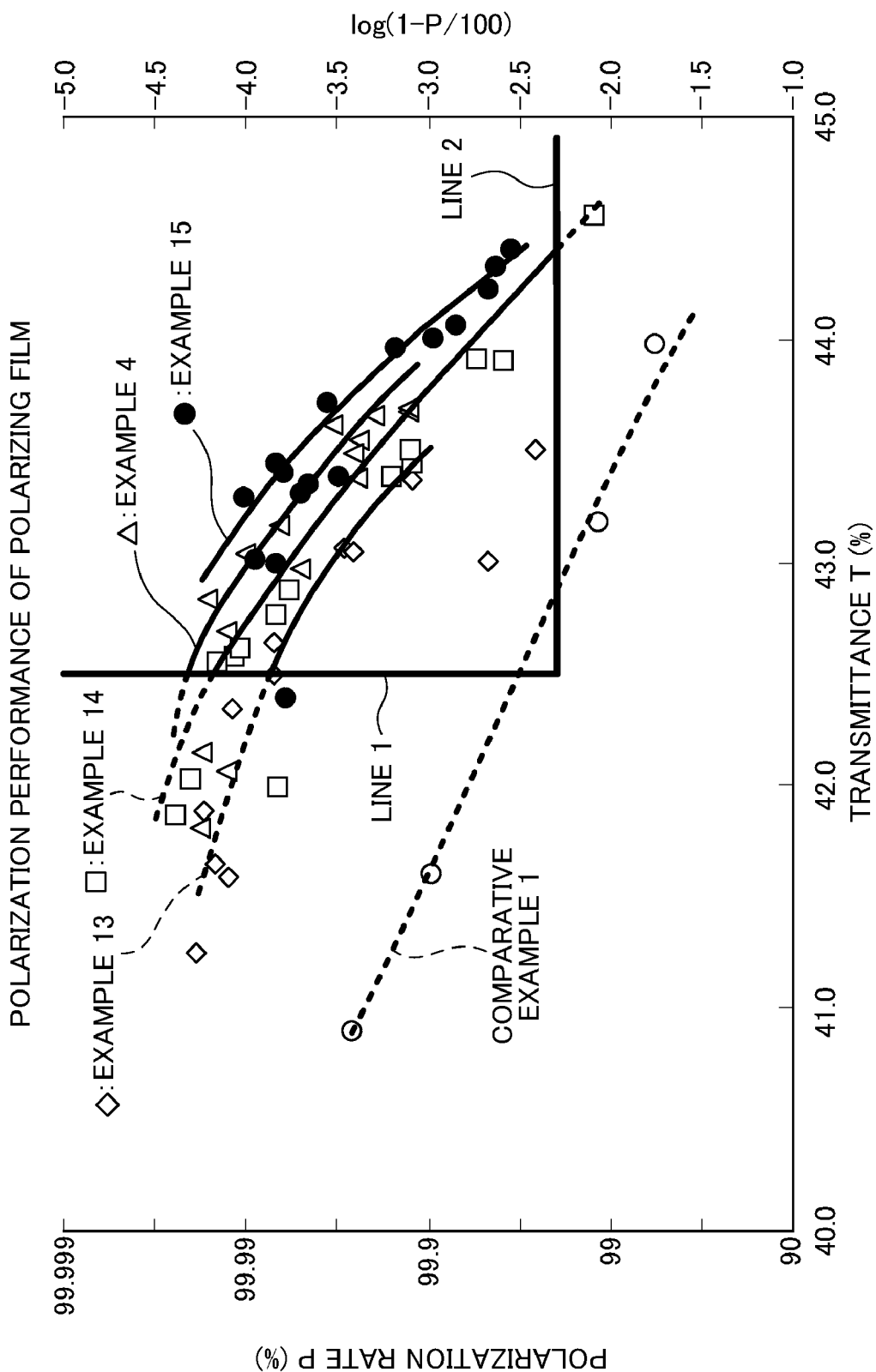
FIG. 16 is a graph illustrating polarization performances of polarizing films in yet still another group of inventive examples.

Referring to FIG. 16, each of the polarizing films based on the Examples 4 and 13 to 15 can overcome the technical problems concerning production of a polarizing film having a thickness of 10 μm or less and has optical characteristics satisfying the required performance for organic EL display devices. Comparing respective optical properties of these Examples, a level of the optical properties becomes higher in the following order: Example 13<Example 14<Example 4<Example 15. This shows that, in cases where the stretching ratio during the first-stage preliminary in-air stretching is fixedly set to 1.8, and only the stretching ratio during the second-stage in-boric-acid-solution stretching is variably set to allow the total stretching ratio to be gradually increased to 5.0, 5.5, 6.0 and 6.5, the optical characteristics of the polarizing film become better as the final total stretching ratio is set to a higher value. Thus, in a production process of an optical film laminate 10 including a polarizing film 3, optical characteristics of the optical film or the optical film laminate 10 including the polarizing film can be further improved by setting the total stretching ratio during the first-stage preliminary in-air stretching and the second-stage in-boric-acid-solution stretching to a higher value.

(7) Improvement of Optical Characteristics of Polarizing Film by Total Stretching Ratio in End-Fixed Uniaxial Stretching (Examples 16 to 18)

In the Examples 16 to 18, optical film laminates were produced under the same conditions as those in the Example 4, except the following difference. The difference is a stretching scheme in the preliminary in-air stretching. In the example 4, an end-free uniaxial stretching process is employed, whereas in each of the Examples 16 to 18, an end-fixed uniaxial stretching process is employed. In each of these Examples, the stretching ratio during the first-stage preliminary in-air stretching was fixedly set to 1.8, and only the stretching ratio during the second-stage in-boric-acid-solution stretching was changed to 3.3, 3.9, 4.4, respectively. This means that the total stretching ratio was set to 5.94 (about 6.0) for the Example 16, 7.02 (about 7.0) for the Example 17 and 7.92 (about 8.0) for the Example 18, respectively. In the Examples 16 to 18, the production conditions are the same except the above difference.

Figure 17:
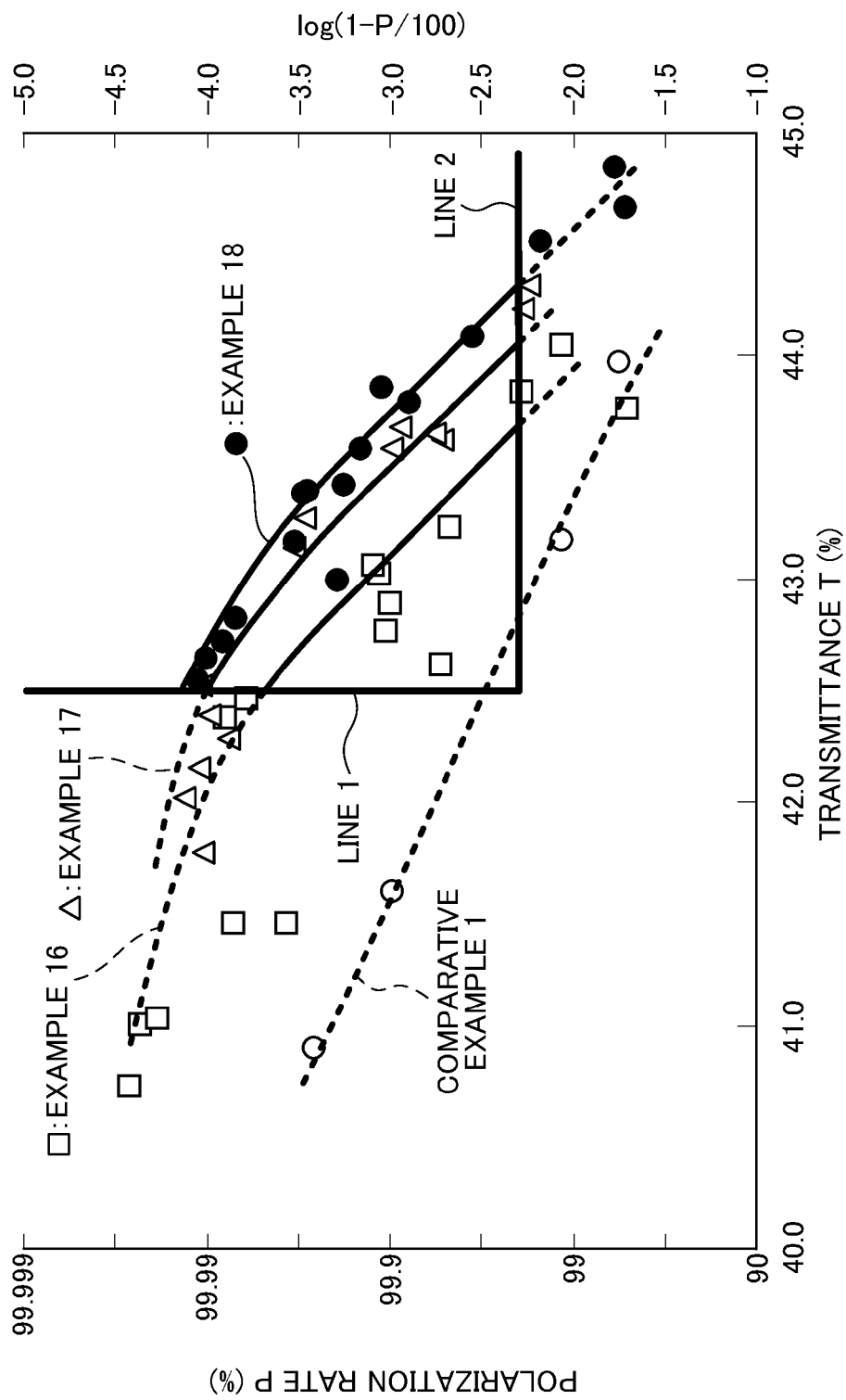
FIG. 17 is a graph illustrating polarization performances of polarizing films in another further group of inventive examples.

Referring to FIG. 17, each of the polarizing films based on the Examples 16 to 18 can overcome the technical problems concerning production of a polarizing film having a thickness of 10 µm or less and has optical characteristics satisfying the required performance for organic EL display devices. Comparing respective optical properties of these Examples, a level of the optical properties becomes higher in the following order: Example 16<Example 17<Example 18. This shows that, in cases where the stretching ratio during the first-stage preliminary in-air stretching is fixedly set to 1.8, and only the stretching ratio during the second-stage in-boric-acid-solution stretching is variably set to allow the total stretching ratio to be gradually increased to 6.0, 7.0 and 8.0, the optical characteristics of the polarizing film become better as the final total stretching ratio is set to a higher value. Thus, in a production process of an optical film laminate 10 including a polarizing film 3, optical characteristics of the optical film or the optical film laminate 10 including the polarizing film can be further improved by setting the total stretching ratio during the first-stage preliminary in-air stretching based on an end-fixed uniaxial stretching process and the second-stage in-boric-acid-solution stretching to a higher value. It was also ascertained that, in cases where a end-fixed uniaxial stretching process is used in the first-stage preliminary in-air stretching, the final total stretching ratio can be increased as compared to cases where an end-free uniaxial stretching process is used in the first-stage preliminary in-air stretching.

Embodiments

FIGS. 10a to 12b illustrate organic EL display devices each using the above polarizing film, according to various embodiments of the present invention.

Figure 10A:
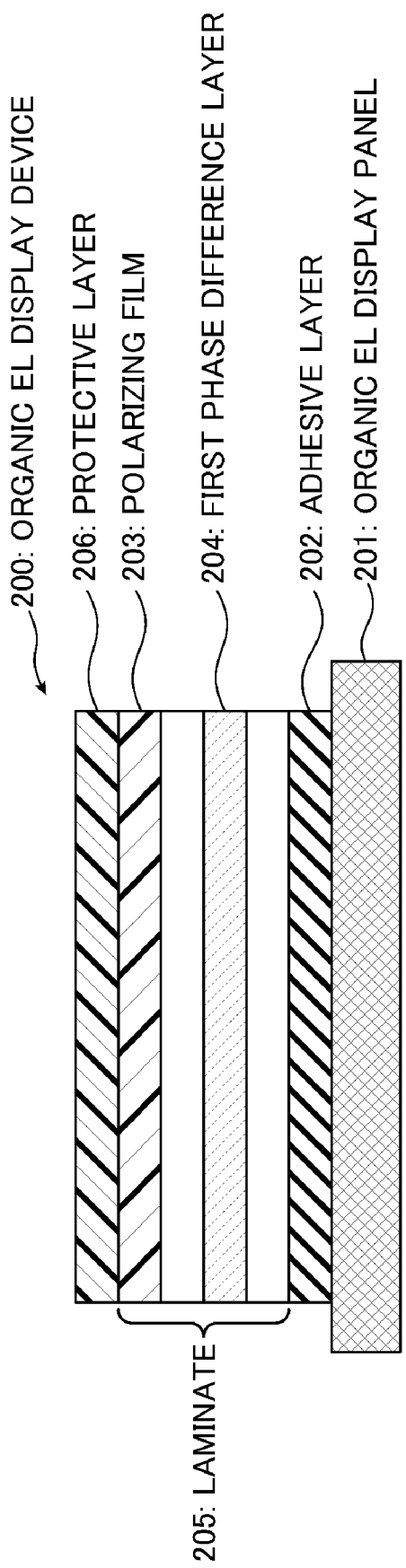
FIG. 10a is a sectional view illustrating an organic EL display device according to a first embodiment of the present invention.

FIG. 10a is a sectional view illustrating an organic EL display device according to a first embodiment of the present invention, wherein the organic EL display device has the most basic structure. This organic EL display device 200 comprises an organic EL display panel 201, and a laminate 205 comprising a polarizing film 203 and a first phase difference layer 204. The laminate 205 is joined to one of opposite surfaces of the organic EL display panel 201 through an optically transparent adhesive layer 202. The polarizing film 203 and the first phase difference layer 204 are adapted to produce circularly-polarized light so as to prevent the occurrence of a situation where light entered from a viewing side of the polarizing film 203 thereinto and internally reflected to be kept from being emitted toward the viewing side. A protective layer 206 made of an optically transparent resin material is bonded to an outer surface of the polarizing film 203.

Figure 10B:
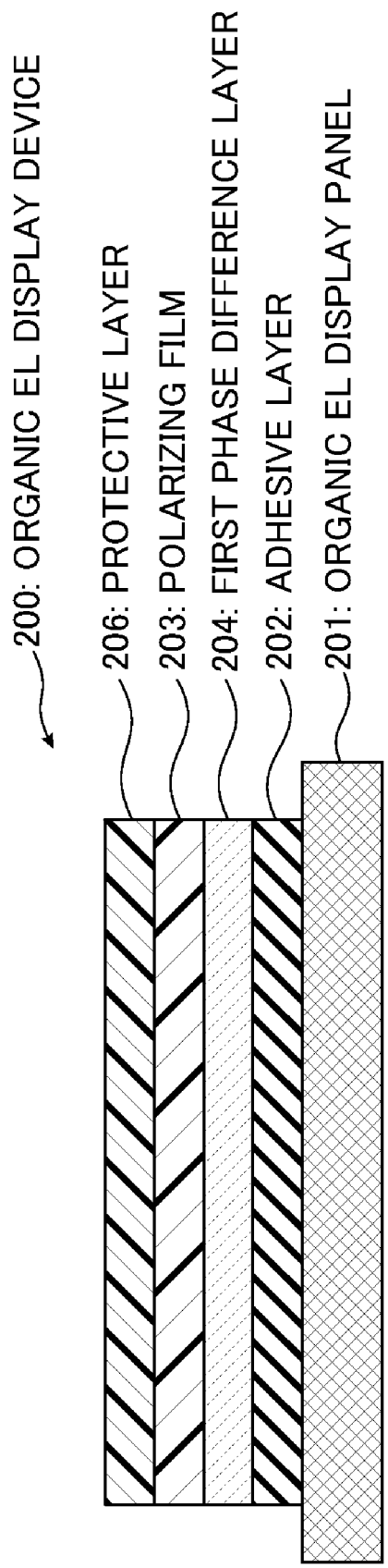
FIG. 10b is a sectional view illustrating an example of modification of the organic EL display device according to the first embodiment.

As illustrated in FIG. 10b, the polarizing film 203 and the first phase difference layer 204 may be selectively joined together, and the first phase difference layer 204 and the adhesive layer 202 may also be selectively joined together. For the sake of simplicity, the following description will be made on an assumption that the laminate 205 consists only of the polarizing film 203 and the first phase difference layer 204, wherein the first phase difference layer 204 and the adhesive layer 202 are joined together.

Figure 10C:
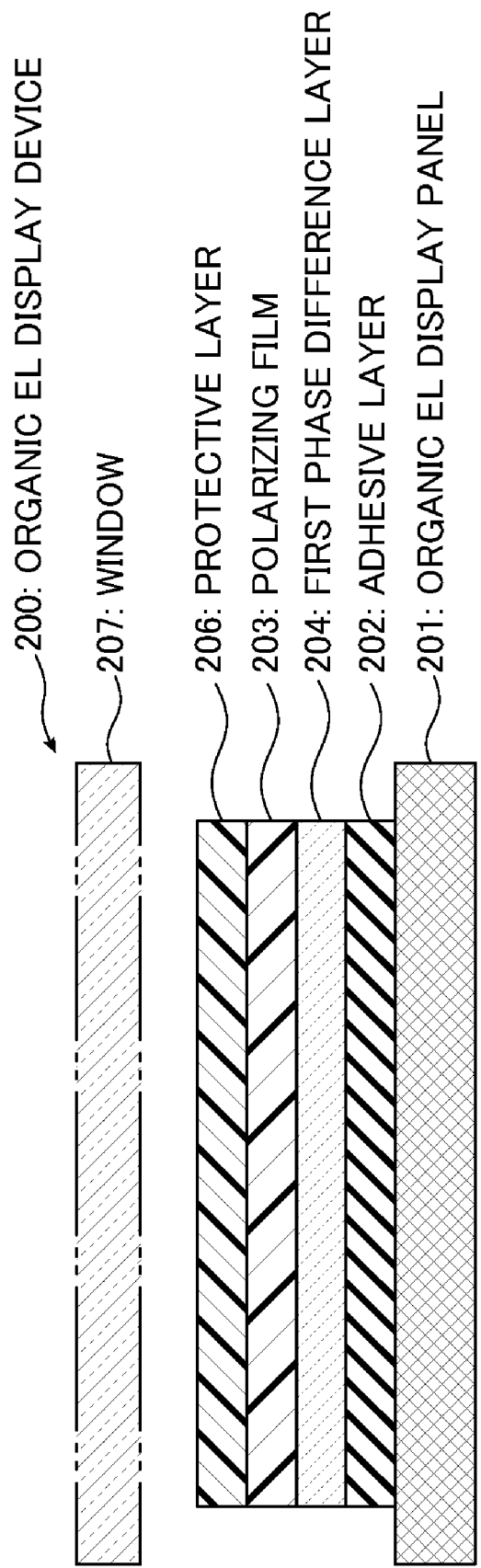
FIG. 10c is a sectional view illustrating another example of modification of the organic EL display device according to the first embodiment.

Optionally, a transparent window 207 as indicated by the dotted line in FIG. 10c may be disposed on an outer side of the protective layer 206, wherein the outer side of the protective layer 206 corresponds to a viewing side of the organic EL display device.

As mentioned above, the polarizing film 203 is formed to have a thickness of 10 µm or less, and satisfy the aforementioned optical characteristics. This polarizing film 203 is extremely thin as compared to polarizing films used in this type of conventional optical display device, so that stress arising from expansion/contraction occurring depending on conditions of temperature or humidity becomes significantly smaller. Thus, it becomes possible to considerably reduce a risk that stress arising from expansion/contraction of the polarizing film causes deformation, such as warp, in the organic EL display panel 201 adjacent thereto, and drastically suppress deterioration in quality of display due to the deformation.

In this structure, as the adhesive layer 202, a material having a diffusing function may be used, or a two-layer structure of an adhesive layer and a diffusion layer may be employed.

Figure 10D:
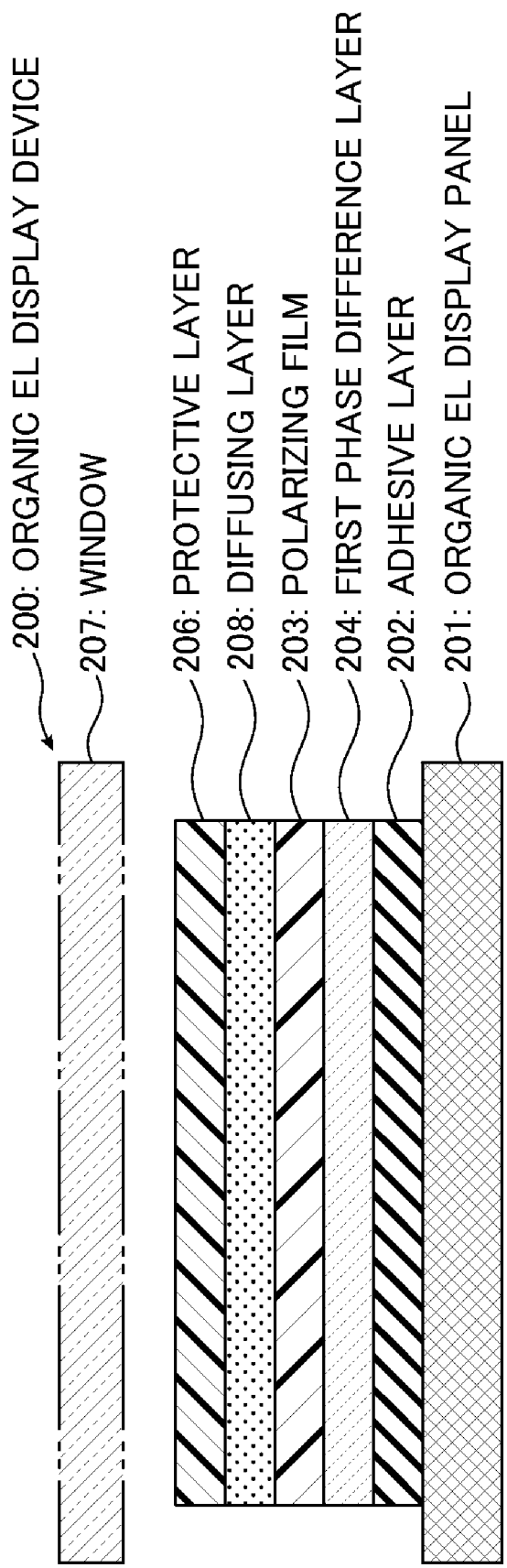
FIG. 10d is a sectional view illustrating yet another example of the modification of the organic EL display device according to the first embodiment.
Figure 10E:
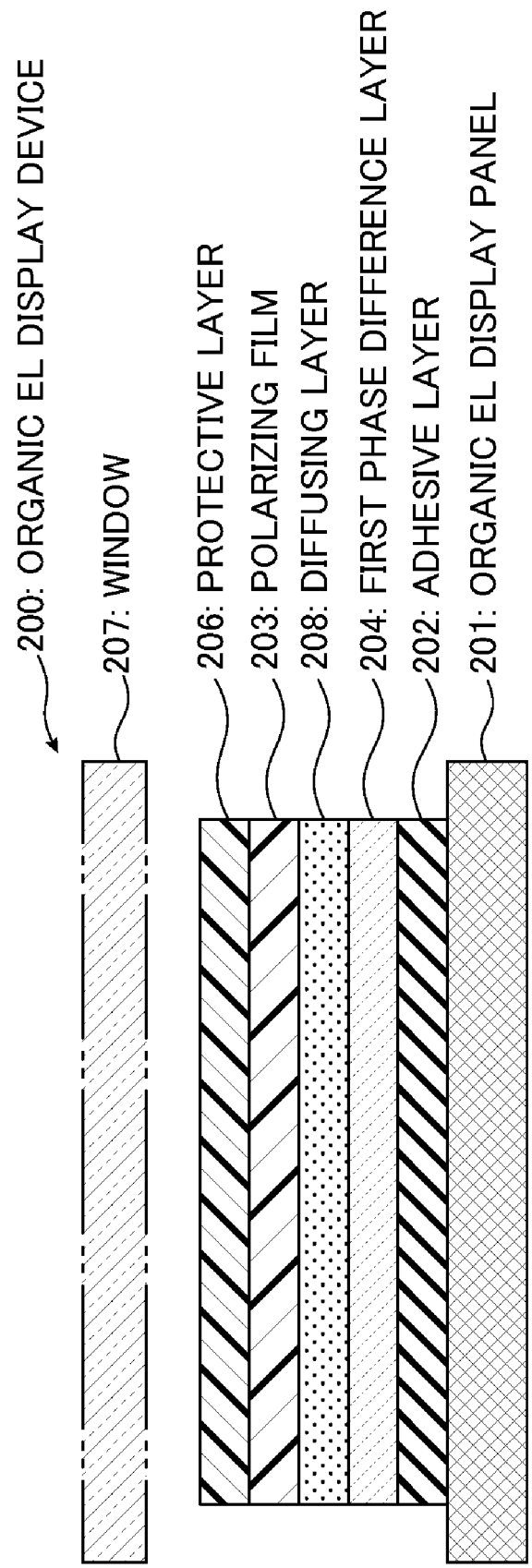
FIG. 10e is a sectional view illustrating still another example of the modification of the organic EL display device according to the first embodiment.

An optical display device illustrated in FIG. 10d has substantially the same structure as those illustrated in FIGS. 10a to 10c, except that a diffusing layer 208 is disposed between the polarizing film 203 and the protective layer 206. In a structure illustrated in FIG. 10e, the diffusing layer 208 is disposed between the polarizing film 203 and the organic EL display panel 201.

Figure 10F:
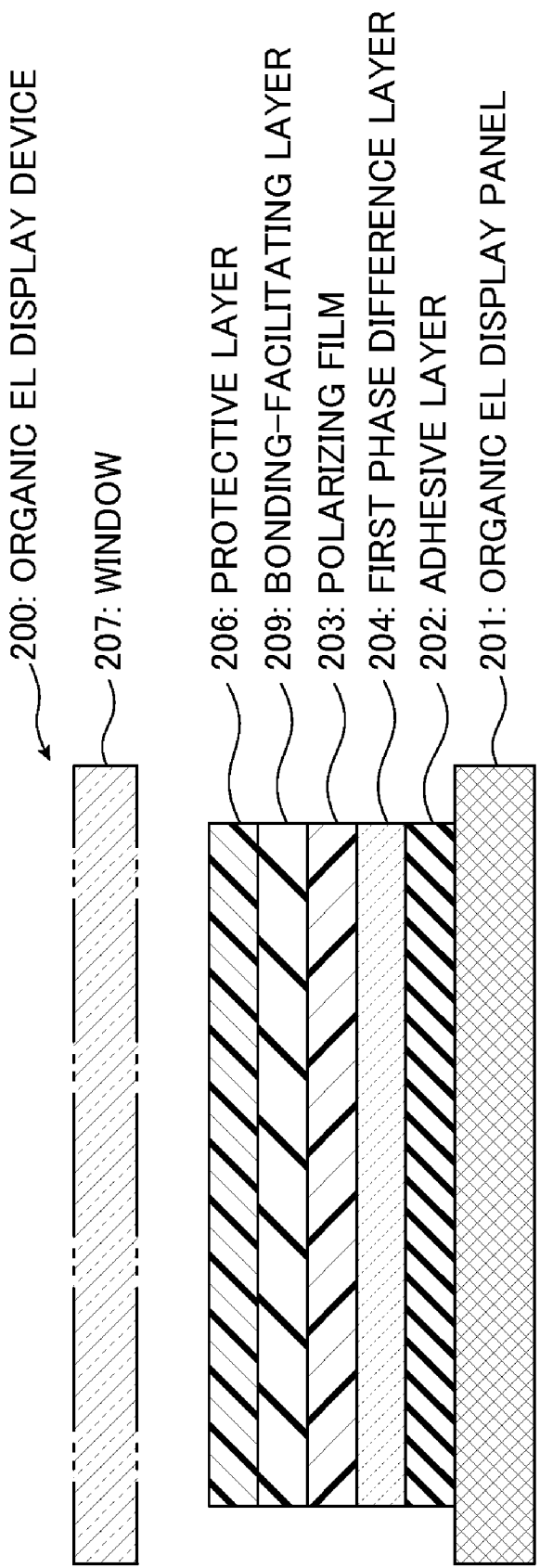
FIG. 10f is a sectional view illustrating yet still another example of the modification of the organic EL display device according to the first embodiment.

An optical display device illustrated in FIG. 10f has fundamentally the same structure as those illustrated in FIGS. 10a to 10c, except that the polarizing film 203 is bonded to the protective layer 206 through a bonding-facilitating layer 209. A material for use as the bonding-facilitating layer is commonly known to those skilled in the art.

An optical display device illustrated in FIG. 10g is different from the optical display device illustrated in FIG. 10f, only in that an antistatic layer 210 is provided on an outer side of the protective layer 206.

In an optical display device 200 illustrated in FIG. 10h, a second phase difference layer 211 for producing circularly-polarized light in cooperation with a polarizing film, such as a ¼ wavelength phase difference layer, is disposed between the protective layer 206 and the antistatic layer 210 in the organic EL display device illustrated in FIG. 10g. In this structure, the phase difference layer 209 for producing circularly-polarized light in cooperation with a polarizing film is disposed on the viewing side with respect to the polarizing film 203, so that light emitted from the organic EL display panel 201 via the polarizing film 203 is converted into circularly-polarized light when it exits from the second phase difference layer 211. The organic EL display device having this structure provides an advantage of being able to eliminate a problem with viewing even when a viewer wears a polarized sunglass.

Figure 11:
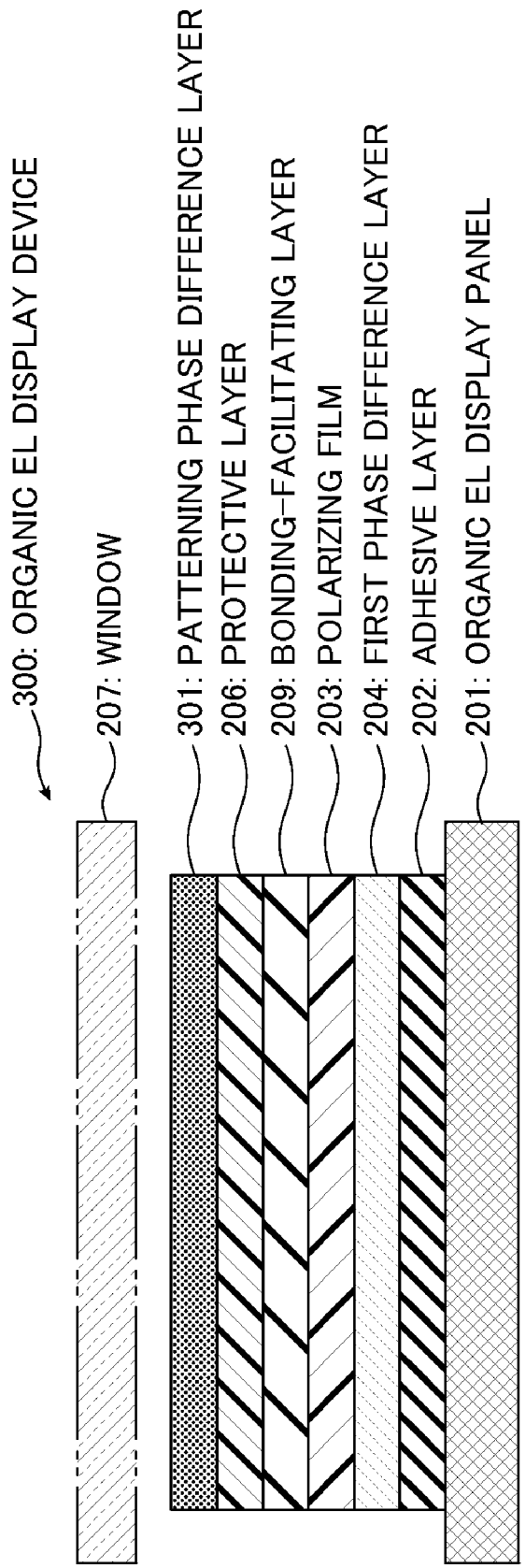
FIG. 11 is a sectional view illustrating an optical display device according to a second embodiment of the present invention.

In an organic EL display device 300 illustrated in FIG. 11, a first phase difference film 204 is joined to a viewing-side surface of an organic EL display panel 201, and a polarizing film 203 is joined to the first phase difference film 204 through a bonding agent. The polarizing film 203 is joined to a protective layer 206 through a bonding-facilitating layer 209, and a patterning phase difference layer 301 is joined to the protective layer 206. The patterning phase difference layer 301 may be formed as a patterning phase difference layer as disclosed in the Non-Patent Document 1. The patterning phase difference layer has a function of allow respective polarization states of an image for right eye and an image for left eye output from the display panel to become different from each other. Optionally, a window 207 may be disposed on an outer side of the patterning phase difference layer 301.

Figure 12A:
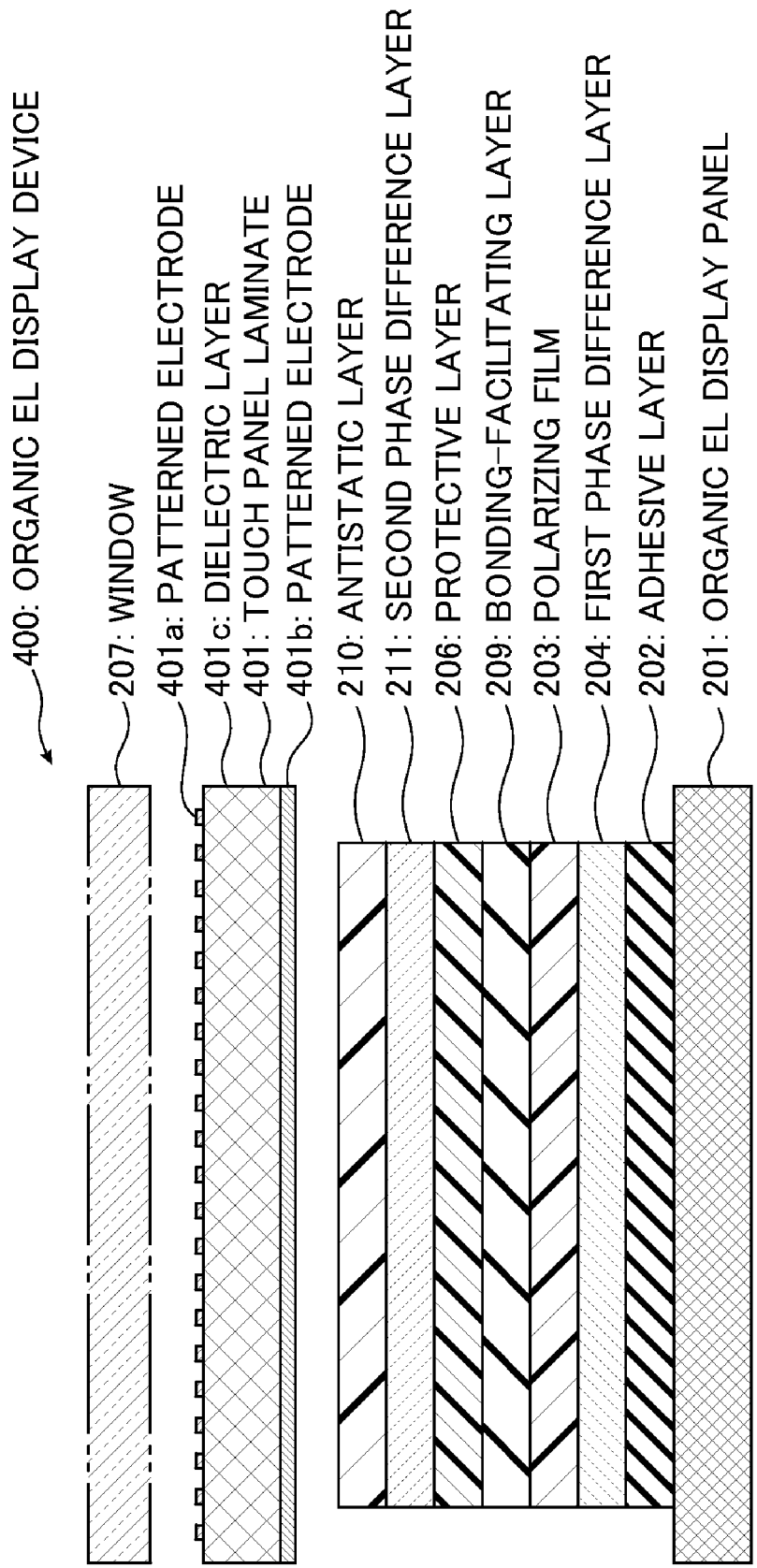
FIG. 12a is a sectional view illustrating an optical display device according to a third embodiment of the present invention.

FIG. 12a illustrates an organic EL display device 400 according to another embodiment of the present invention, wherein the organic EL display device 400 has a touch input sensor function. A structure of a device body of the optical display device 400 is substantially the same as that illustrated in FIG. 10h. Thus, a corresponding element is defined by the same reference numeral or code as that in FIG. 10h, and its description will be omitted. In this embodiment, a touch panel laminate 401 is disposed between an antistatic layer 210 and a window 207. The touch panel laminate 401 may be a capacitive touch panel or may be a resistive touch panel. In the capacitive tough panel, as illustrated in FIG. 12a, an upper patterned electrode 401a and a lower patterned electrode 401b are disposed opposed to each other while interposing a dielectric layer 401c therebetween. As the capacitive touch panel laminate, any conventional structure may be employed as well as the illustrated structure. In cases where the touch panel laminate 401 is formed as a resistive type, a spacer may be disposed between an upper electrode and a lower electrode to define an air gap between the two electrodes. Various configurations of such a touch panel laminate are known, and any one of them may be employed in this embodiment.

FIG. 12b illustrates an organic EL display device 500 according to still another embodiment of the present invention, wherein the organic EL display device 500 has a touch input sensor function. A structure of a device body of the optical display device 500 is substantially the same as that illustrated in FIG. 10h. Thus, a corresponding element is defined by the same reference numeral or code as that in FIG. 10h, and its description will be omitted. In this embodiment, a touch panel laminate 501 is disposed between an organic EL display panel 201 and a first phase difference film 204. As with the embodiment illustrated FIG. 12a, a touch panel laminate 401 in this embodiment may be a capacitive touch panel or may be a resistive touch panel.

Although the present invention has been described in term of specific exemplary embodiments, it is to be understood that various changes and modifications will be apparent to those skilled in the art. Therefore, the present invention is not limited by the description contained herein or by the drawings, but only by the appended claims.

EXPLANATION OF CODES

1: Non-crystallizable PET substrate
2: PVA type resin layer
3: Polarizing film
4: Optically functional film
5: Second optically functional film
7: PVA resin layer-including laminate
8: Stretched laminate
8': Roll of stretched laminate
8": Insolubilized stretched laminate
9: Dyed laminate
9': Cross-linked dyed laminate
10: Optical film laminate
11: Optically functional film laminate
20: Laminate forming apparatus
21: Coating means
22: Drying means
23: Surface modifying unit
30: Preliminary in-air stretching apparatus
31: Stretching means
32: Reel-up unit
33: Oven
40: Dyeing apparatus
41: Dyeing solution
42: Dyeing bath
43: Feeding unit
50: In-boric-acid-solution stretching apparatus
51: Boric acid aqueous solution
52: Boric acid aqueous solution bath
53: Stretching means
60: Insolubilization apparatus
61: Insolubilizing boric acid aqueous solution
70: Cross-linking apparatus
71: Cross-linking boric acid aqueous solution
80: Cleaning apparatus
81: Cleaning solution
90: Drying apparatus
91: Reel-up unit
100: Lamination/transfer apparatus
101: Unrolling/laminating apparatus
102: Reel-up/transfer apparatus
200: Organic EL display device
201: Organic EL display panel
202: Adhesive layer
203: Polarizing film
204: First phase difference layer
205: Laminate
206: Protective layer
207: Window
208: Diffusing layer
209: Bonding-facilitating layer
210: Antistatic layer
211: Second phase difference layer
300: Organic EL display device
301: Patterning phase difference layer
400: Organic EL display device
401: Touch panel laminate
401a: Patterned electrode
401b: Patterned electrode
401c: Dielectric layer
500: Organic EL display device
501: Touch panel laminate
(A): Laminate preparation step
(B): Preliminary in-air stretching step
(C): Dyeing step
(D): In-boric-acid-solution stretching step (E): First insolubilization step
(F): Cross-linking step including second insolubilization
(G): Cleaning step
(H): Drying step
(I): Laminating/transfer process

What is claimed is:

1. A continuous web of a polarizing film for an organic electroluminescent (EL) display device which is made of a polyvinyl alcohol type resin including a molecularly oriented dichroic material therein, and having a thickness of 10 μm or less and exhibit optical characteristics satisfying the following conditions:

$T \geq 43.0$; and $P \geq 99.5$, wherein T is a single layer transmittance, and P is a polarization rate.

2. The polarizing film for an organic EL display device as defined in claim 1, which is prepared by stretching a laminate including the polyvinyl alcohol type resin layer formed on a non-crystallizable thermoplastic resin substrate.

3. The polarizing film for an organic EL display device as defined in claim 2, wherein the stretching is performed through a 2-stage stretching consisting of preliminary in-air stretching and in-boric-acid-solution stretching.

4. The polarizing film for an organic EL display device as defined in claim 2, wherein the non-crystallizable thermoplastic resin substrate is a non-crystallizable ester type thermoplastic resin substrate.

5. The polarizing film for an organic EL display device as defined in claim 1, wherein the dichroic material is iodine or a mixture of iodine and an organic dye.

6. An optically functional film laminate comprising an optically functional film on one of opposite surfaces of the continuous web of the polarizing film for an organic EL display device as defined in claim 1;
an adhesive layer on another of the opposite surfaces; and
a separator releasably laminated through the adhesive layer.

7. An optically functional film laminate comprising a first optically functional film and a second optically functional film, respectively, to one of opposite surfaces and the other surface of the continuous web of the polarizing film for an organic EL display device as defined in claim 1; and
a separator releasably laminated to one of opposite surface of the laminate through an adhesive layer.

8. An optically functional film laminate comprising a protective layer and a phase difference layer, respectively, to one of opposite surfaces and the other surface of the continuous web of the polarizing film for an organic EL display device as defined in claim 1, wherein the phase difference layer is adapted to produce circularly-polarized light in cooperation with the polarizing film for an organic EL display device; and
a separator releasably laminated to one of opposite surface of the laminate through an adhesive layer.

9. An optical film laminate comprising: a continuous web of non-crystallizable thermoplastic resin substrate; and
a polarizing film for an organic electroluminescent (EL) display device which is made of a polyvinyl alcohol type resin including a molecularly oriented dichroic material therein, and formed on the non-crystallizable thermoplastic resin substrate, the polarizing film for an organic EL display device being subjected to a stretching to have a thickness of 10 μm or less and satisfy the following conditions: $T \geq 43.0$; and $P \geq 99.5$, wherein T is a single layer transmittance, and P is a polarization rate.

10. The optical film laminate as defined in claim 9, wherein the polarizing film is produced by stretching a laminate comprising the polyvinyl alcohol type resin layer formed on the non-crystallizable thermoplastic resin substrate.

11. The optical film laminate as defined in claim 10, wherein the stretching is performed through a 2-stage stretching consisting of preliminary in-air stretching and in-boric-acid-solution stretching.

12. The optical film laminate as defined in claim 9, wherein the non-crystallizable thermoplastic resin substrate is a non-crystallizable ester type thermoplastic resin substrate.

13. The optical film laminate as defined in claim 9, wherein the non-crystallizable thermoplastic resin substrate has a thickness which is 6 times or more the thickness of the polyvinyl alcohol type resin layer formed thereon.

14. The optical film laminate as defined in claim 9, wherein the non-crystallizable thermoplastic resin substrate is non-crystallizable polyethylene terephthalate comprising polyethylene terephthalate copolymerized with isophthalic acid, polyethylene terephthalate copolymerized with cyclohexanedimethanol or other copolymerized polyethylene terephthalate.

15. The optical film laminate as defined in claim 9, wherein the non-crystallizable thermoplastic resin substrate is made of a transparent resin.

16. The optical film laminate as defined in claim 9, wherein the dichroic material is iodine or a mixture of iodine and an organic dye.

17. An optical film laminate assembly comprising a separator releasably laminated to a surface of the polarizing film for an organic EL display device included in the optical film laminate as defined in claim 9, on a side opposite to a film-forming surface of the non-crystallizable thermoplastic resin substrate, through an adhesive layer.

18. An optical film laminate assembly comprising an optically functional film laminated to a surface of the polarizing film for an organic EL display device included in the optical film laminate as defined in claim 9, on a side opposite to a film-forming surface of the non-crystallizable thermoplastic resin substrate;
an adhesive layer on the laminated optically functional film; and
a separator releasably laminated to the optically functional film through the adhesive layer.

19. An optical film laminate assembly comprising a phase difference layer laminated to a surface of the polarizing film for an organic EL display device included in the optical film laminate as defined in claim 9, on a side opposite to a film-forming surface of the non-crystallizable thermoplastic resin substrate, wherein the phase difference layer is adapted to produce circularly-polarized light in cooperation with the polarizing film for an organic EL display device;
an adhesive layer on the laminated optically functional film; and
a separator releasably laminated through the adhesive layer.

20. A stretched laminate for producing an optical film laminate comprising: a continuous web of non-crystallizable ester type thermoplastic resin substrate, and
a polarizing film for an organic electroluminescent (EL) display device which is made of a polyvinyl alcohol type resin including a molecularly oriented dichroic material therein, and formed on the non-crystallizable ester type thermoplastic resin substrate, the stretched laminate including a stretched intermediate product consisting of a molecularly oriented polyvinyl alcohol type resin, wherein:

the non-crystallizable ester type thermoplastic resin substrate is made of non-crystallizable polyethylene terephthalate which is set to have an orientation function of 0.10 or less; and the stretched intermediate product is made of a polyvinyl alcohol type resin which is set to have a crystallization degree of 27% to 40% and an orientation function of 0.05 to 0.35, the polarizing film for an organic EL display device is formed on the non-crystallizable ester type thermoplastic resin substrate to have a thickness of 10 μm or less and satisfy the following conditions: T≧43.0; and P≧99.5, where T is a single layer transmittance, and P is a polarization rate.

21. The stretched laminate as defined in claim 20, wherein the non-crystallizable ester type thermoplastic resin substrate has a thickness which is 6 times or more a thickness of the polyvinyl alcohol type resin layer formed thereon.

22. The stretched laminate as defined in claim 20, wherein the non-crystallizable ester type thermoplastic resin substrate is non-crystallizable polyethylene terephthalate including polyethylene terephthalate copolymerized with isophthalic acid, polyethylene terephthalate copolymerized with cyclohexanedimethanol or other copolymerized polyethylene terephthalate, wherein the non-crystallizable polyethylene terephthalate is set to have an orientation function of 0.10 or less.

23. The stretched laminate as defined in claim 20, wherein the non-crystallizable ester type thermoplastic resin substrate is made of a transparent resin.

24. A method of producing an optical film laminate wherein a polarizing film for an organic electroluminescent (EL) display device made of a polyvinyl alcohol type resin including a molecularly oriented dichroic material therein is formed on a continuous web of non-crystallizable thermoplastic resin substrate, the method comprising the steps of:

forming a stretched laminate including a stretched intermediate product consisting of a molecularly oriented polyvinyl alcohol type resin layer by subjecting a laminate comprising the non-crystallizable thermoplastic resin substrate and a polyvinyl alcohol type resin layer formed on the non-crystallizable thermoplastic resin substrate to elevated temperature in-air stretching;

forming a dyed laminate including a dyed intermediate product consisting of a polyvinyl alcohol type resin layer including a molecularly oriented dichroic material therein by subjecting the stretched laminate to dyeing using a dichroic material; and forming an optical film laminate including a polarizing film for an organic EL display device made of a polyvinyl alcohol type resin including a molecularly oriented dichroic material therein by subjecting the dyed laminate to in-boric-acid-solution stretching, wherein optical characteristics of the polarizing film for an organic EL display device represented by a single layer transmittance T and a polarization rate P are in the following ranges: T≧43.0; and P≧99.5, and a thickness of the polarizing film for an organic EL display device is 10 μm or less.

25. The method as defined in claim 24, wherein the non-crystallizable thermoplastic resin substrate is a non-crystallizable ester type thermoplastic resin substrate.

26. The method as defined in claim 24, wherein the non-crystallizable thermoplastic resin substrate has a thickness which is 6 times or more the thickness of the polyvinyl alcohol type resin layer formed thereon.

27. The method as defined in claim 25, wherein the non-crystallizable ester type thermoplastic resin substrate is non-crystallizable polyethylene terephthalate comprising copolymerized with isophthalic acid, polyethylene terephthalate copolymerized with cyclohexanedimethanol or other polyethylene terephthalate.

28. The method as defined in claim 24, wherein the non-crystallizable thermoplastic resin substrate is made of a transparent resin.

29. The method as defined in claim 24, which further comprises a step of applying a polyvinyl alcohol type resin onto the non-crystallizable thermoplastic resin substrate and drying the applied polyvinyl alcohol type resin to form a polyvinyl alcohol type resin layer on the non-crystallizable thermoplastic resin substrate.

30. The method as defined in claim 24, wherein a stretching ratio during the elevated temperature in-air stretching is 3.5 or less.

31. The method as defined in claim 24, wherein a stretching temperature during the elevated temperature in-air stretching is equal to or greater than a glass transition temperature of the polyvinyl alcohol type resin.

32. The method as defined in claim 24, wherein a stretching temperature during the elevated temperature in-air stretching is in a range of 95° C. to 150° C.

33. The method as defined in claim 24, wherein the dyed laminate is formed by immersing the stretched laminate in a dyeing solution containing the dichroic material.

34. The method as defined in claim 24, which further comprises a first insolubilization step of, before immersing the stretched laminate in a dyeing solution containing the dichroic material, subjecting the stretched intermediate product included in the stretched laminate to insolubilization.

35. The method as defined in claim 34, wherein the first insolubilization step comprises immersing the stretched laminate in a boric acid aqueous solution having a temperature less than or equal to 40° C.

36. The method as defined in claim 24, wherein the polarizing film for an organic EL display device is formed by subjecting the dyed laminate in-boric-acid-solution stretching to reduce a thickness of the dyed laminate to 10 μm or less.

37. The method as defined in claim 24, which further comprises a second insolubilization step of, before subjecting the dyed laminate to the in-boric-acid-solution stretching, subjecting the dyed laminate to insolubilization.

38. The method as defined in claim 37, wherein the second insolubilization step comprises immersing the dyed laminate in a boric acid aqueous solution having a temperature less than or equal to 40° C.

39. The method as defined in claim 24, wherein a total stretching ratio for the stretched laminate and the dyed laminate during the elevated temperature in-air stretching and the in-boric-acid-solution stretching is set to 5.0 or more.

40. The method as defined in claim 24, wherein a temperature of a boric acid aqueous solution for the in-boric-acid-solution stretching is 60° C. or more.

41. The method as defined in claim 24, wherein the elevated temperature in-air stretching is performed by end-free uniaxial stretching, and wherein a total stretching ratio for the stretched laminate and the dyed laminate during the elevated temperature in-air stretching and the in-boric-acid-solution stretching is set in a range of 5.0 to 7.5.

42. The method as defined in claim 24, wherein the elevated temperature in-air stretching is performed by end-fixed uniaxial stretching, and wherein a total stretching ratio for the stretched laminate and the dyed laminate during the elevated temperature in-air stretching and the in-boric-acid-solution stretching is set in a range of 5.0 to 8.5.

43. The method as defined in claim 24, which further comprises a step of cleaning the optical film laminate including the polarizing film for an organic EL display device made of the polyvinyl alcohol type resin having a molecularly oriented dichroic material, by an iodide salt-containing aqueous solution having a temperature less than a glass transition temperature of the non-crystallizable thermoplastic resin substrate comprised in the optical film laminate.

44. The method as defined in claim 24, which further comprises a step of drying the optical film laminate at a temperature of 50° C. to 100° C.

45. The method as defined in claim 24, which further comprises a step of laminating a separator film to an outer surface of the organic EL display device-use polarizing film formed on the non-crystallizable thermoplastic resin substrate included in the optical film laminate, through an adhesive layer.

46. The method as defined in claim 24, which further comprises a step of laminating an optically functional film to an outer surface of the polarizing film for an organic EL display device formed on the non-crystallizable thermoplastic resin substrate included in the optical film laminate.

47. The method as defined in claim 46, which further comprises a step of laminating a separator film to an outer surface of the optically functional film through an adhesive.

48. The method as defined in claim 24, which further comprises a step of laminating an optically functional film, to a surface of the polarizing film for an organic EL display device, on a side opposite to a film-forming surface of the non-crystallizable thermoplastic resin substrate included in the optical film laminate, while peeling the non-crystallizable thermoplastic resin substrate from the polarizing film for an organic EL display device, to thereby transfer the polarizing film for an organic EL display device to the optically functional film to form an optically functional film laminate wherein the polarizing film for an organic EL display device is transferred to the optically functional film.

49. The method as defined in claim 48, which further comprises a step of laminating a separator film to an outer surface of the polarizing film for an organic EL display device transferred to the optically functional film, through an adhesive.

50. The method as defined in claim 48, which further comprises a step of laminating a second optically functional film to an outer surface of the polarizing film for an organic EL display device transferred to the optically functional film, and laminating a separator film to the second optically functional film through an adhesive.

51. An organic electroluminescent (EL) display device comprising:
a laminate including a first phase difference layer, and a polarizing film which is made of a polyvinyl alcohol type resin including a molecularly oriented dichroic material therein, and having a thickness of 10 μm or less and optical characteristics satisfying the following conditions: $T \geq 43.0$; and $P \geq 99.5$, wherein T is a single layer transmittance, and P is a polarization rate;
wherein:
a surface of the laminate on the side of the first phase difference layer is joined to one of opposite surfaces of an organic EL display panel through an optically transparent adhesive;
a surface of the polarizing film on the side opposite to the first phase difference layer is joined to a protective layer made of a transparent resin material; and
the laminate is designed to produce circularly-polarized light so as to allow light entered from a viewing side of the polarizing film.

52. The organic EL display device as defined in claim 51, which is produced by stretching a laminate comprising a non-crystallizable thermoplastic resin substrate and the polyvinyl alcohol type resin layer formed on the substrate.

53. The organic EL display device as defined in claim 52, wherein the stretching is performed through a 2-stage stretching consisting of preliminary in-air stretching and in-boric-acid-solution stretching.

54. The organic EL display device as defined in claim 51, wherein the polarizing film and the first phase difference layer are joined together.

55. The organic EL display device as defined in claim 51, wherein a window is disposed on an outer side of the protective layer.

56. The organic EL display device as defined in claim 51, wherein a diffusion layer is disposed at at least one of a position between the protective layer and the polarizing film and a position between the polarizing film and the organic EL display panel.

57. The organic EL display device as defined in claim 51, wherein a bonding-facilitating layer is disposed between the polarizing film and the protective layer to facilitate bonding between the polarizing film and the protective layer.

58. The organic EL display device as defined in claim 51, wherein an antistatic layer is formed on the protective layer.

59. The organic EL display device as defined in claim 51, wherein the protective layer is configured as a second phase difference layer for producing circularly-polarized light in cooperation with the polarizing film.

60. The organic EL display device as defined in claim 51, wherein the polarizing film is formed by subjecting a polyvinyl alcohol type resin layer formed on a substrate made of an ester type thermoplastic resin material to stretching based on the 2-stage stretching together with the thermoplastic resin substrate, and the protective layer made of a transparent resin material is composed of the thermoplastic resin substrate stretched together with the polyvinyl alcohol type resin layer.

61. The organic EL display device as defined in claim 60, wherein the ester type thermoplastic resin material is a non-crystallizable polyethylene terephthalate (PET).

62. The organic EL display device as defined in claim 51, wherein the transparent resin material for the protective layer comprises a cellulosic material or an acrylic resin material.

63. The organic EL display device as defined in claim 51, wherein the protective layer includes a patterning phase difference layer.

64. The organic EL display device as defined in claim 51, wherein a touch panel laminate having a touch sensing function is disposed on a viewing side with respect to the organic EL display panel.

65. The organic EL display device as defined in claim 64, wherein the touch panel laminate is a capacitive touch panel configured such that a plurality of patterned pairs of transparent electrodes are disposed while interposing a dielectric layer therebetween.

66. The organic EL display device as defined in claim 65, wherein the touch panel laminate is disposed between the polarizing film and a viewing-side outermost member of the organic EL display device.

67. The organic EL display device as defined in claim 65, wherein the touch panel laminate is disposed between the polarizing film and the organic EL display panel.

68. The organic EL display device as defined in claim 64, wherein the touch panel laminate is a resistive touch panel configured such that a transparent electrode is disposed opposed to a counter electrode through an air gap, the touch panel laminate being disposed between the polarizing film and the display panel, or between the polarizing film and a viewing-side outermost member.

* * * * *